(12) United States Patent
Archibald

(10) Patent No.: US 12,225,688 B2
(45) Date of Patent: Feb. 11, 2025

(54) COOLANT DISTRIBUTION UNIT AND CONTROL METHODS

(71) Applicant: Hoffman Enclosures Inc., Anoka, MN (US)

(72) Inventor: Matthew R. Archibald, Derry, NH (US)

(73) Assignee: Hoffman Enclosures Inc., Anoka, MN (US)

( * ) Notice: Subject to any disclaimer, the term of this patent is extended or adjusted under 35 U.S.C. 154(b) by 330 days.

(21) Appl. No.: 17/984,064

(22) Filed: Nov. 9, 2022

(65) Prior Publication Data
US 2023/0147728 A1    May 11, 2023

Related U.S. Application Data

(60) Provisional application No. 63/277,509, filed on Nov. 9, 2021.

(51) Int. Cl.
| | |
|---|---|
| *H05K 7/20* | (2006.01) |
| *G05D 23/19* | (2006.01) |
| *H05K 7/14* | (2006.01) |
| *G06F 1/20* | (2006.01) |

(52) U.S. Cl.
CPC ..... *H05K 7/20272* (2013.01); *G05D 23/1917* (2013.01); *G05D 23/1931* (2013.01); *H05K 7/1488* (2013.01); *H05K 7/20263* (2013.01); *H05K 7/20281* (2013.01); *H05K 7/20645* (2013.01); *H05K 7/20781* (2013.01); *H05K 7/2079* (2013.01); *G06F 1/206* (2013.01); *Y02D 10/00* (2018.01)

(58) Field of Classification Search
CPC .................. H05K 7/1488; H05K 7/20781
USPC ...................................... 361/679.53
See application file for complete search history.

(56) References Cited

U.S. PATENT DOCUMENTS

| | | | |
|---|---|---|---|
| 3,755,716 | A | 8/1973 | Yoshii et al. |
| 4,480,880 | A | 11/1984 | Cather |
| 5,424,911 | A | 6/1995 | Joyner et al. |
| 5,584,396 | A | 12/1996 | Schmitt |
| 7,277,273 | B2 | 10/2007 | Smith et al. |
| 9,060,441 | B2 | 6/2015 | Jiang et al. |
| 9,518,758 | B2 | 12/2016 | Lee et al. |

(Continued)

FOREIGN PATENT DOCUMENTS

| | | |
|---|---|---|
| WO | 2021/055779 A1 | 3/2021 |
| WO | 2021/226890 A1 | 11/2021 |
| WO | 2022/020757 A1 | 1/2022 |

*Primary Examiner* — Zhengfu J Feng
(74) *Attorney, Agent, or Firm* — Quarles & Brady LLP

(57) ABSTRACT

Embodiments of the invention provide a system and method for housing electrical components of a high-density liquid cooling unit to liquid cool electrical components. The system includes a first electrical cabinet housing at least one electrical switch and a controller. The first electrical cabinet is swingable outward to open, and the first electrical cabinet opens while the high density liquid cooling system continues to operate to liquid cool electrical components. The system includes a second electrical cabinet housing a first motor drive and a second motor drive. The second electrical cabinet is accessible when the first electrical cabinet swings outward. One of the first motor drive and the second motor drive are replaceable while the high density liquid cooling unit continues to operate.

20 Claims, 50 Drawing Sheets

(56) References Cited

U.S. PATENT DOCUMENTS

| | | |
|---|---|---|
| 9,529,171 B2 | 12/2016 | Knudsen et al. |
| 9,655,271 B2 | 5/2017 | Tio et al. |
| 9,778,707 B1 | 10/2017 | San Clemente |
| 10,054,751 B2 | 8/2018 | Knudsen et al. |
| 10,218,158 B1* | 2/2019 | Wiant .................... H02B 1/306 |
| 10,512,327 B2 | 12/2019 | Pappas et al. |
| 10,595,433 B2 | 3/2020 | Chen et al. |
| 11,269,302 B2 | 3/2022 | Miranda et al. |
| 2007/0091550 A1* | 4/2007 | Smith .................. H05K 7/1488 |
| | | 361/679.02 |
| 2009/0201640 A1* | 8/2009 | Bard .................. H05K 7/20745 |
| | | 361/696 |
| 2014/0043760 A1* | 2/2014 | Eckberg ............. H05K 7/20818 |
| | | 29/890.03 |
| 2014/0133099 A1* | 5/2014 | Campbell .......... H05K 7/20818 |
| | | 361/698 |
| 2017/0347483 A1 | 11/2017 | Sevakivi et al. |
| 2022/0200249 A1 | 6/2022 | Duppre et al. |

\* cited by examiner

FIG. 38A — 3800a

| FAULT MESSAGE | TRIGGER CONDITION | RESET CONDITION | DELAY | ACTION |
|---|---|---|---|---|
| MAX OPERATING TEMPERATURE EXCEEDED | SECONDARY OUTLET TEMPERATURE EXCEEDS USER-SET MAXIMUM TEMPERATURE | FAULT ACKNOWLEDGED AND TEMPERATURE BELOW USER-SET MAXIMUM TEMPERATURE | NONE | STOP ALL PUMPS |
| SYSTEM PRESSURE BELOW SET LIMIT | SYSTEM PRESSURE BELOW USER-SET LIMIT | SYSTEM PRESSURE IS ABOVE USER-SET LIMIT | 5 SECONDS | START REFILLING PROCESS AND SHUT OFF PUMPS AFTER 5 SECONDS |
| DIFFERENTIAL PRESSURE AT PUMP 2 IS TOO HIGH | DIFFERENTIAL PRESSURE AT PUMP 2 IS ABOVE LIMIT | PRESSURE BELOW LIMIT OR SENSOR DEFECT | USER-SET DELAY | SHUTDOWN TIMER STARTS FOR PUMP 2 |

FIG. 38B — 3800b

| FAULT MESSAGE | TRIGGER CONDITION | RESET CONDITION | DELAY |
|---|---|---|---|
| LEAKAGE DETECTION CONTAMINATED | tt-SIM MODULE REPORTS A CONTAMINATION | NO CONTAMINATION REPORTED, FLAT-PROBES CLEANED | NONE |
| DEFECTIVE AMBIENT TEMPERATURE SENSOR | UNPLAUSIBLE AMBIENT TEMPERATURE VALUE, WIRE BREAK OR VALUE OVERFLOW | PLAUSIBLE VALUE FOR AMBIENT TEMPERATURE | 2 SECONDS |

COOLANT DISTRIBUTION UNIT AND CONTROL METHODS

CROSS REFERENCE TO RELATED APPLICATIONS

This application claims priority to U.S. Provisional Patent Application No. 63/277,509 filed Nov. 9, 2021, the entirety of which is incorporated by reference.

BACKGROUND

Several trends in the electronics industry have combined to increase the importance of thermal management, including heat removal for electronic components. In particular, the need for faster and more densely packed circuits has had a direct impact on the importance of thermal management. For example, power dissipation and heat production increase as device operating frequencies increase. Also, increased operating frequencies may be possible at lower device junction temperatures. Further, as more and more components are packed onto a single chip or module, heat flux increases, resulting in the need to remove more power from a given size chip or module. These trends have combined to create applications and environments where it is no longer desirable to remove heat solely by traditional air cooling methods. Such air cooling techniques are inherently limited in their ability to extract heat from electronic components with moderate to high power density.

Modern computing workloads, data generation, and data consumption have increased demand for computing capacity. To address these needs, data centers house electrical computing systems which can include hardware for networking, computing, and storage for example, and can host workloads and store data. In operation, these electrical components generate considerable heat, which can degrade the performance of computing systems and lead to overheating. To address the inefficiencies caused by overheating, cooling systems are provided for data centers to transfer heat away from electrical components, increasing the lifetime and productivity of the electrical system. In some cases, cooling systems for data centers can include multiple coolant circuits, wherein heat from a circuit proximate the electrical components is rejected to another coolant circuit.

Liquid to liquid coolant distribution units (CDUs) have been developed for cooling electronic components in a data center. In-row CDUs can be placed within a row of cabinets housing electrical components (e.g., servers) and can distribute coolant to those electrical components. CDUs typically include a liquid to liquid heat exchanger, which allows heat transfer from coolant in a secondary loop to a primary loop. The primary loop includes a chilled coolant from a data center facility that flows into a primary inlet, through the heat exchanger, and out through a primary outlet. The secondary loop includes a secondary coolant that includes heat from the electrical components. The coolant in the secondary loop flows into the CDU at a secondary inlet, flows through the heat exchanger, rejecting heat to the primary loop, and flows out of the CDU through a primary outlet to cool the electrical components.

SUMMARY

Embodiments of the invention provide a system and method for housing electrical components of a high-density liquid cooling unit to liquid cool electrical components. The system includes a first electrical cabinet housing at least one electrical switch and a controller. The first electrical cabinet is swingable outward to open, and the first electrical cabinet opens while the high density liquid cooling system continues to operate to liquid cool electrical components. The system includes a second electrical cabinet housing a first motor drive and a second motor drive. The second electrical cabinet is accessible when the first electrical cabinet swings outward. One of the first motor drive and the second motor drive are replaceable while the high density liquid cooling unit continues to operate.

BRIEF DESCRIPTION OF FIGURES

Various figures are presented in line with the text below to provide context for general and specific discussion of CDUs and components thereof. In addition, the numbered figures described below illustrate CDUs and related subsystems according to different embodiments of the invention.

FIGS. 38A and 38B are tables showing example errors that can be generated for a CDU.

DETAILED DESCRIPTION

Figure 1:
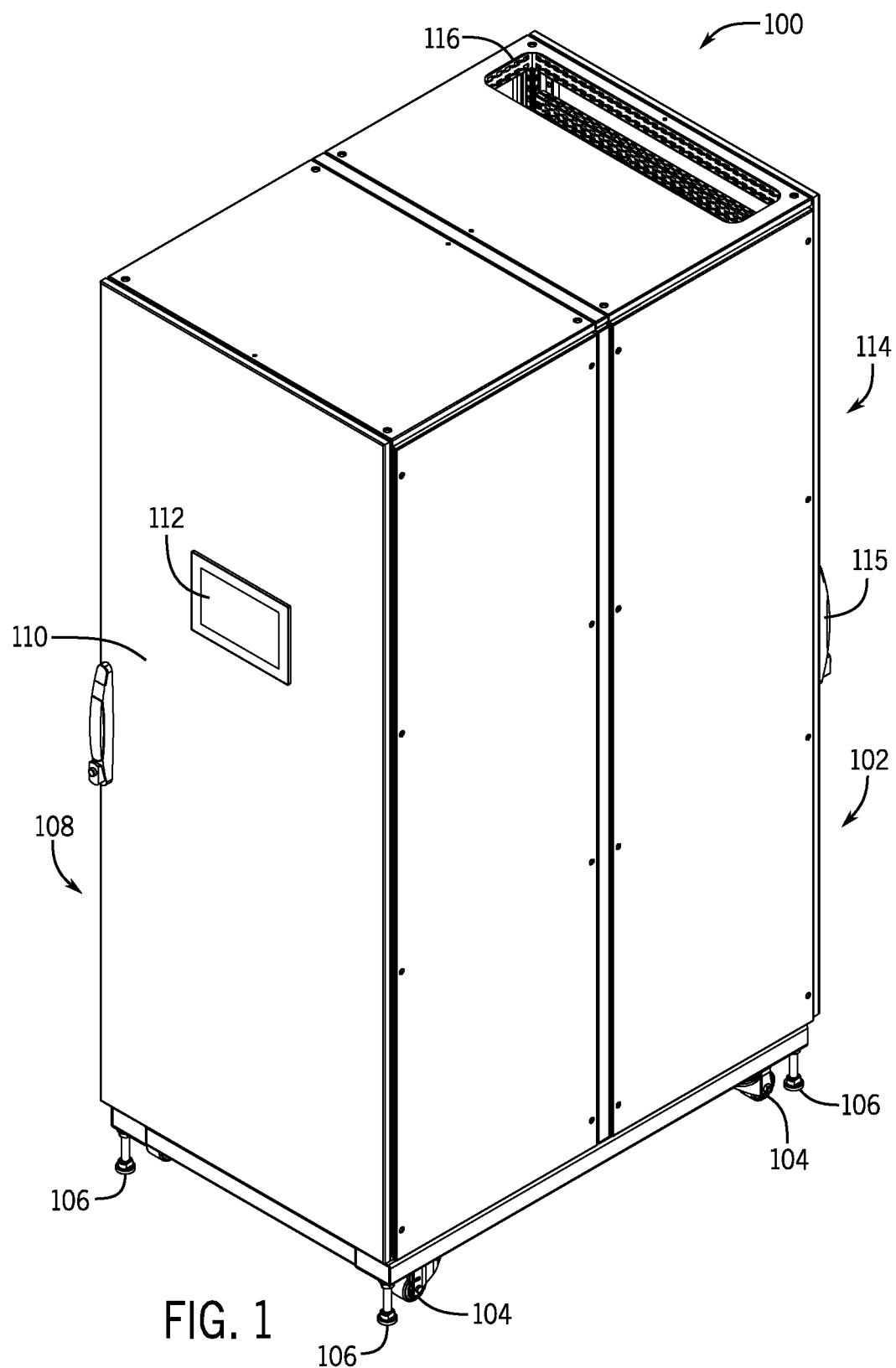
FIG. 1 is front, right isometric view of a coolant distribution unit (CDU) according to an embodiment of the invention.
Figure 2:
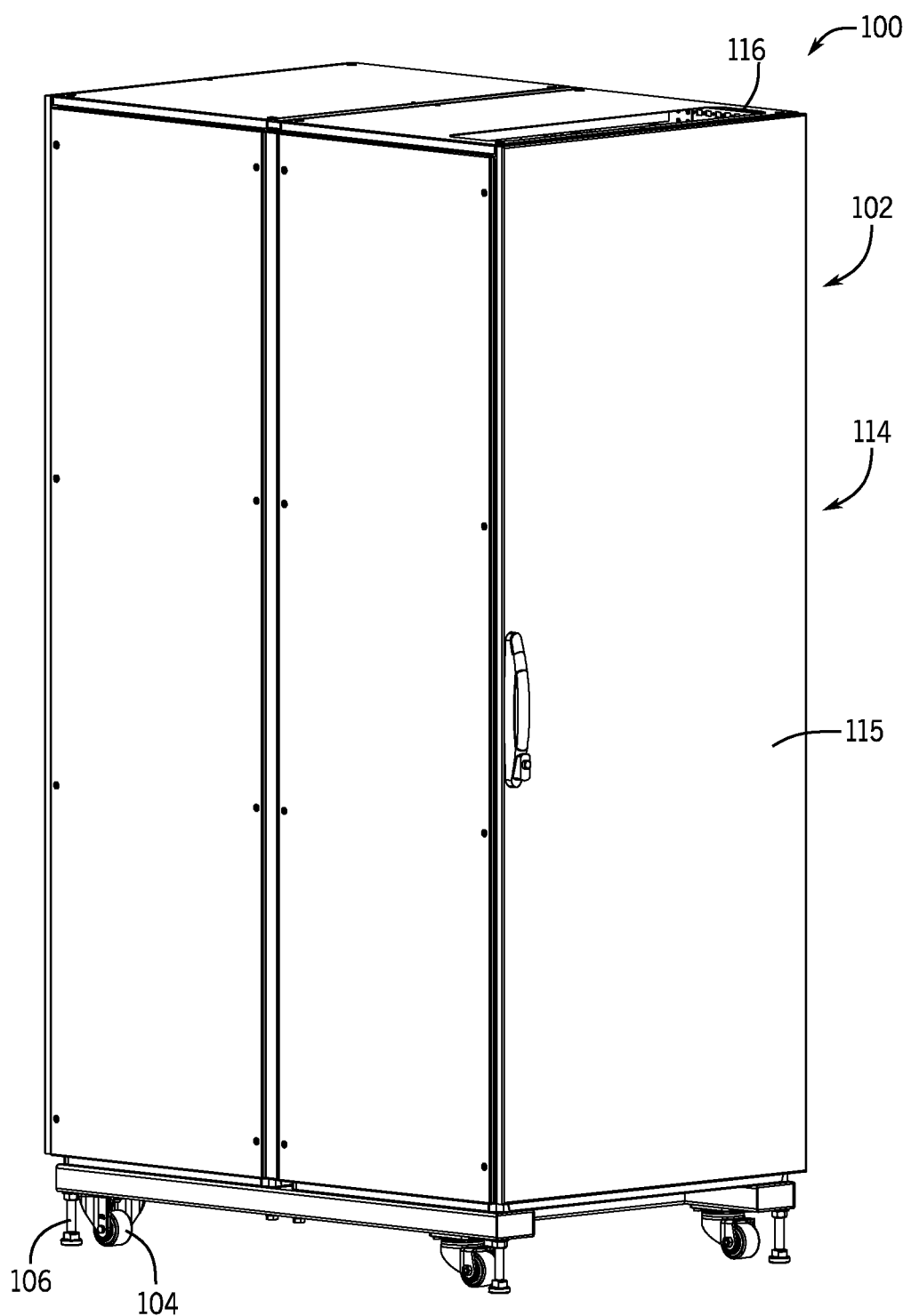
FIG. 2 is a rear, right isometric view of the CDU of FIG. 1.
Figure 3:
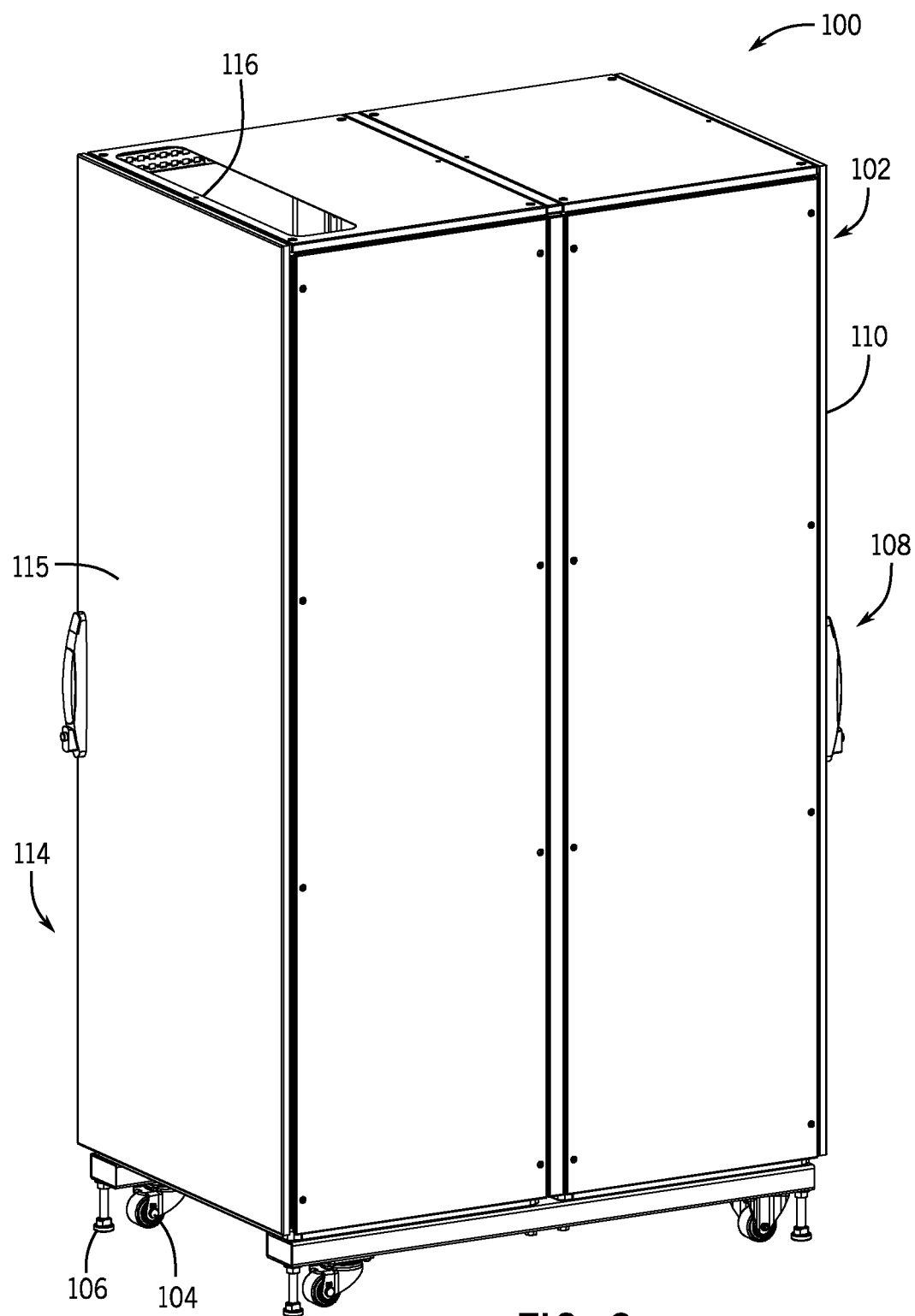
FIG. 3 is a rear, left isometric view of the CDU of FIG. 1.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

Also as used herein, unless otherwise limited or defined, "or" indicates a non-exclusive list of components or operations that can be present in any variety of combinations, rather than an exclusive list of components that can be present only as alternatives to each other. For example, a list of "A, B, or C" indicates options of: A; B; C; A and B; A and C; B and C; and A, B, and C. Correspondingly, the term "or" as used herein is intended to indicate exclusive alternatives only when preceded by terms of exclusivity, such as "either," "one of," "only one of," or "exactly one of." For example, a list of "one of A, B, or C" indicates options of: A, but not B and C; B, but not A and C; and C, but not A and B. A list preceded by "one or more" (and variations thereon) and including "or" to separate listed elements indicates options of one or more of any or all of the listed elements. For example, the phrases "one or more of A, B, or C" and "at least one of A, B, or C" indicate options of: one or more A; one or more B; one or more C; one or more A and one or more B; one or more B and one or more C; one or more A and one or more C; and one or more of A, one or more of B, and one or more of C. Similarly, a list preceded by "a plurality of" (and variations thereon) and including "or" to separate listed elements indicates options of multiple instances of any or all of the listed elements. For example, the phrases "a plurality of A, B, or C" and "two or more of A, B, or C" indicate options of: A and B; B and C; A and C; and A, B, and C.

Also as used herein, unless otherwise limited or defined, the terms "about" and "approximately" refer to a range of values ±5% of the numeric value that the term precedes. As a default the terms "about" and "approximately" are inclusive to the endpoints of the relevant range, but disclosure of ranges exclusive to the endpoints is also intended.

Also as used herein, unless otherwise limited or defined, "integral" and derivatives thereof (e.g., "integrally")

describe elements that are manufacture as a single piece without fasteners, adhesive, or the like to secure separate components together. For example, an element stamped as a single-piece component from a single piece of sheet metal, without rivets, screws, or adhesive to hold separately formed pieces together is an integral (and integrally formed) element. In contrast, an element formed from multiple pieces that are separately formed initially then later connected together, is not an integral (or integrally formed) element.

Also as used herein, unless otherwise defined or limited, the term "lateral" refers to a direction that does not extend in parallel with a reference direction. A feature that extends in a lateral direction relative to a reference direction thus extends in a direction, at least a component of which is not parallel to the reference direction. In some cases, a lateral direction can be a radial or other perpendicular direction relative to a reference direction.

Also as used herein, unless otherwise defined or limited, the term "identical" indicates components or features that are manufactured to the same specifications (e.g., as may specify materials, nominal dimensions, permitted tolerances, etc.), using the same manufacturing techniques. For example, multiple parts stamped from the same material, to the same tolerances, using the same mold may be considered to be identical, even though the precise dimensions of each of the parts may vary from the others.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

Disclosed herein are embodiments of a coolant distribution unit (CDU) and related components and sub-systems that can provide improved performance and footprint-scaled capacity for cooling of electronic systems (e.g., servers arranged on adjacent server racks). Some embodiments include methods of operation for a CDU or sub-systems thereof, including to address loss of flow, to compensate for a need for maintenance for certain components, to allow maintenance (e.g., replacement) of certain components during active runtime, etc.

Figure 15:
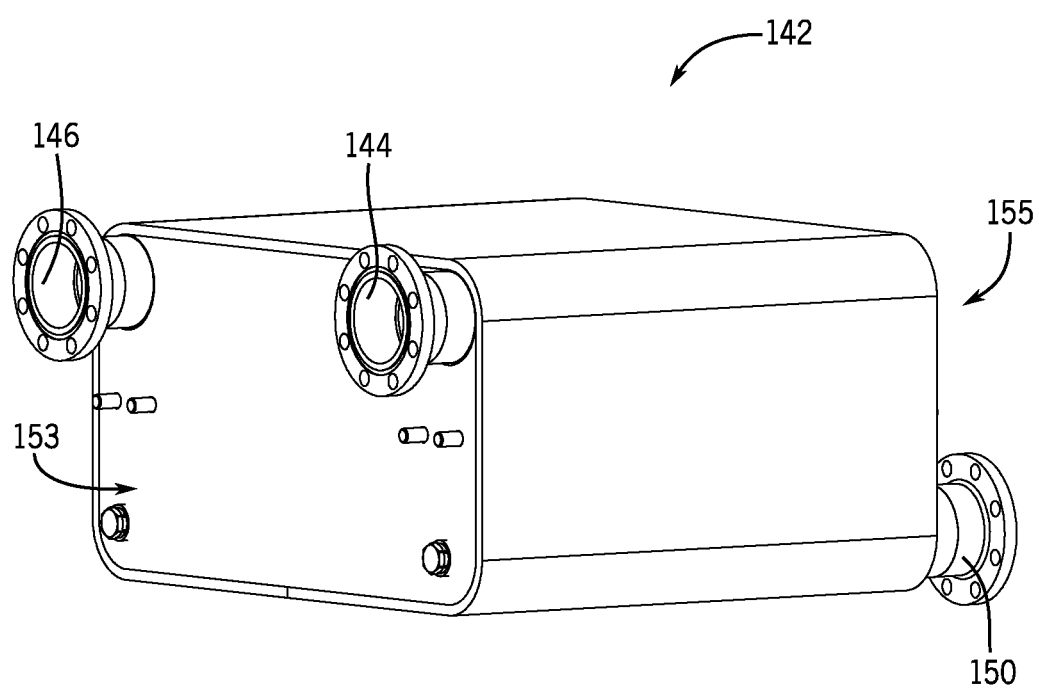
FIG. 15 is an isometric view of a heat exchanger of the CDU of FIG. 13.
Figure 31:
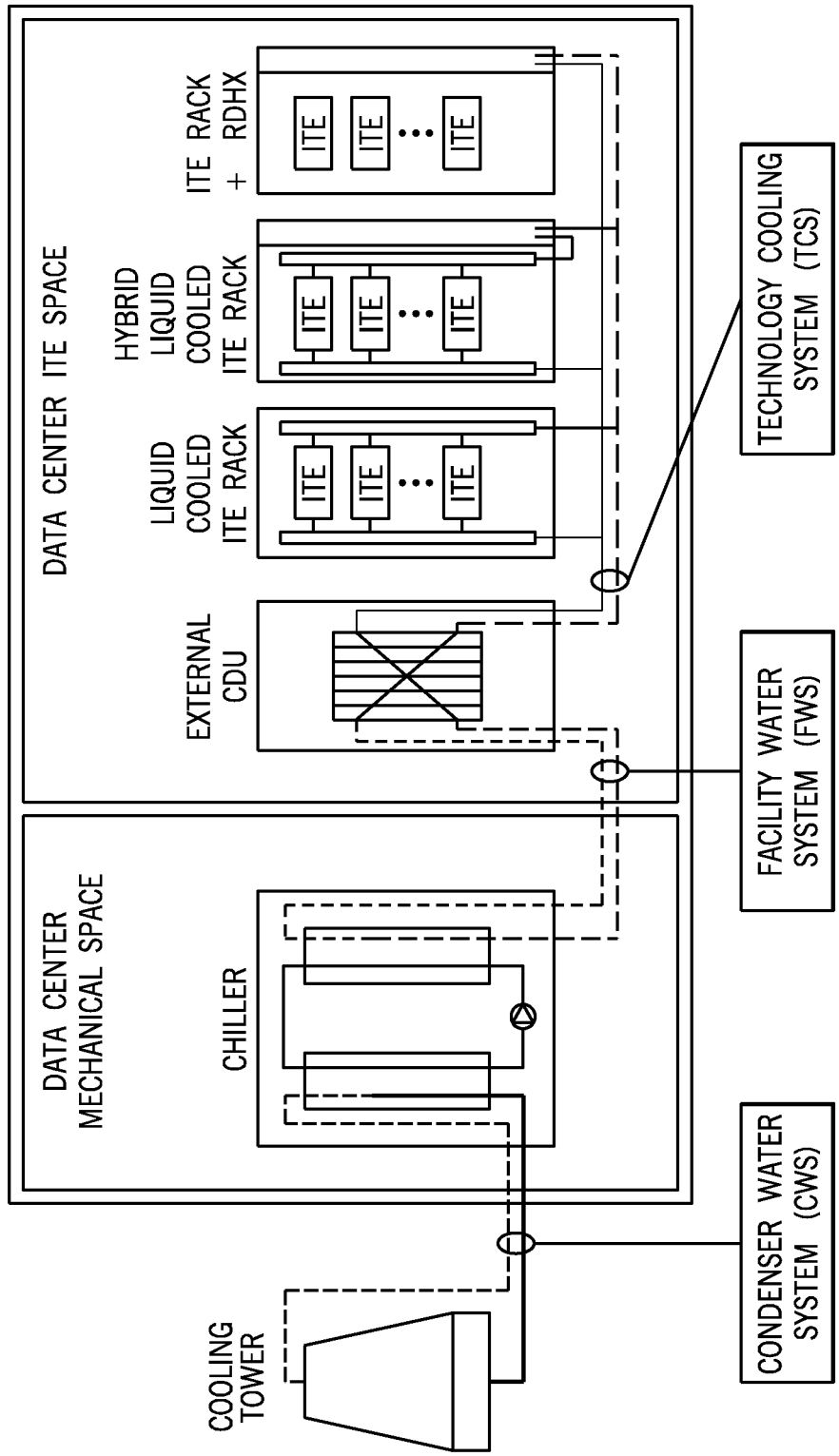
FIG. 31 is a schematic illustration of a CDU deployed in a data center according to an embodiment of the invention.

According to some embodiments of the invention, as illustrated in FIG. 31, cooling systems for cooling electronic components within a data center can circulate coolant through a primary coolant circuit (e.g., a facility water system) supplied with coolant from the facility, and through a secondary coolant circuit (e.g., a technology cooling system) for cooling electrical components within the data center. During circulation, heat is transferred from the electrical components (e.g., peripheral equipment such as computer servers and downstream IT loads) to the coolant in the secondary circuit, and the coolant in the secondary circuit is, in turn, cooled by rejecting heat to the coolant of the primary circuit. A CDU can be provided within the data center and can include a liquid to liquid heat exchanger (e.g., as shown in FIG. 15) for rejecting heat from the coolant in the secondary circuit to the coolant in the primary circuit. As illustrated, chilled coolant of the primary circuit can enter the CDU and can flow through a heat exchanger of the CDU. The coolant of the primary circuit can exit the CDU at a higher temperature than it entered, and can return to the facility to be chilled before re-entering the CDU. Similarly, heated coolant of the secondary circuit returning to the CDU from the electrical components can flow into the CDU, and can be cooled as it passes through the heat exchanger, so that the coolant returning to the electrical components is at least partially cooled relative to the coolant of the secondary circuit entering the CDU. The coolant within one or both of the primary and secondary loops can be water, or a propylene glycol, or a combination of water and an anti-corrosion agent. In some case, cooling circuits (e.g. loops) of a CDU are tertiary circuits, or greater, however, in this disclosure, only a primary and secondary coolant circuit will be discussed. In some embodiments, a pressure drop across the primary coolant loop of the CDU can be up to 1.3 bar. In some embodiments, a system volume of the primary coolant loop can be up to 50 liters. In some embodiments, the primary coolant loop can have a minimum rated flow rate of 1135 liters per minute or less. In some embodiments, a system volume of the secondary coolant loop can be up to 100 liters. In some embodiments, the secondary coolant loop can have a minimum rated flow rate of 850 liters per minute or less Due at least in part to the number of electronic components in a data center, it can be advantageous to arrange components modularly within the data center, and to provide standardization around the size and placement of components in the data center. In some cases, electrical components within the data center can be housed in cabinets (which can also be referred to as racks), each cabinet having a similar or identical footprint. Cabinets within a data center can be sized to fit within standard dimensions, and can have a width of 800 millimeters ("mm"), a depth of 1200 mm, and a height of 2200 mm. Cabinets fitting within standard dimensions can be installed (e.g., "rolled in") to a space within a row of cabinets in the data center, the space being sized to receive a cabinet having a standard size, and including hookups for connections into the rack (e.g., power, network connections, cooling lines, etc.).

It can further be advantageous to position a CDU within a row of cabinets, proximate to the electrical components to be cooled, as can reduce a pressure required to pump coolant through a secondary loop of a coolant system, and thereby reduce power consumption of the CDU. Thus, as shown at least in FIGS. 1-6, a CDU 100 for cooling electrical components within a data center can be housed within a rack 102 having a standard rack footprint. The CDU 100 can therefore be rolled in to a space within a row of cabinets to provide cooling capacity for cabinets within the row. As shown, the rack 102 housing the CDU 100 can occupy a standard rack footprint, and in one embodiment of the invention can have a width of 800 mm, a depth of 1200 mm, and a height of 2200 mm. In other embodiments, a CDU can be housed within a rack having different dimensions, as may be required in certain locations or data centers having differently sized space for cabinets. The rack 102 can include casters 104 which can allow the rack to be easily moved within the data center. Legs 106 can extend from the bottom of the rack, and can engage a floor structure when the rack 102 is in position within a row, to prevent further movement of the rack 102. Further, the rack 102 can include panels for enclosing the CDU 100. The rack 102 can have an outer coating (e.g., a painting or anodization) to protect against corrosion. In some embodiments, the CDU 100 including the rack 102 can have a total operating mass of less than 1300 kg.

Figure 4:
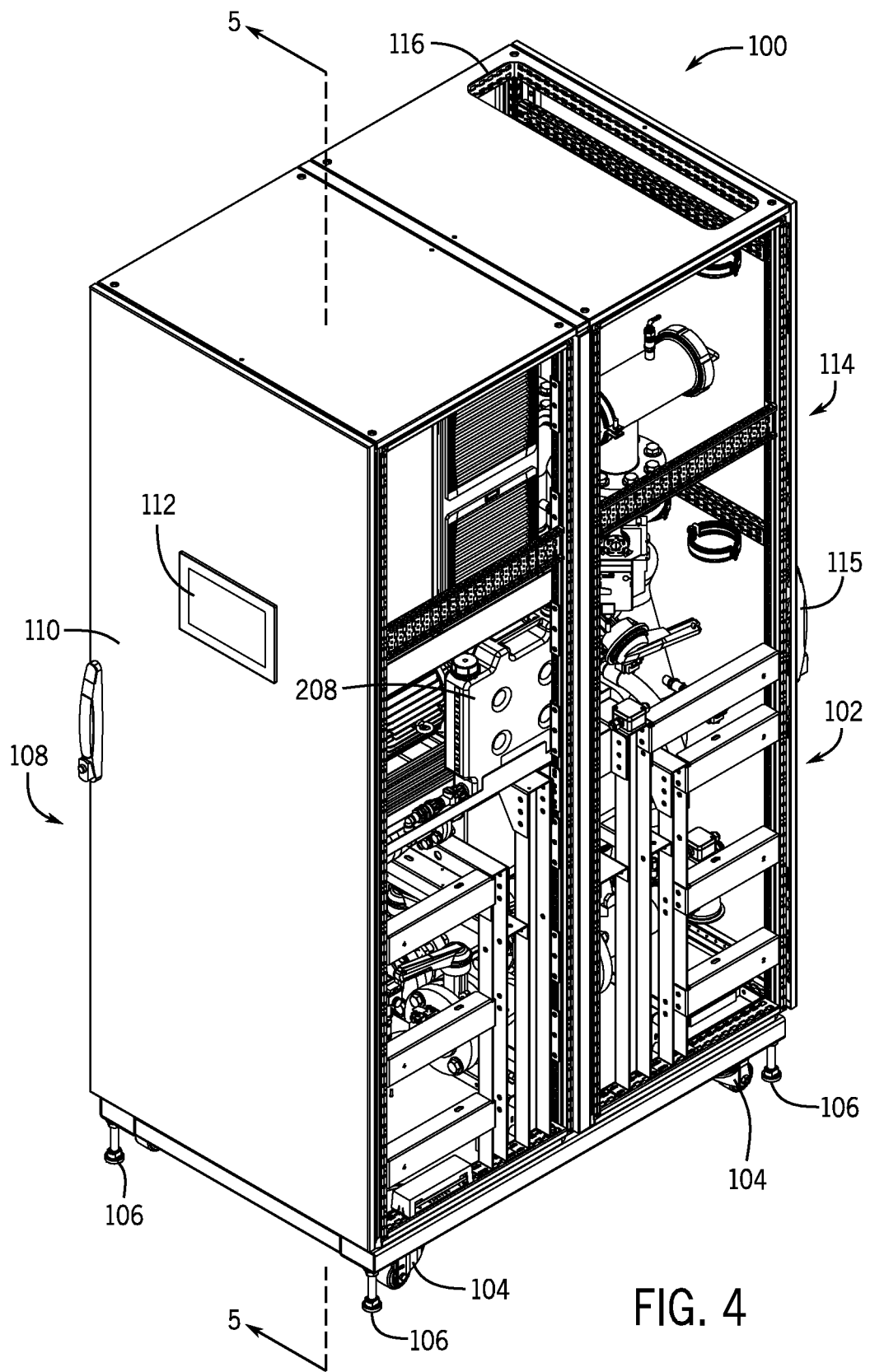
FIG. 4 is a front, right isometric view of the CDU of FIG. 1 with side panels removed.
Figure 5:
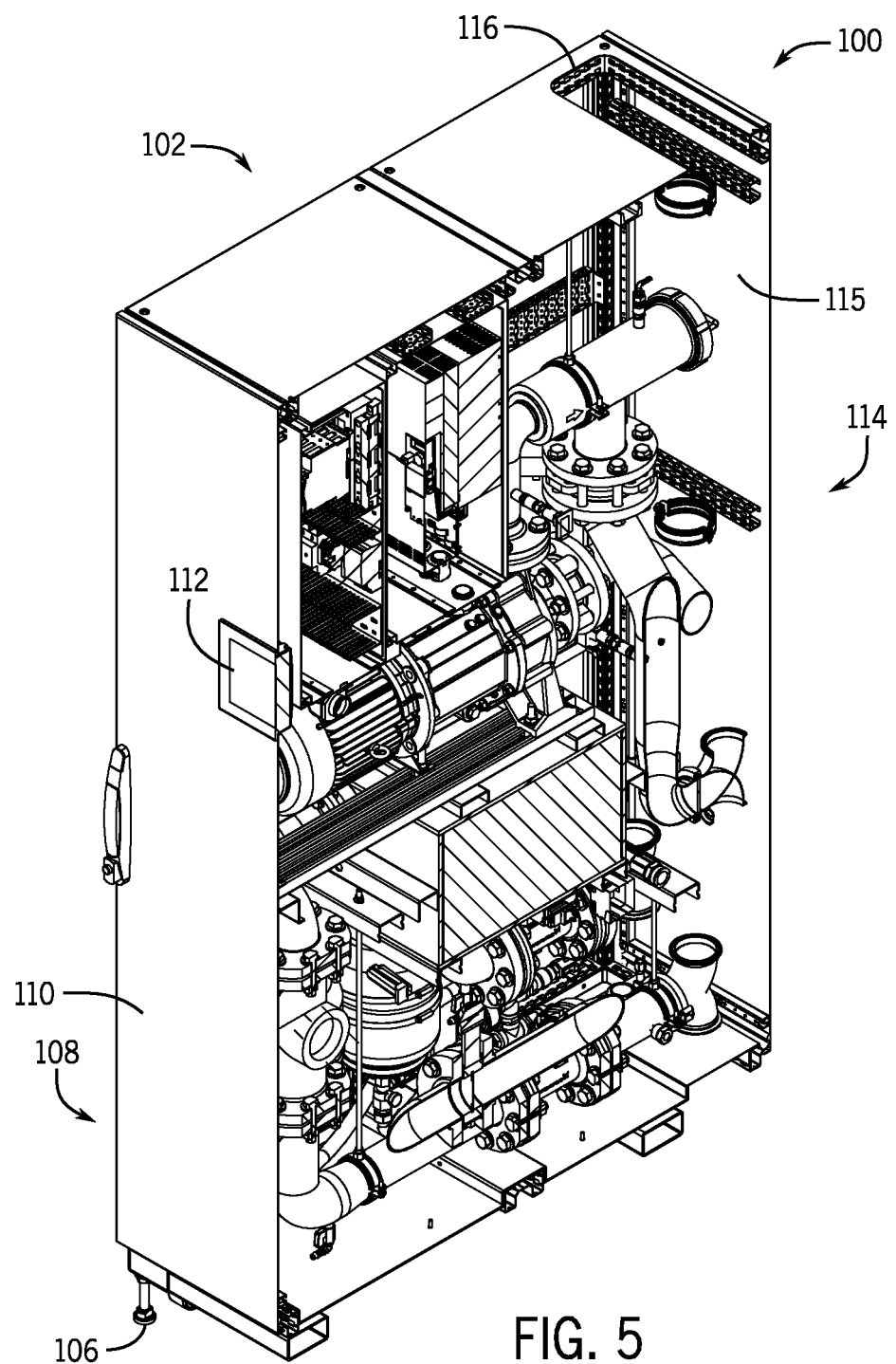
FIG. 5 is a cross-sectional isometric view of the CDU of FIG. 1 taken along line 5-5 of FIG. 4.
Figure 6:
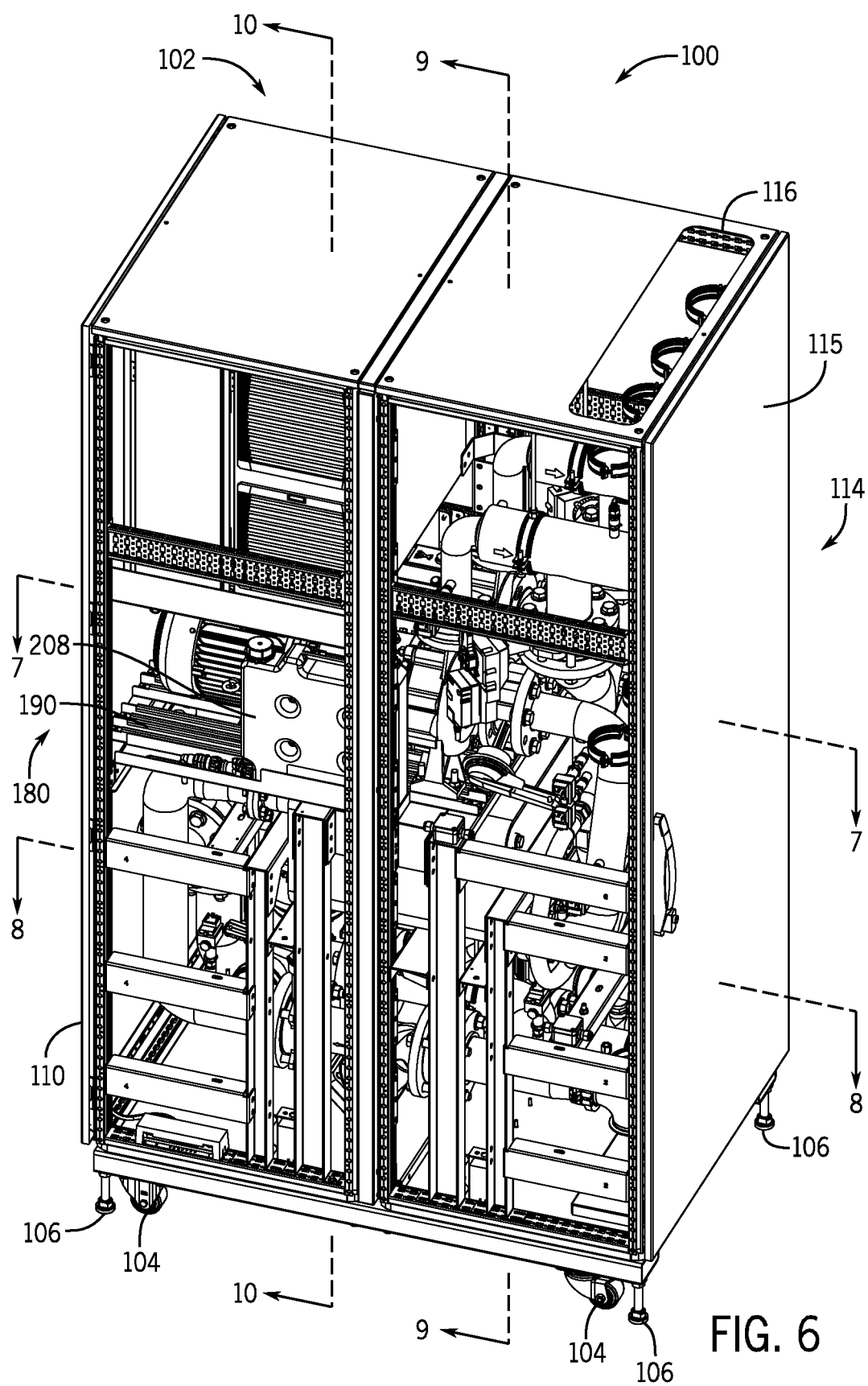
FIG. 6 is a rear, right isometric view of the CDU of FIG. 1.

As shown in FIGS. 1, 4, and 5, a front portion 108 of the rack 102 can be configured to face an aisle, and a door 110 can be provided on the front portion, which can provide access to components of the CDU 100 within the rack 102. A control panel 112 can further be provided in the front portion 108, which can provide an interface for an operator to control aspects of the CDU's operation, as described further below. As shown in FIGS. 1-6, a rear portion 114 of the rack 102 can be opposite the front portion 108, and can define and include features for connecting to fluid systems and power systems of the data center. A rear door 115 can be provided in the rear portion 114 of the rack 102, and can be opened to provide access to components housed in the rear portion 114. In some data centers, cabinets are placed on a raised floor, which may enhance cooling by providing for air circulation beneath the cabinets. In data centers with raised floor configurations, connections into cabinets can enter the cabinet through a bottom portion of the cabinet, proximate the floor structure. In other cases, cabinets are directly placed on a floor (e.g., "on-slab") of the data center, and electrical, network, and fluid cooling connections are routed to the cabinet from above the cabinet, entering the cabinet at a back or at a top portion of the cabinet.

As further shown in FIGS. 1-6, the rack 102 includes features to integrate with systems in data centers having raised floors, and data centers that are configured to provide connections into the cabinet from above the cabinet. For example, FIG. 1 shows a top cutout 116 in a top of the rack 102, to allow wiring or hosing to enter the rack 102 through the top. Correspondingly, a bottom cutout (not shown) can be defined in a bottom of the rack 102 to allow entry of wiring or hosing into the rack 102 through the bottom of the rack 102.

Figure 11:
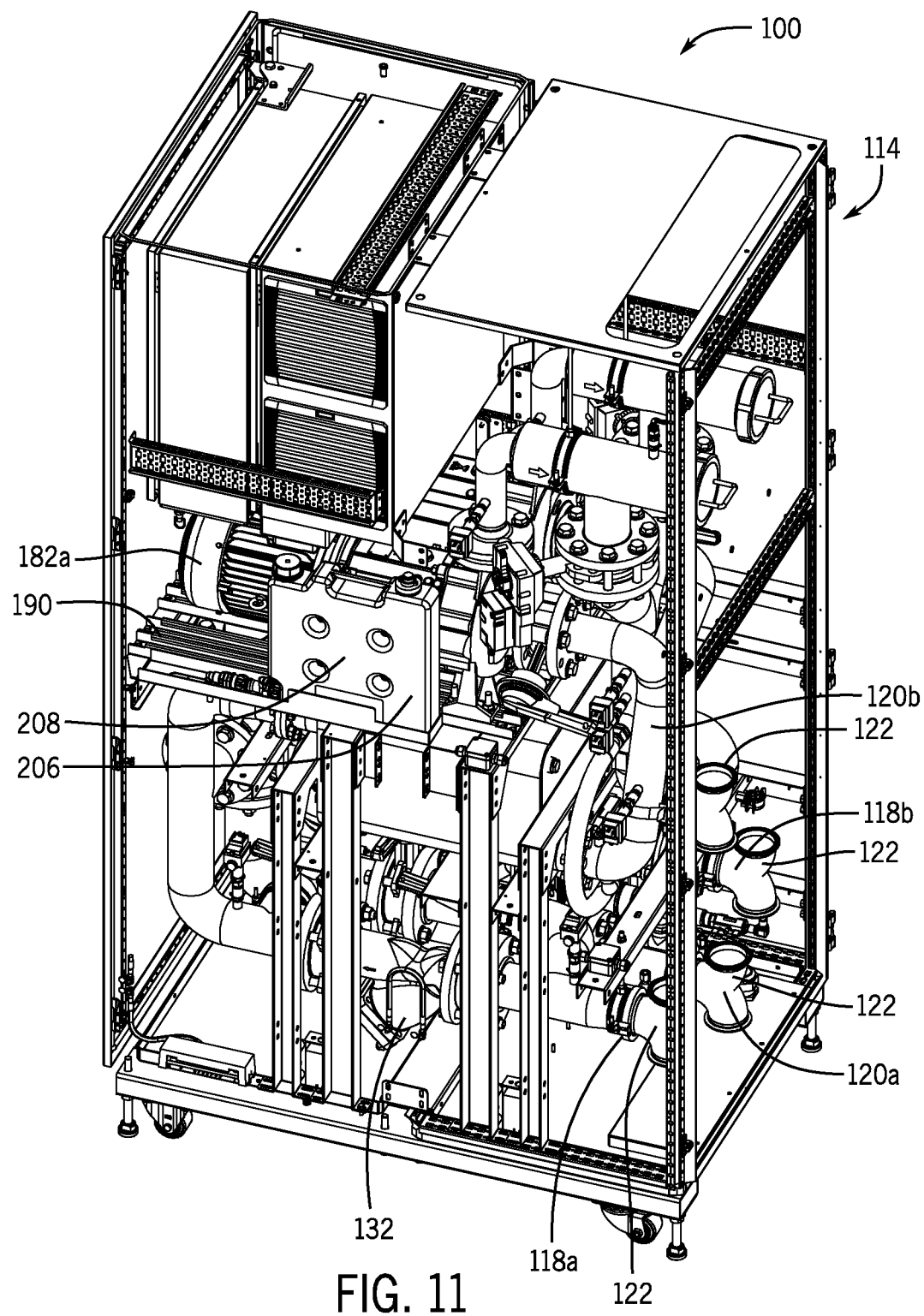
FIG. 11 is a rear, right isometric view of the CDU of FIG. 1 with rear and side panels removed.
Figure 12:
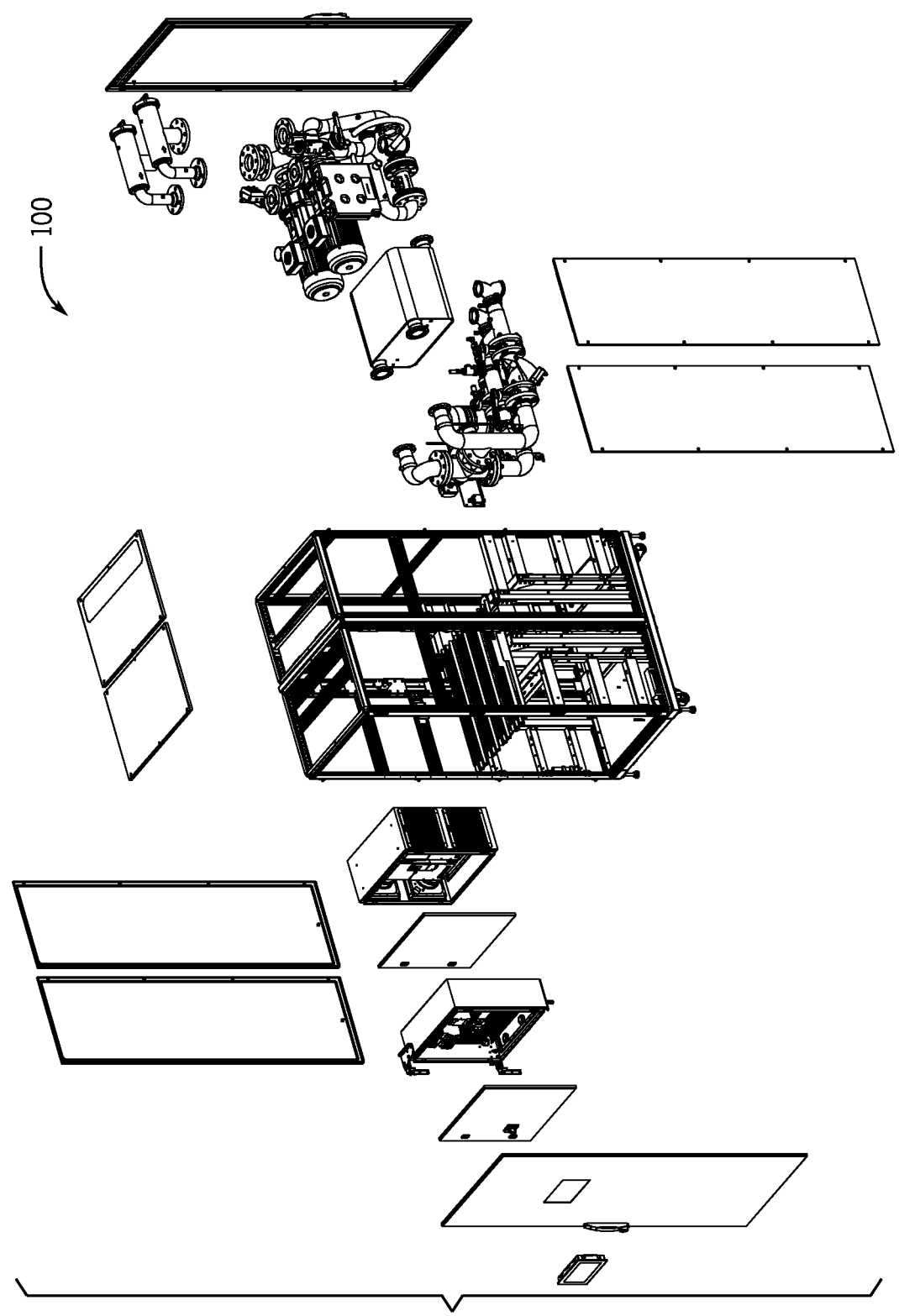
FIG. 12 is an exploded isometric view of the CDU of FIG. 1.
Figure 16:
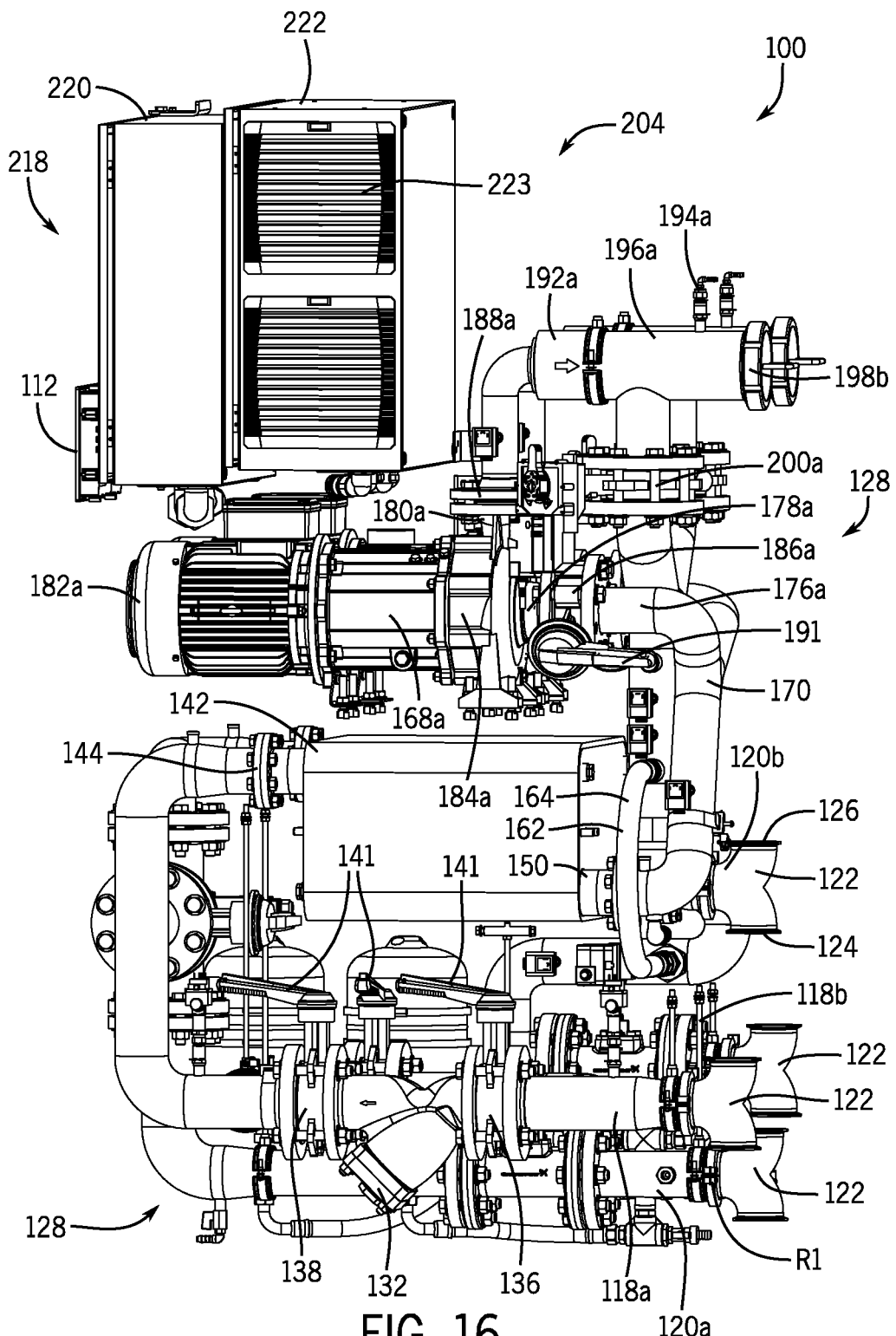
FIG. 16 is a right side view of the components of FIG. 13.
Figure 17:
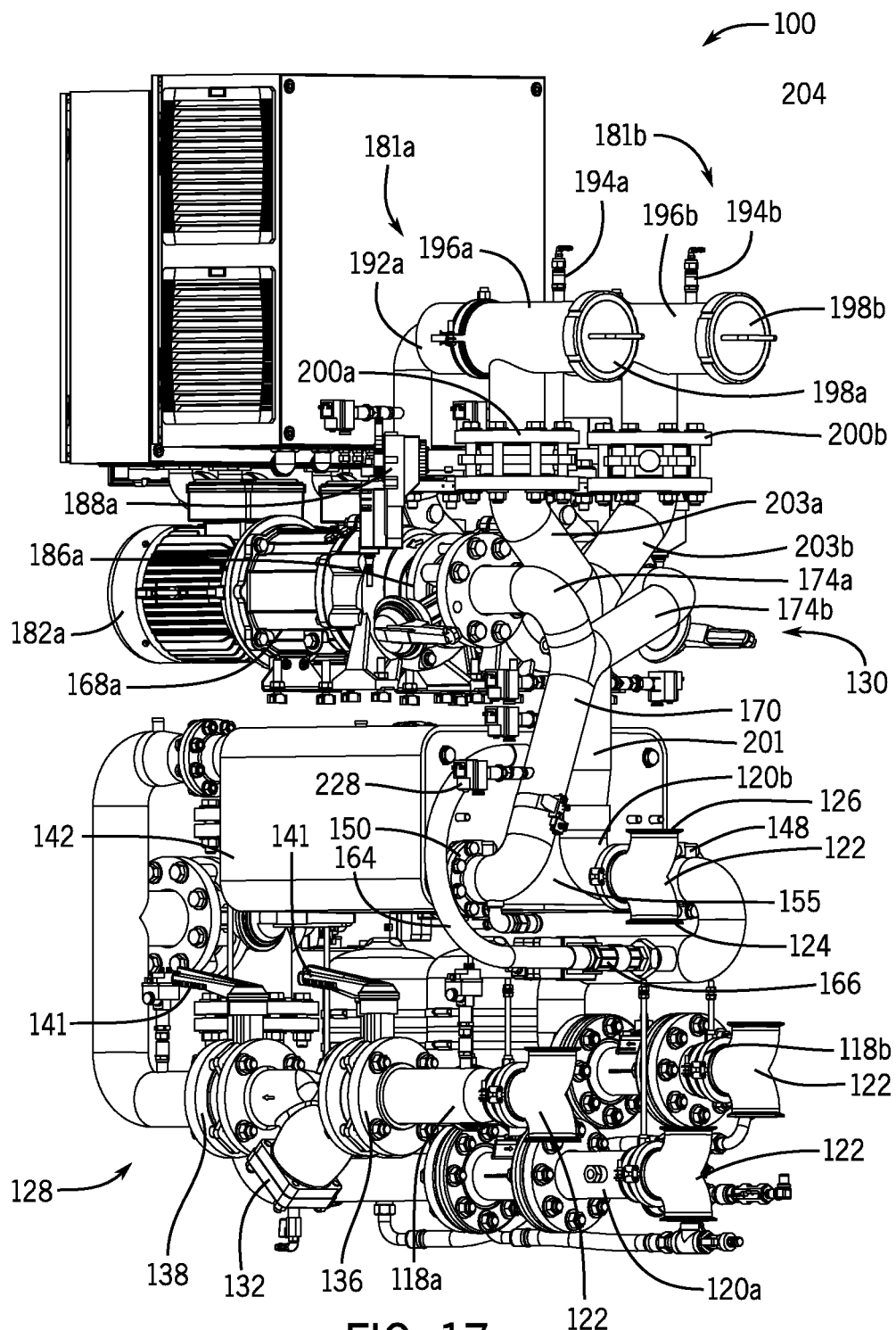
FIG. 17 is a rear, right isometric view of the components of FIG. 13.

Further, piping elements of the CDU can additionally accommodate cable entry from either a top or a bottom of the cabinet. For example, as shown in FIG. 11 inlets 118 and outlets 120 (e.g., supply and return lines) for the primary and secondary coolant circuits can be fitted with directional tee fittings 122 to accommodate top-feed or bottom-feed hosing. The directional tee fittings 122 are shown in FIGS. 16 and 17, which illustrate piping elements of the CDU 100 with the rack 102 and components removed. As shown with respect to the tee fitting 122 for the secondary outlet 120b, hosing entering the rack 102 from the bottom can connect with a bottom side 124 of a respective directional Tee fitting, and the top 126 can be capped. Alternatively, in a top-feed configuration, hosing can enter a top side 126 of a respective directional Tee fitting 122, and a cap (not shown) can be provided to prevent fluid flow through the bottom side 124 of the directional Tee fitting 122. While the top side 126 and bottom side 124 are only shown in FIGS. 16 and 17 with respect to the directional tee fitting 122 of the secondary outlet 120b, it is to be understood that the description provided is applicable to any or all directional tee fittings 122 of the CDU 100 (e.g., tee fittings 122 for each of the primary inlet 118a, primary outlet 120a, secondary inlet 118b, and secondary outlet 120b). In some cases, the geometry and arrangement of the directional tee fittings 122 can enhance flow through the CDU 100. For example, as shown in FIG. 16, the directional tee fittings 122 can have a radius of curvature R1 which can partially define the flow path of fluid flowing therethrough. While the radius of curvature is only shown with respect to tee fitting 122 of the primary outlet 120a, the description is applicable for any or all of the directional tee fittings 122. This arrangement can prevent liquid from "dead-heading" into a hard bend, which can otherwise damage pumps of a CDU and impede flow, and can reduce overall pressure drop through a given directional tee fitting 122 while providing an operator of the CDU 100 optionality concerning how primary and secondary connections enter and leave the CDU 100.

In some embodiments, the directional tee fittings 122 can be secured to the piping elements of the CDU 100 with a tri-clamp flange system, as can allow a toolless installation of the directional tee fittings 122. Thus, a shown at least in FIG. 20, clamps 125 can be used to secure the directional Tee fittings 122 to the piping of the CDU 100. The clamps 125 can be compatible with a tri-clamp flange system, and can thus surround adjacent flanges of the directional tee fittings 122 and the piping of the CDU, with respective sides of the clamps 125 being joined together with a screw system. The clamps 125 can force flanges of adjacent piping elements together, and a seal (e.g., an o-ring) can be provided between the flanges to seal the assembly against the entry or exit of fluid. In some embodiments, hosing can be connected to the directional tee fittings 122 using a tri-clamp flange system.

In some embodiments, a CDU can include elements for controlling fluid flow through a primary and secondary coolant circuit, means for filtering coolant in both circuits, a heat exchanger, and sensing elements. In some embodiments, fluid flow through the primary circuit can be driven by facility side pressure or other pumping elements external to the CDU. Conversely, pumps for generating flow through the secondary circuit can be housed in the rack and can be positioned in the flow path of the fluid in the secondary circuit. Additionally, filtration systems can be provided along both primary and secondary loops within a CDU to protect components of the CDU along each of the respective loops.

For example, FIGS. 16-26 illustrate the CDU 100, with the rack 102 removed to show functional elements of the CDU 100 housed within the rack 102. The CDU 100 can include primary loop piping 128 and secondary loop piping 130, the primary loop piping 128 being positioned generally closer to a floor than the secondary loop piping 130. As also discussed with respect to FIG. 7, the primary loop piping 128 can include the primary inlet 118a (i.e., the primary supply port) and the primary outlet 120a (i.e., the primary return port). The fluid of the primary loop can enter the CDU 100 through the primary inlet 118a and exit the CDU 100 through the primary outlet 120a.

Impurities and particulate matter in a coolant loop can negatively impact performance of a CDU and can damage components of the CDU. For example, particulate matter can be abrasive to piping elements of the CDU, or could accumulate along the walls of piping elements, impeding flow through the CDU. Further, particulate matter in a fluid of a cooling loop can impact heat transfer of the CDU by accumulating in a heat exchanger, reducing the efficiency of the heat rejection from the secondary loop to the primary loop. Strainers (i.e., filters) within the CDU can filter out harmful impurities and particulate matter from fluid in a given circuit or loop. For a primary loop, a strainer can be positioned upstream of a heat exchanger and flow regulating components to ensure that coolant provided by the facility is sufficiently strained before flowing through those elements. Thus, in some embodiments, as shown in FIG. 16, a primary loop strainer 132 can be included in the primary loop piping 128, and can be downstream of the primary inlet 118a, as can minimize the negative effects of impurities in the coolant of the primary loop to components and piping of the primary loop within the CDU 100. As shown, the primary loop strainer 132 can be upstream of a heat exchanger (HX) 142 and flow-regulating elements of the primary loop, to ensure that fluid from a facility is sufficiently filtered as to not degrade a performance of the CDU 100. As shown, the primary loop strainer 132 can be a Y strainer, which can reduce a space required for the filtration of the primary loop coolant, as a Y strainer can be smaller and more compact than some conventional filters. In other embodiments, however, a filter for a primary loop of a CDU can be a cannister filter or any other filter which can be configured to remove impurities along a primary loop. In some embodiments, the primary loop strainer 132 is a 250 micron filter.

In some embodiments, primary loop piping of a CDU can include features and systems to allow servicing of a primary loop strainer, and additionally or alternatively, features to allow fluid within the primary loop to bypass the primary loop strainer. For example, valves can be provided within a primary loop upstream and downstream of a strainer to fluidly isolate the strainer, and thus facilitate servicing of the strainer without draining the CDU. In some embodiments, a bypass circuit can be provided to allow fluid to continue to flow through the primary loop while the strainer is being serviced. A bypass loop for a strainer in a primary coolant loop can provide an option for the CDU to operate without the use of a primary loop strainer. In some embodiments, a strainer along a primary loop can introduce a pressure drop through the CDU, and where coolant from the facility is filtered upstream of a primary loop inlet of a CDU, the CDU can be operated with fluid of the primary loop flowing through the bypass loop of the strainer and the strainer fluidly isolated from the primary loop.

Figure 24:
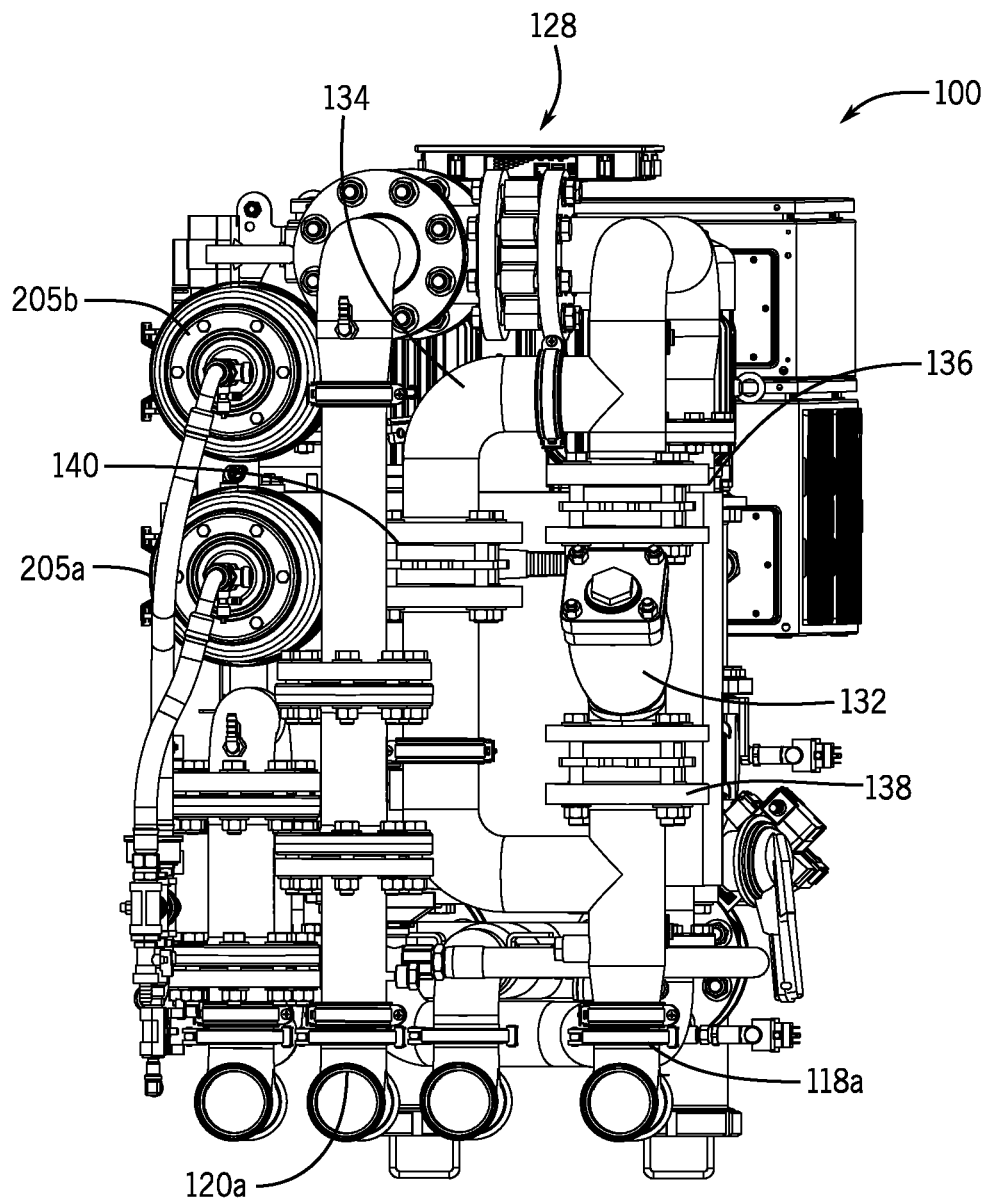
FIG. 24 is a bottom view of the components of FIG. 13.
Figure 25:
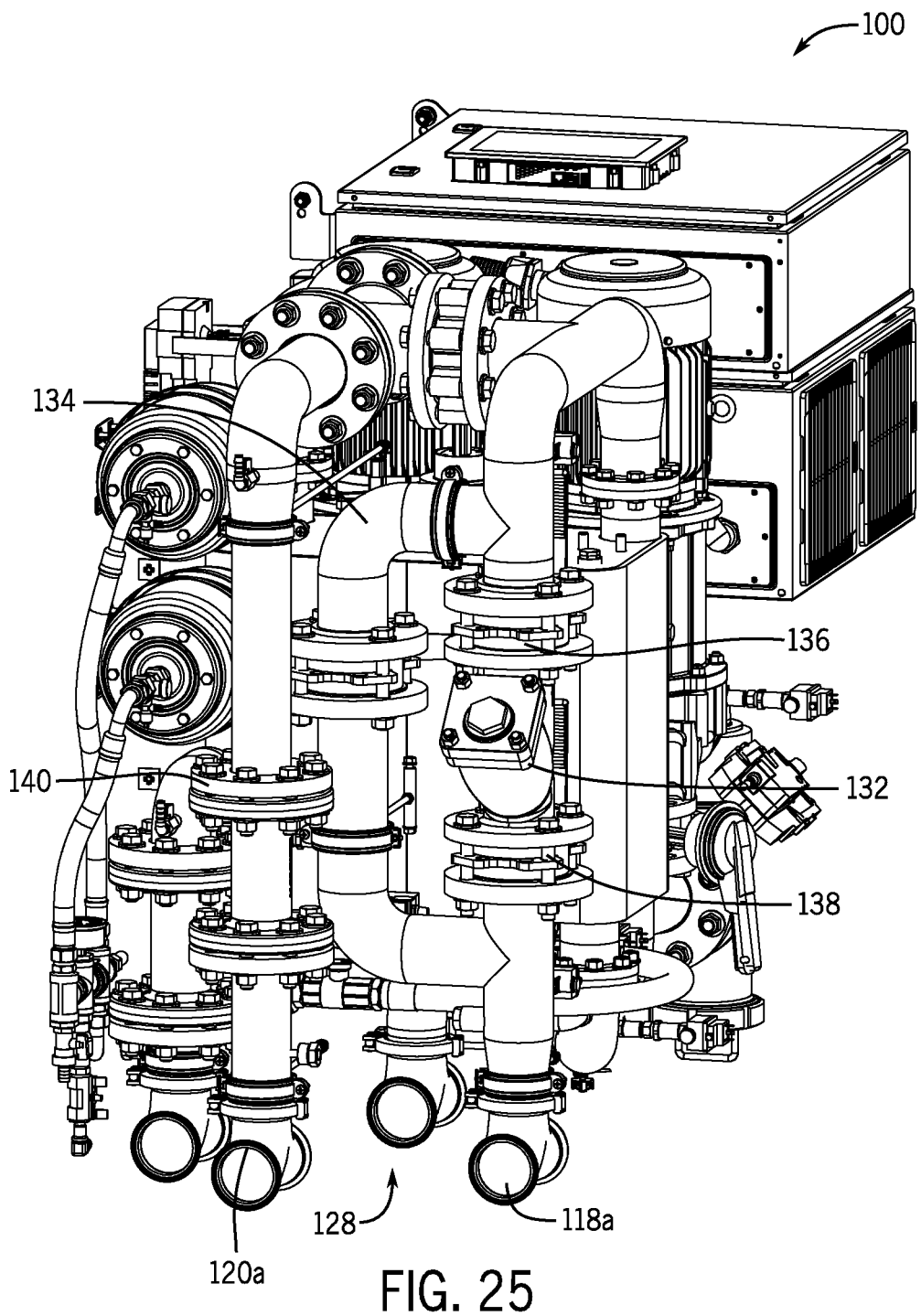
FIG. 25 is a bottom, right isometric view of the components of FIG. 13.
Figure 26:
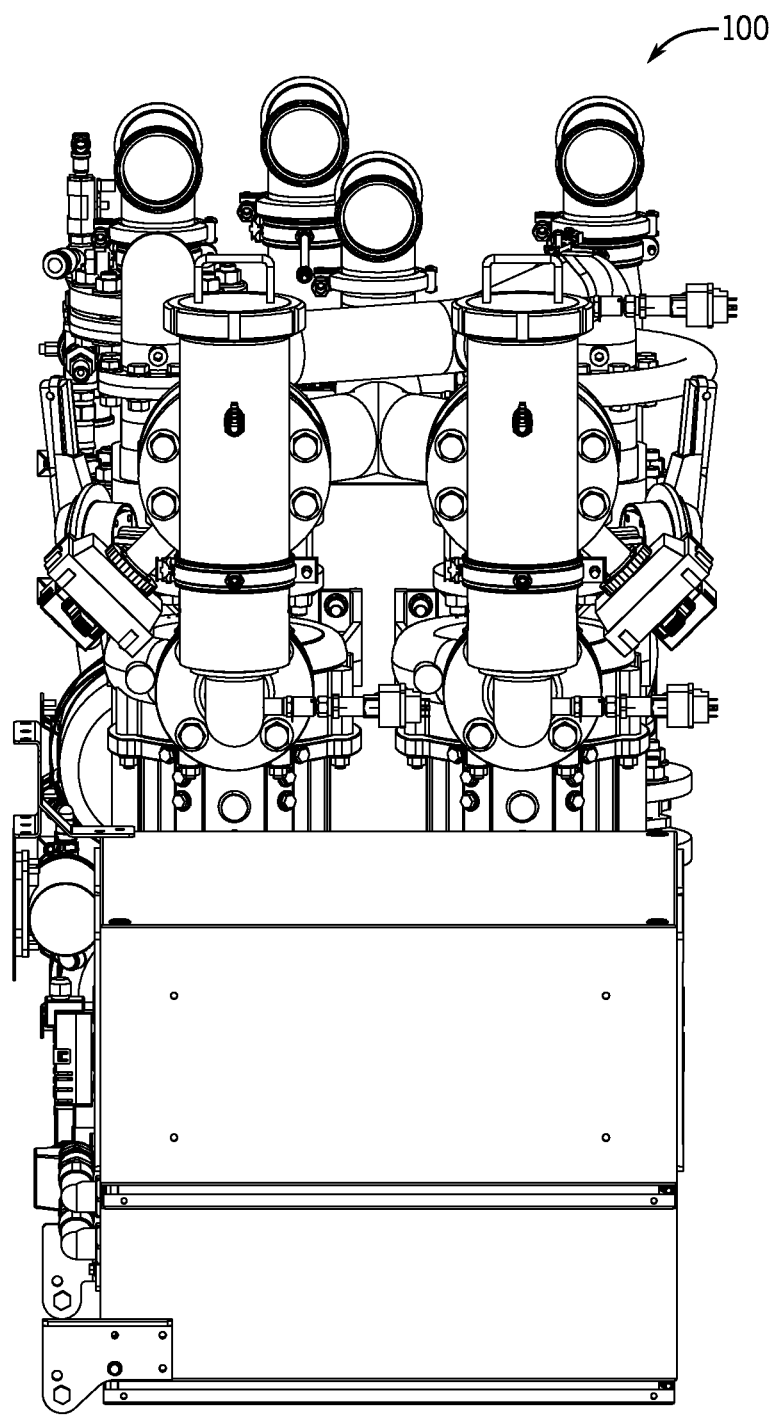
FIG. 26 is a top view of the components of FIG. 13.
Figure 27:
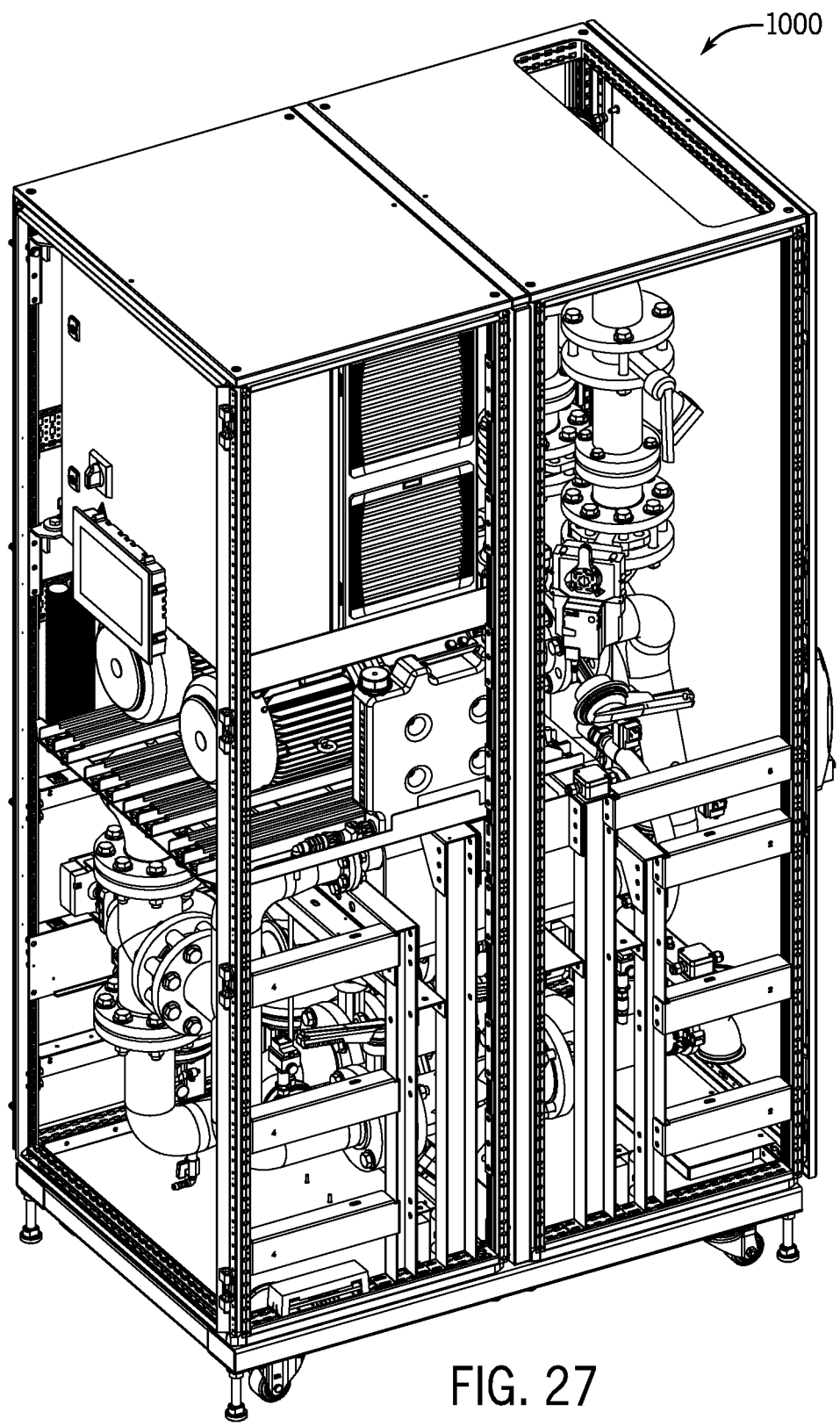
FIG. 27 is a front, right isometric view of a CDU, according to an embodiment of the invention, with front and side panels removed.
Figure 28:
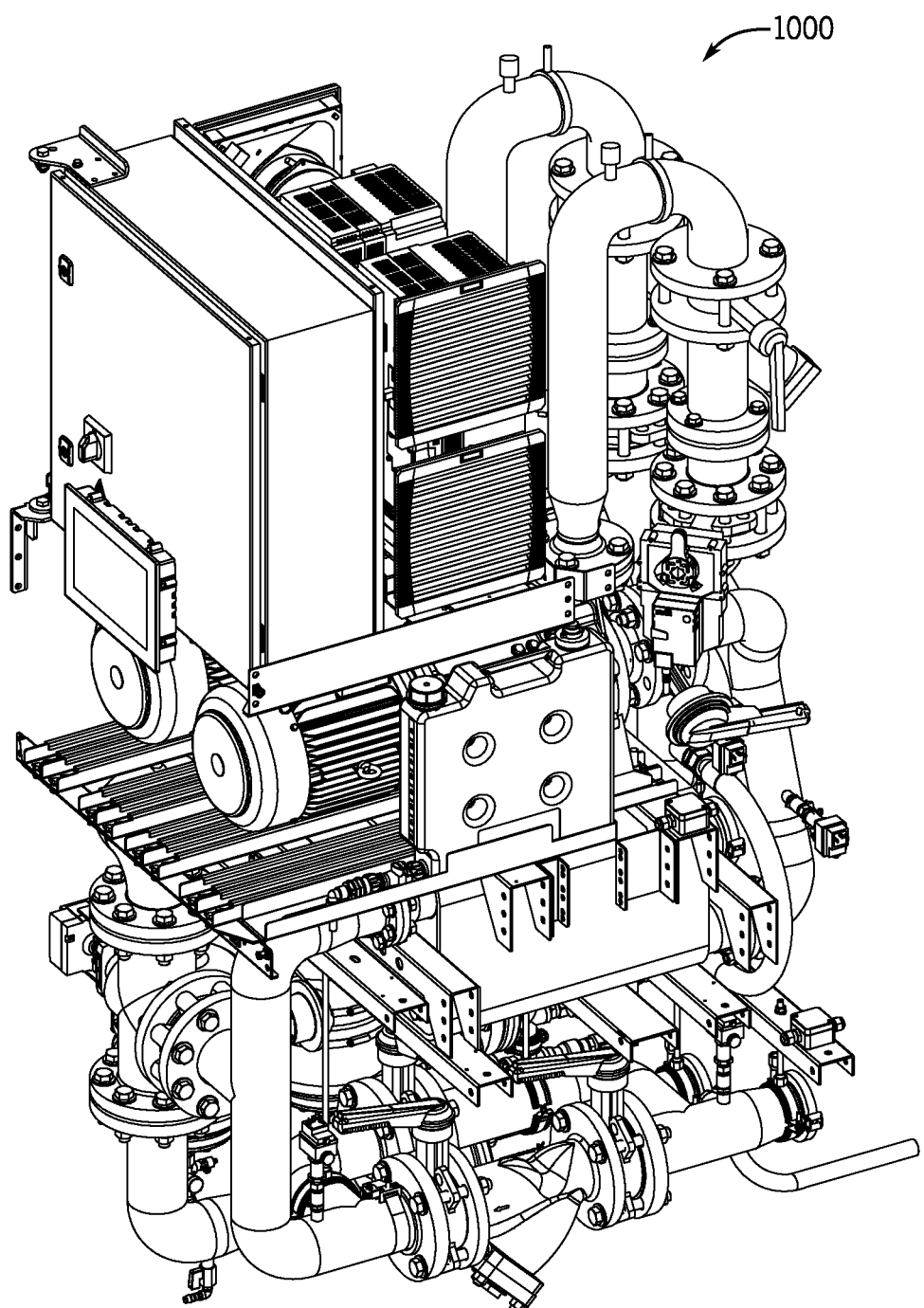
FIG. 28 is a front, right isometric view of components of the CDU of FIG. 27, illustrating a piping layout according to an embodiment of the invention.
Figure 29:
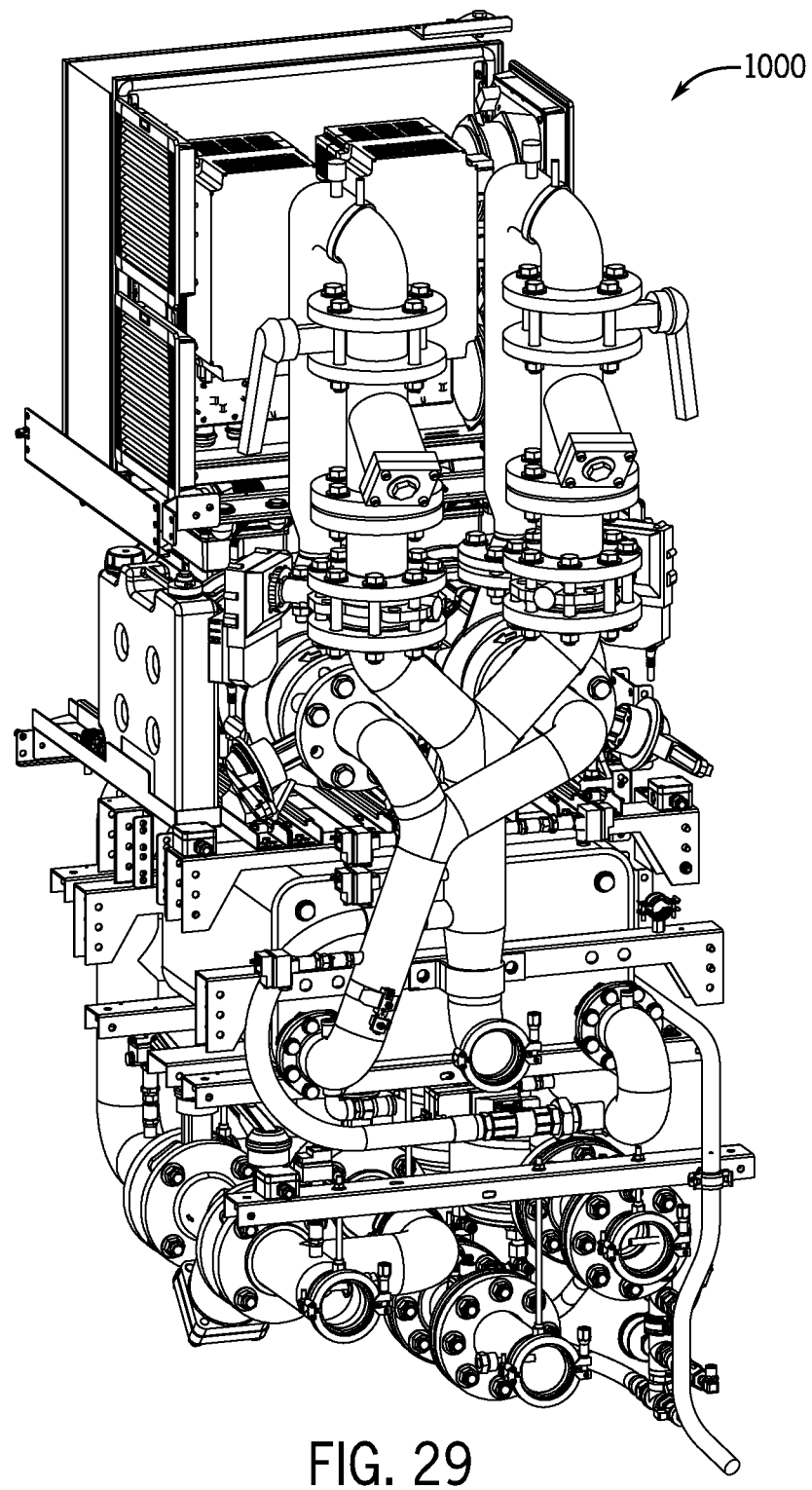
FIG. 29 is a rear, right isometric view of the components of FIG. 28.
Figure 30:
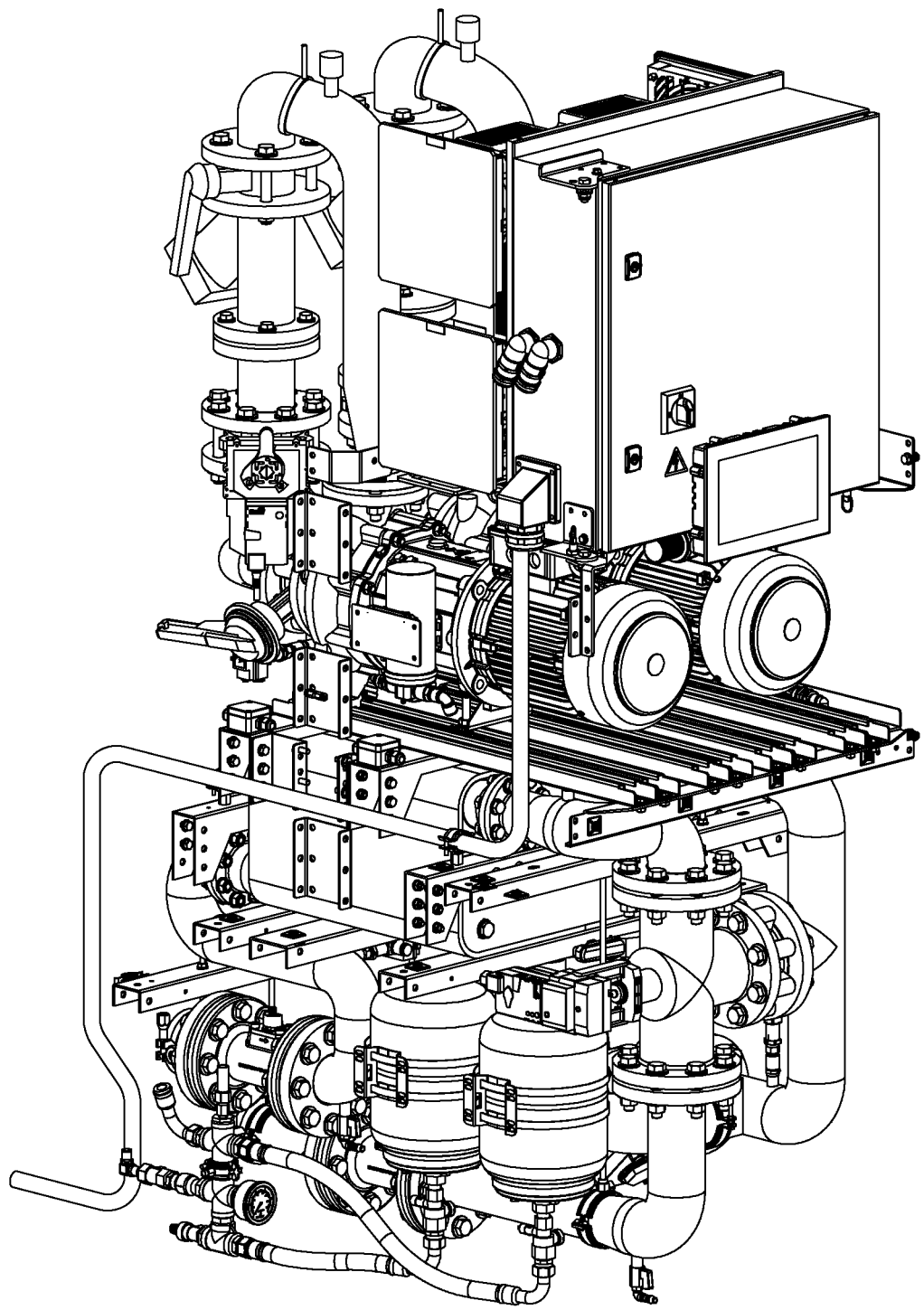
FIG. 30 is a front, left isometric view of the components of FIG. 28.

In some embodiments therefore, as illustrated in FIGS. 24 and 25, a bypass loop 134 can be provided in the primary loop piping 128, a portion of which can be parallel to the primary loop strainer 132. The piping of the bypass loop 134 can be positioned along the same horizontal plane as the primary inlet 118a and the primary loop strainer 132, to minimize a pressure drop due to gravity when the coolant of the primary loop is routed through the bypass loop 134. A primary inlet valve 136 can be provided upstream of the primary loop strainer 132, and a primary outlet valve 138 can be provided downstream of the primary loop strainer 132. When both the primary inlet valve 136 and primary outlet valve 138 are open, fluid of the primary loop can flow through the primary loop strainer 132. Closing the primary inlet valve 136 can prevent fluid from flowing into the primary loop strainer 132 from the facility source and closing the primary outlet valve 138 can prevent backflow of fluid from elements of the primary loop piping 128 downstream of the primary loop strainer 132. In some embodiments, the primary inlet valve 136 and the primary outlet valve 138 can be normally opened, so that fluid of the primary loop flows through the primary loop strainer 132 by default.

In some embodiments, a primary bypass valve 140 can be provided along the bypass loop 134. When the primary bypass valve 140 is in an open configuration, flow can be permitted through the bypass loop 134, and when the bypass valve 140 is closed, no fluid is permitted through the bypass loop 134. Thus, when the primary bypass valve 140 is closed, and the primary inlet and outlet valves 136, 138 are open, all fluid flow through the primary loop can traverse the primary loop strainer 132. Correspondingly, when the primary inlet and outlet valves 136, 138 are closed, and the primary bypass valve 140 is open, the primary loop strainer 132 is fluidly isolated from the primary loop, and all fluid flow through the primary loop can pass through the bypass loop 134. In some embodiments, the primary bypass valve 140 is a normally closed valve so that fluid flow through the primary loop flows through the primary loop strainer in a default configuration. In some embodiments, the valves to be used for the primary inlet valve, primary outlet valve, and the primary bypass valve can be butterfly valves, or ball valves, or globe valves, or pinch valves, or needle valves, or gate valves, or any combination thereof. In some embodiments, a primary inlet valve, primary outlet valve, and primary bypass valve can be manually operated, and handles or knobs (e.g., valve handles 141 shown in FIG. 16) can be provided on the respective valves to allow an operator to switch a given valve between an open and a closed configuration. In some embodiments, a primary inlet valve, primary outlet valve, and primary bypass valve can be operated by a control system of a CDU. For example, pressure sensors can be provided upstream and downstream of a primary loop strainer, and a pressure drop across the strainer can indicate that the strainer needs to be serviced. A control system could therefore operate the valves to allow flow through a bypass loop and fluidly isolate the strainer, allowing an operator to service the strainer.

Figure 13:
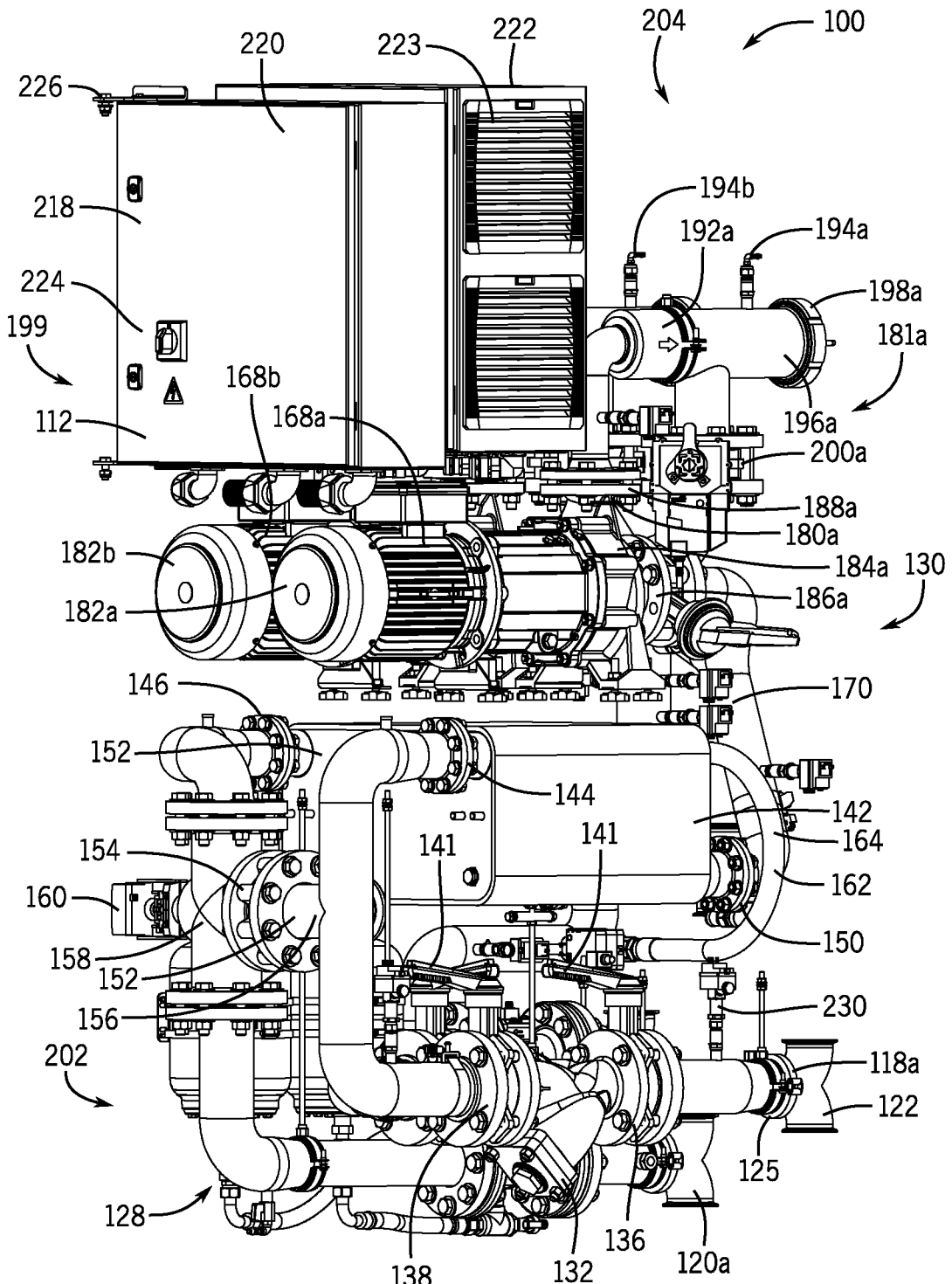
FIG. 13 is a front, right isometric view of components of the CDU of FIG. 1, illustrating a piping layout according to an embodiment of the invention.

A CDU can include a liquid to liquid heat exchanger (HX) for transferring heat from the coolant of a secondary loop to the coolant of a primary loop. A HX for use in a CDU housed in an in-row rack for a data center (e.g., rack 102) can be specifically designed or selected to address spacing constraints for elements of primary loop piping and secondary loop piping. For example, as illustrated at least in FIGS. 13, 16, and 17, the HX 142 can be provided in the CDU 100 and can be integrated and fluidly connected with the primary loop piping 128 and the secondary loop piping 130. As shown in FIG. 13, the HX 142 can include a primary inlet port 144 through which coolant of the primary loop can enter the HX 142, and a primary outlet port 146 through which coolant of the primary loop can exit the HX 142. The primary inlet port 144 and primary outlet port 146 can be positioned on a first side 153 of the HX 142, which can face toward the rear of the rack 102 (e.g., rear portion 114 shown in FIG. 1). Similarly, as shown in FIG. 17, the HX 142 can include a secondary inlet port 148 through which coolant of the secondary loop can enter the HX 142, and a secondary outlet port 150 through which coolant of the secondary loop can exit the HX 142. The secondary inlet port 148 and secondary outlet port 150 can be positioned on a second side 155 of the HX 142, which can face toward the front of the rack 102 (e.g., front portion 108 shown in FIG. 1). Positioning inlet and outlet ports of a coolant loop on the same side of a heat exchanger can provide a benefit by minimizing a number of bends along piping of the coolant loop, thus conserving space within the CDU and increasing cooling capacity, while also reducing a pressure drop along piping of the coolant loop.

A liquid to liquid heat exchanger can be selected or designed to fit within the volume of a standard rack, and accommodate all the other components of a high-density CDU. In some cases, the reduced size of a heat exchanger (e.g., HX 142) housed within the CDU 100 can result in a reduction in performance of the HX by providing less surface area through which heat transfer can occur. In some embodiments, a turbulator (not shown) can be provided along the flow path of coolant entering the HX 142, which can increase efficiency of the heat transfer by introducing turbulence into the fluid. In some embodiments, a turbulator can be provided at one or both of the primary inlet port 144 and the secondary inlet port 148. The turbulator can comprise a suitable turbulator, including, for example, convex conical port inserts, concave conical inserts, standard conical inserts, elliptical riffle-grate port inserts, or reverse conical perforated inserts.

Figure 22:
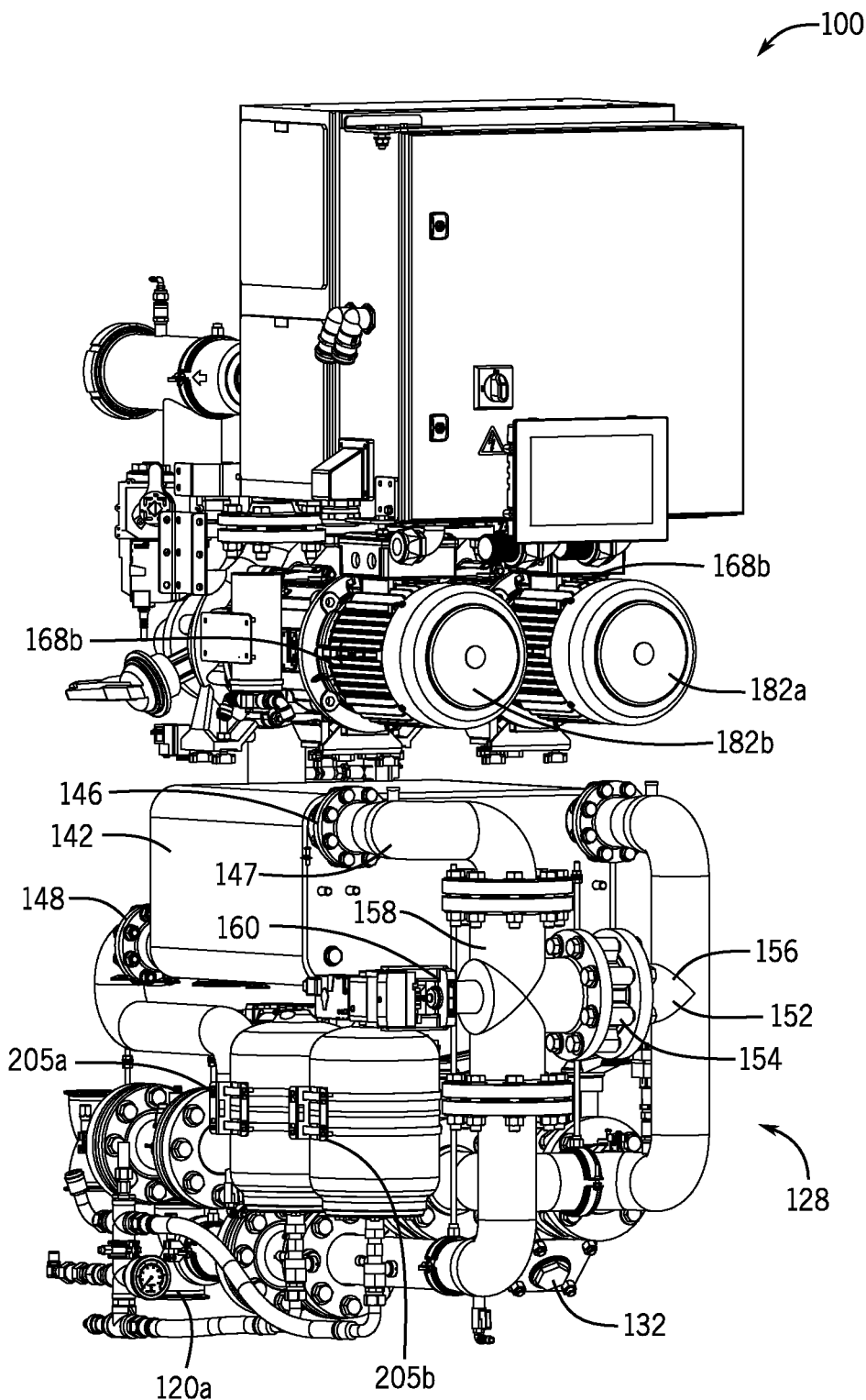
FIG. 22 is front, left isometric view of the components of FIG. 13.
Figure 23:
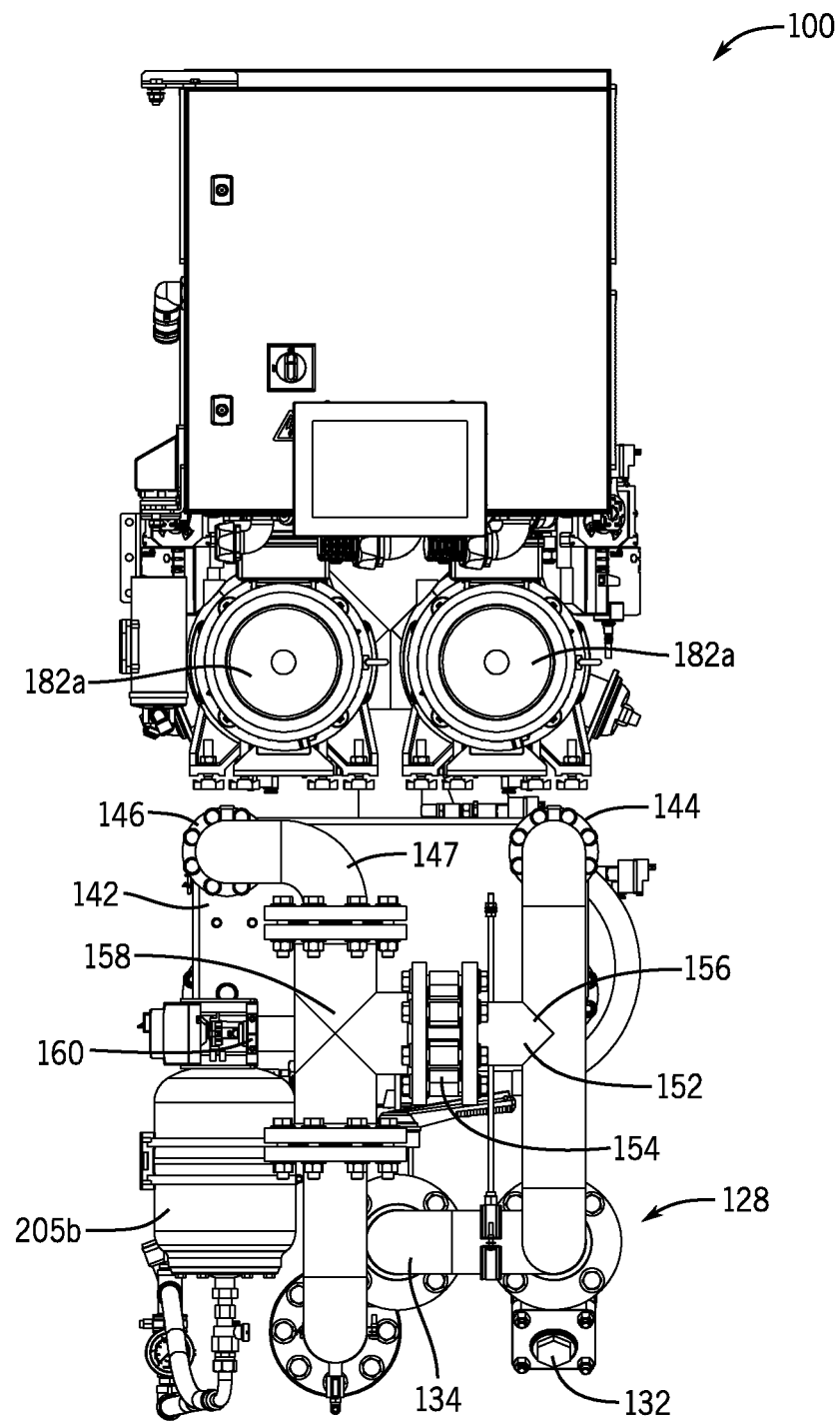
FIG. 23 is a front view of the components of FIG. 13.

Referring now to FIGS. 22 and 23, the HX 142 can be downstream of the primary loop strainer 132 as can provide protection for the HX 142 as discussed above. As also described above, coolant of the primary loop can enter the HX 142 through the primary inlet port 144 and exit through the primary outlet port 146. In operation, the coolant flowing into the primary inlet port 144 can be cooler than the fluid flowing out of the primary outlet port 146, as the HX 142 can effectuate a transfer of heat from coolant of the secondary loop to coolant of the primary loop. The heated coolant of the primary loop can proceed through elements of the primary loop piping 128, and ultimately exit the CDU 100 through the primary outlet 120*a*, removing heat from the CDU 100.

As noted above, pressure for inducing fluid flow through a primary loop of a CDU can be provided by a facility. Additional flow regulating components can thus be provided along a primary loop, as can allow the CDU to control flow through a heat exchanger, and moderate heat transfer, pressure, and flow parameters of the fluid of the primary loop. Accordingly, valves can be provided to control the rate of flow of primary coolant through a heat exchanger. In some embodiments, a heat exchange bypass circuit can be provided to allow a portion or all of the fluid in the primary loop to bypass the heat exchanger. As further shown in FIGS. 22 and 23, the primary loop piping 128 can include a heat exchanger bypass loop 152, which can allow all or a portion of the fluid of the primary coolant loop to bypass the HX 142. In some embodiments, a two-way valve 154 can be disposed along the fluid path of the primary loop, and when open, can allow fluid to flow into the heat exchanger bypass loop 152. When the two-way valve 154 is closed, all fluid of the primary loop flows through the HX 142. The heat exchanger bypass loop 152 can include a hard bend 156 relative to the other piping of the primary loop piping 128 through which fluid enters and exits the heat exchanger (e.g., the heat exchanger bypass loop 152 is oriented at a 90 degree angle relative to the other piping elements). This arrangement can allow the primary loop piping 128 to be compact enough to fit within the rack 102, and the hard bend 156 can require a greater pressure to induce fluid flow through the heat exchanger bypass loop 152 than the pressure required to induce fluid flow through the HX 142. Thus, in some embodiments, when the two-way valve 154 is in an open configuration, a portion of the fluid of the primary loop can flow through the HX 142, and the remaining fluid can flow through the heat exchanger bypass loop 152, the relative portions being determined by the relative pressure drops across the HX 142 and the heat exchanger bypass loop 152 (e.g., the coolant within the primary loop will take the path of least resistance). In some embodiments, the two-way valve 154 can be a binary valve, having an open configuration and a closed configuration. In some embodiments, the two-way valve 154 can further have a partially open configuration, as can regulate flow through the bypass loop 152. In some embodiments, a controller can be provided in the CDU 100, and the operation of the two-way valve 154 can be controlled by the controller, either in response to user input or parameters of the coolant in one or both of the primary and the secondary loop (e.g., temperature, flow rate, dew point, pressure, etc.).

In some embodiments, as further shown in FIG. 22, additional flow-control components can be provided in primary loop piping of a CDU to further control flow of coolant in the primary loop. In the illustrated example, a three-way valve 158 can be provided in the heat exchanger bypass loop 152, immediately downstream of both the HX 142 and the two-way valve 154. When the two-way valve 154 is closed, all fluid of the primary loop flows through the HX 142, and through the three-way valve 158 before exiting the CDU 100 through the primary outlet 120*a*. In this configuration, then, the three-way valve 158 can operate as a two-way valve as the heat exchanger bypass loop 152 is closed. When the two-way valve 154 is an open configuration, allowing flow through the heat exchanger bypass loop 152, the three-way valve 158 can function as a standard three-way valve. In this configuration, the three-way valve 158 can modulate to selectively allow flow through the heat exchanger bypass loop 152 and can thus adjust the amount of fluid flow through the HX 142. A maximum amount of heat transfer from the secondary loop to the primary loop is achieved when all fluid of the primary loop flows through the heat exchanger, and thus, when the three-way valve 158 modulates to allow a portion of the flow of the coolant in the primary loop to traverse the heat exchanger bypass loop 152, the amount of heat transfer from the secondary loop to the primary loop decreases. Decreasing heat transfer across a heat exchanger can be advantageous in some instances, including, for example, when a temperature of the coolant in the secondary loop of a CDU must be regulated to remain above a dew point, as further described below.

Still referring to FIG. 22, in some embodiments, the three-way valve 158 can have a fully open configuration and a fully closed configuration and can alternate between these configurations to achieve a desired amount of flow through the heat exchanger bypass loop 152. In some embodiments, the three-way valve 158 can be partially opened, and the degree to which the valve 158 is open corresponds to a permitted flow through the heat exchanger bypass loop 152. In some embodiments, a linear actuator 160 (e.g., a solenoid) can be provided to control the operation of the three-way valve 158. The linear actuator 160 can be controlled by a controller of the CDU 100, so that an operator can selectively open or close the three-way valve 158, or the three-way valve 158 can automatically modulate to achieve the desired flow through the heat exchanger, as is discussed below with respect to control systems of the CDU 100. In some embodiments, the linear actuator 160 is normally open, while in other embodiments, the linear actuator 160 can be normally closed.

Figure 20:
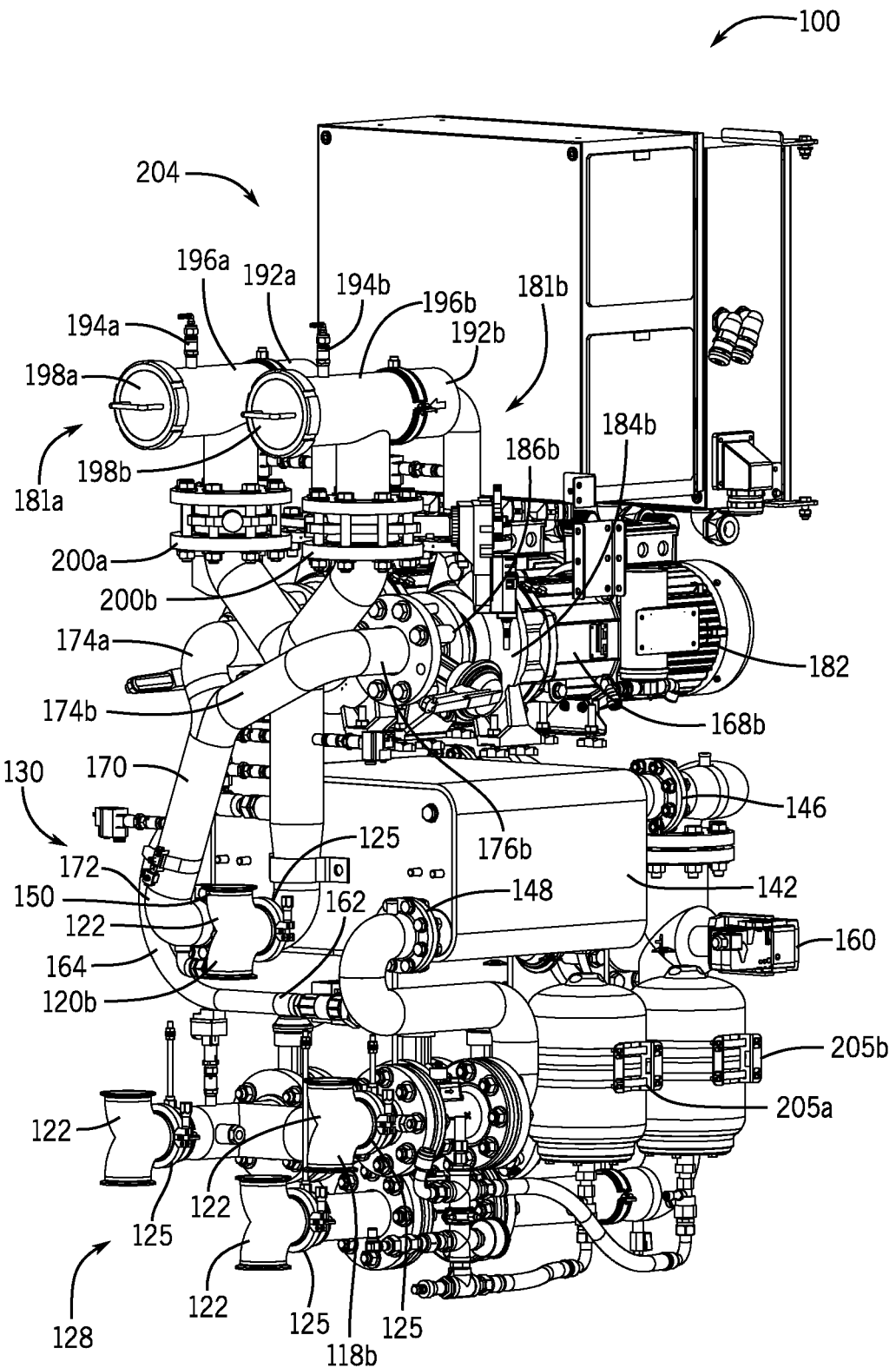
FIG. 20 is a rear, left isometric view of the components of FIG. 13.

In some embodiments, secondary loop piping for a CDU can include components for monitoring and regulating pressure in the secondary loop, filtering fluid within the secondary loop, and providing serviceability for components of the secondary loop piping without causing down time for the CDU. Referring now to FIG. 20, fluid of the secondary loop can flow into the CDU 100 through the secondary inlet 118*b* and exit the CDU through the secondary outlet 120*b*. The secondary inlet and outlet 118*b*, 120*b* can be generally similar, or identical to the primary inlet and outlet 118*a*, 120*a*, and can, for example, include directional tee fittings 122, which can include tri-clamp flange fittings, and can attach to the secondary loop piping 130 with clamps 125. As described above, fluid of the secondary loop can be used to cool electrical components and downstream IT loads within a data center. Thus, cooled fluid can exit the CDU 100 through the secondary outlet 120b and fluid heated by the heat produced from downstream loads can return to the CDU through the secondary inlet 118a to be cooled.

The HX 142 can be immediately upstream of the secondary inlet 118b, and fluid entering the CDU 100 through the secondary inlet can flow into the HX 142 through the secondary inlet port 148. Within the HX 142, the fluid of the secondary loop can reject heat to the primary loop, and cooled fluid can flow out of the HX 142 through the secondary outlet port 150. As noted above, in some embodiments, the secondary inlet port 148 and the secondary outlet port 150 can be positioned on a same side of the HX 142, which can reduce the need for introducing hard bends into piping of the secondary loop piping 130, which in turn can allow the secondary loop piping 130 to fit within the rack 102 while minimizing pressure drop across components of the secondary loop piping 130. In some embodiments, the HX 142 can effect a heat transfer rate of at least 800 kilowatts from the secondary coolant loop to the primary coolant loop at a flow rate of 1135 liters per minute through the primary coolant loop and at a flow rate of 850 liters per minute through the secondary coolant loop.

In some embodiments, the secondary loop piping 130 can include a secondary loop bypass circuit 162. The secondary loop bypass circuit 162 can include hosing 164 which can fluidly connect the secondary inlet 118b to the secondary outlet 120b, so that, for fluid flowing through the hosing 164, the secondary outlet is immediately downstream of the secondary inlet 118b. A modulating valve 166 can be provided along the secondary loop bypass circuit 162 to selectively allow fluid of the secondary loop to bypass the HX 142, and other components along the secondary loop piping 130, to flow directly to the secondary outlet 120b. In some embodiments, the modulating valve 166 can be controlled by a controller of the CDU 100 and can allow fluid through the secondary loop bypass circuit 162 to achieve desired flow, pressure, or heat exchange parameters for the system, as further described below.

Figure 7:
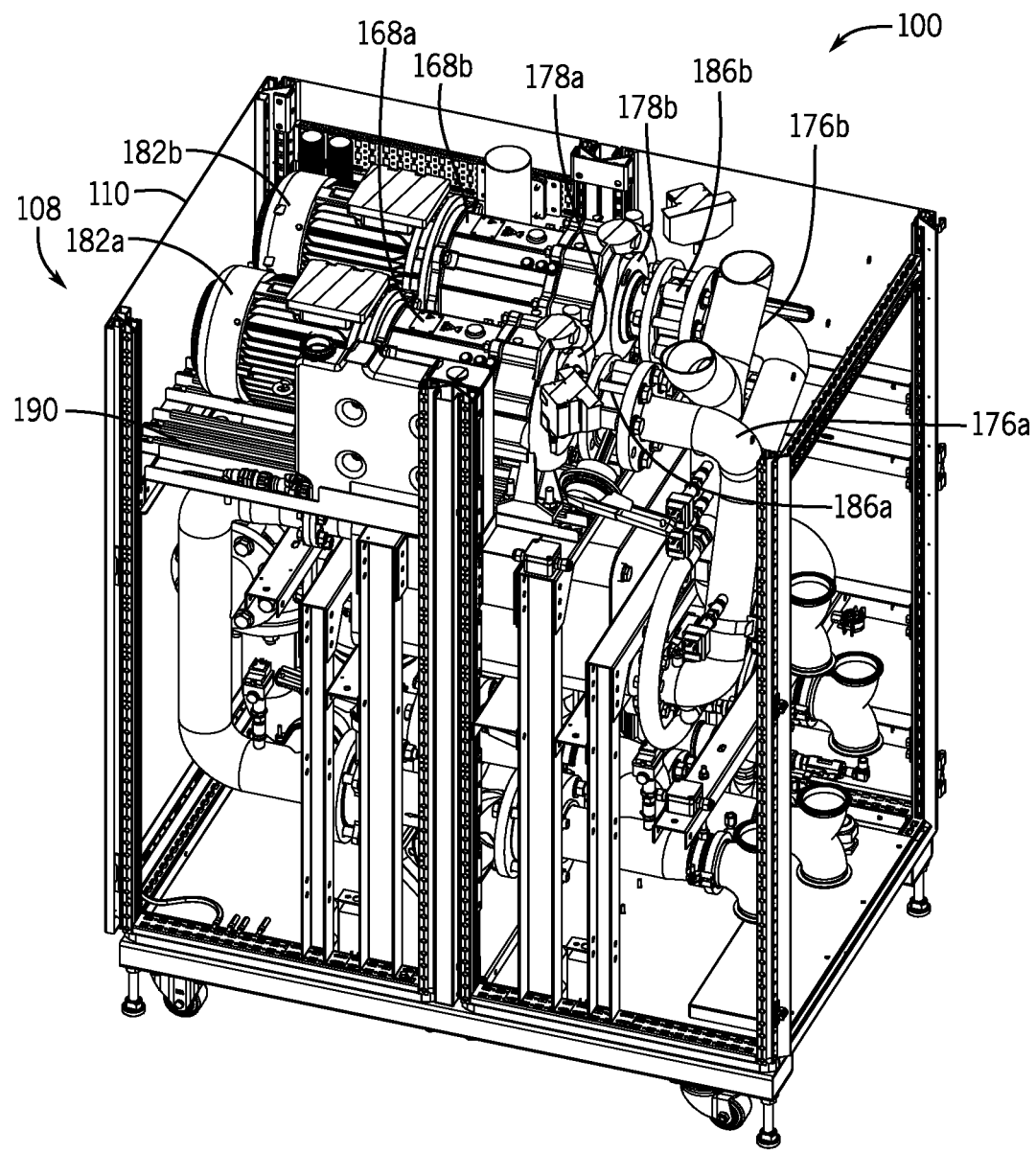
FIG. 7 is a cross-sectional isometric view of the CDU of FIG. 1 taken along line 7-7 of FIG. 6.
Figure 8:
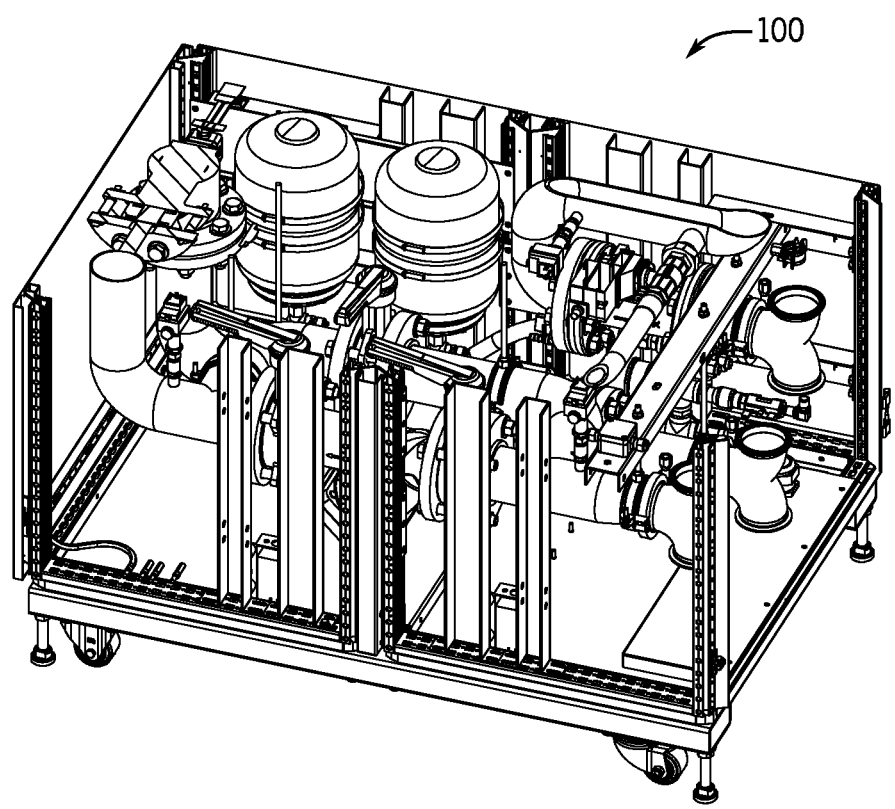
FIG. 8 is a cross-sectional isometric view of the CDU of FIG. 1 taken along line 8-8 of FIG. 6.
Figure 9:
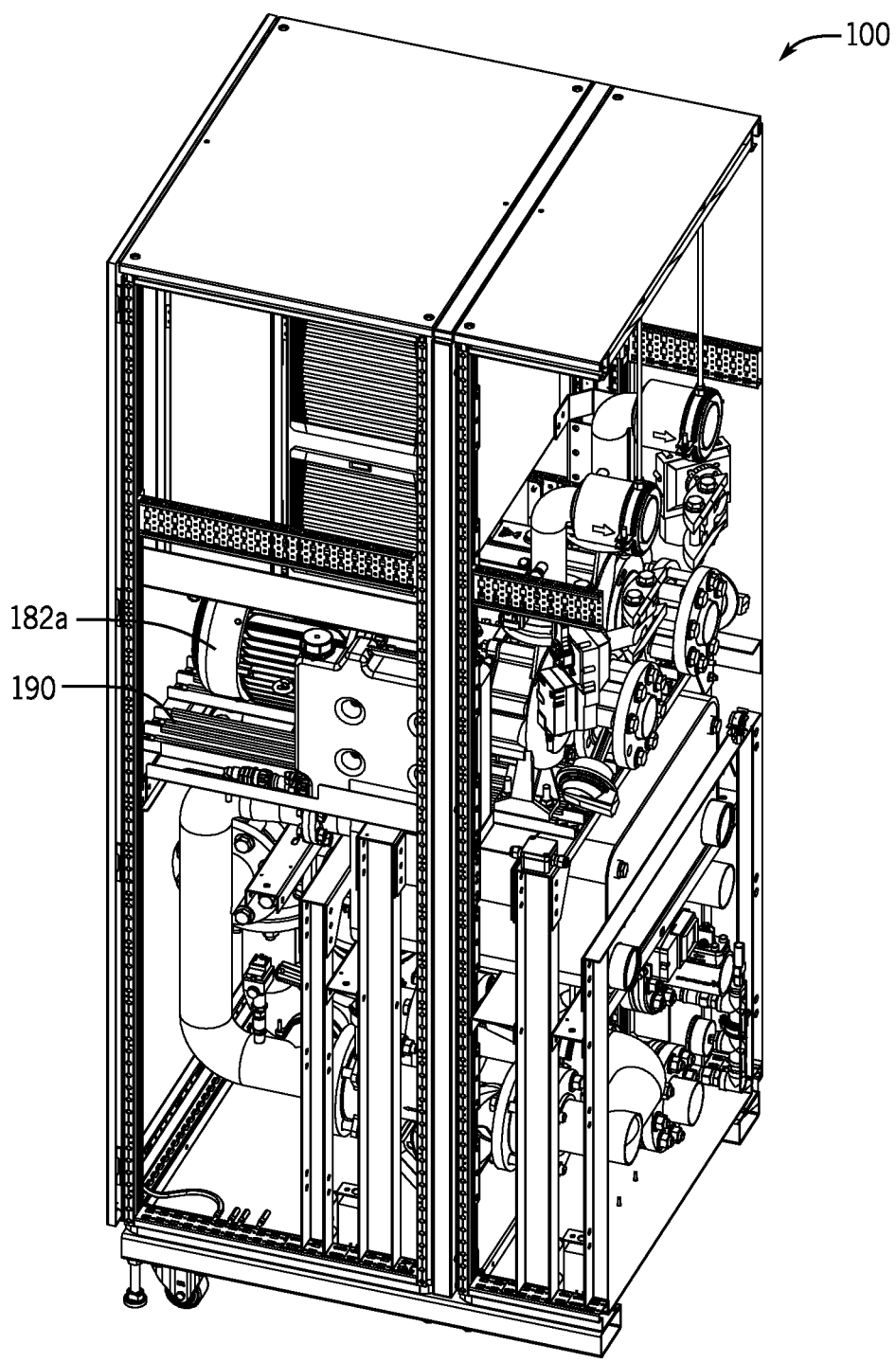
FIG. 9 is a cross-sectional isometric view of the CDU of FIG. 1 taken along line 9-9 of FIG. 6.
Figure 10:
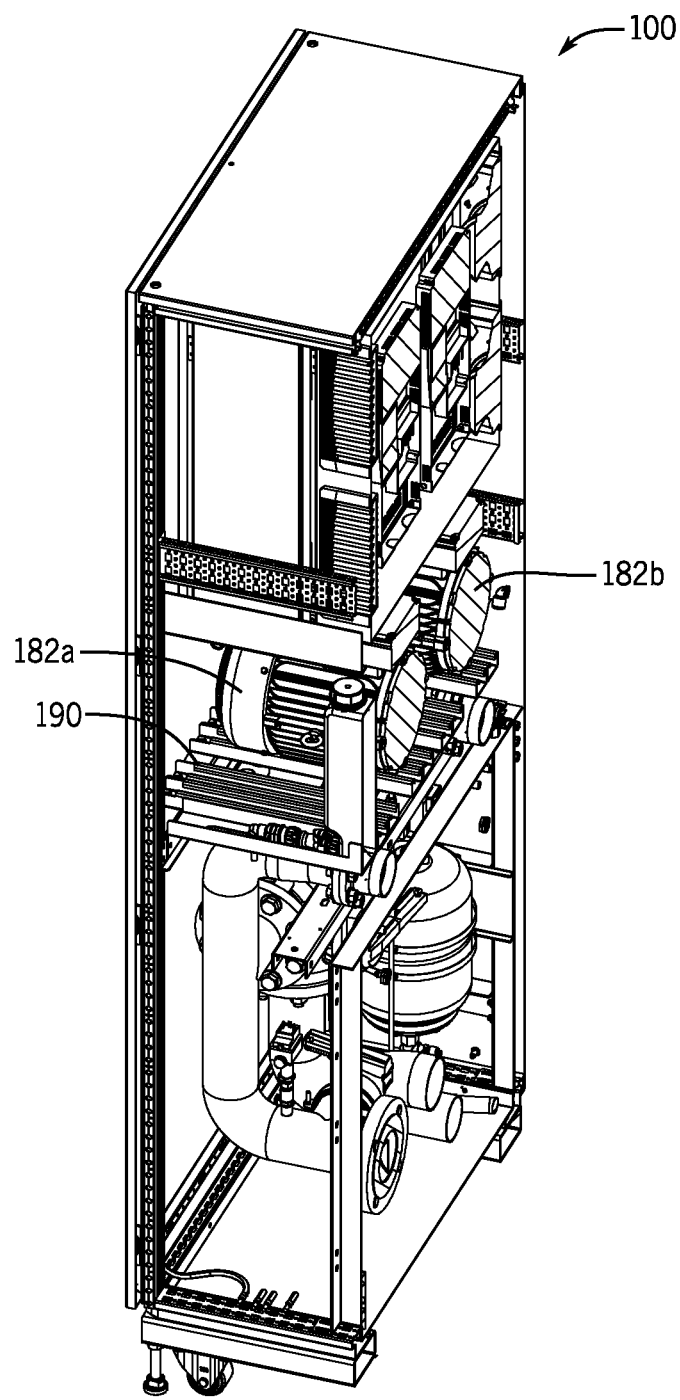
FIG. 10 is a cross-sectional isometric view of the CDU of FIG. 1 taken along line 10-10 of FIG. 6.

Upon exiting the HX 142, fluid can proceed along the secondary loop piping 130 to pumping components 168 of the CDU 100. The pumping components 168 can induce flow of the fluid through the secondary loop. In some embodiments, the pumping elements can include parallel pumps 168a 168b (e.g., as shown in FIG. 7), which can provide greater pressure and increase flow capacity through the secondary loop. Providing multiple pumping components 168 can also increase a serviceability of the CDU 100, by allowing the CDU 100 to continue operation when a given pump is removed for servicing. In some embodiments, as further described below, the pumps 168a, 168b can be operated in a dual pump mode, whereby both pumps 168a, 168b operate simultaneously to pump fluid through the secondary loop. In some embodiments, the pumps 168a, 168b can operate in single pump mode, whereby only one of the pumps 168a, 168b is in operation at a time. The speed and mode of the pumps can be controlled automatically through a controller of the CDU 100 in response to system parameters, as described further below. In some embodiments, a CDU (e.g., CDU 100) can include only one pump. In some embodiments, a CDU can include more than two pumps.

Piping of the secondary loop can be sized and configured to provide flow to multiple pumps of a CDU, and to evenly distribute the flow to pumps of a CDU, which can minimize a pressure difference at the suction end of each pump. For example, as shown at least in FIGS. 17 and 19, a Y-pipe 170 can be provided in the secondary loop piping 130, and can fluidly connect the HX 142, and the pumps 168a, 168b. The Y-pipe 170 can be shaped as a "Y," and can define a single Y-pipe inlet 172 directly adjacent to the secondary outlet port 146. The Y-pipe 170 can define dual branches 174a, 174b downstream of the Y-pipe inlet 172, which can each correspond to a respective Y-pipe outlet 176a, 176b. As shown in FIG. 7, the Y-pipe outlets 176a, 176b can be in direct fluid communication with the suction ports 178a, 178b of the pumps 168a, 168b, with upstream shutoff valves 186a, 186b provided between respective Y-pipe outlets 176a, 176b and suction ports 178a, 178b.

Figure 19:
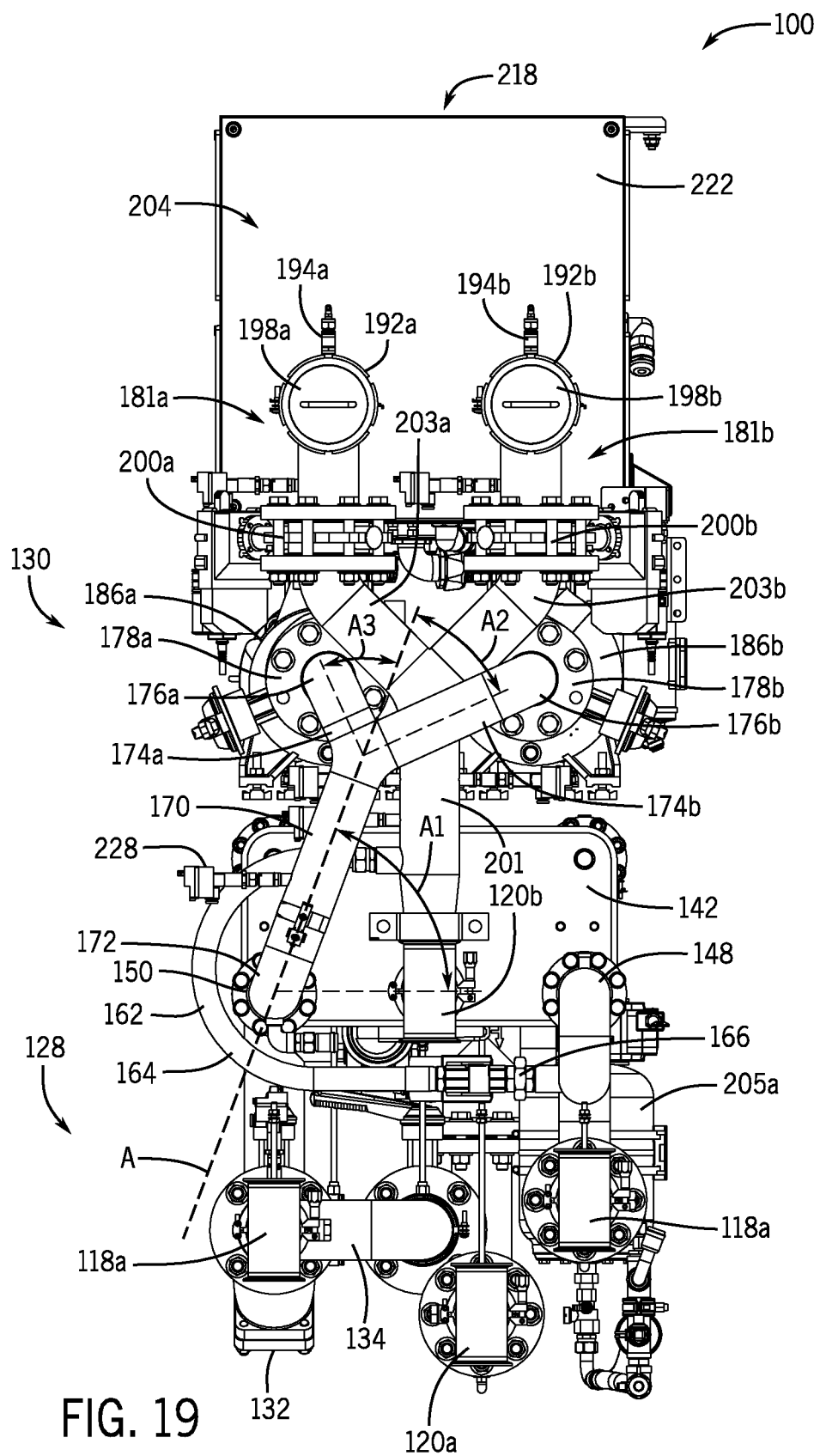
FIG. 19 is a rear view of the components of FIG. 13.

In some embodiments, a Y-pipe of a CDU can reduce the flow bend angle relative to standard "Y" (66 degree) and standard Tee (90 degree) fittings, as can reduce a pressure drop across the Y-pipe and evenly distribute flow to the pumps of the CDU. As shown in FIG. 19, the Y-pipe 170 can extend parallel to a Y-pipe reference line A, which is disposed at a first angle A1 relative to a horizontal reference plane H. In some embodiments, the first angle A1 can be about a 70 degree angle from the horizontal reference plane H, or between about 60 degrees and about 80 degrees, or between about 65 degrees and 75 degrees. The first branch 174a can be angularly offset from the Y-pipe reference line A, defining a first flow bend angle A2. The second branch 174b can also be angularly offset from the Y-pipe reference line A, defining a second flow bend angle A3. The flow bend angles A2, A3 can each be between about approximately 40-50 degrees, or approximately 45 degrees, was can advantageously reduce a pressure drop through the Y-pipe over conventional Y-pipes defining flow bend angles of about 66 degrees, or over standard tee fittings, which define flow angles of about 90 degrees. In other embodiments, the relative angles of a Y-pipe can be different to accommodate pumps disposed in different locations within a CDU. In some embodiments, piping between a HX and pumps of a CDU can define more than two outlets to fluidly connect more than two pumps to the HX.

Pumps of a CDU can be positioned in a parallel configuration within the CDU, with the suction ports of each pump being disposed on the same horizontal plane as the suction port of the other parallel pump or pumps. As shown, for example, in FIGS. 16 and 21, fluid of the primary loops can enter the pumps 168a, 168b through the suction ports 178a, 178b at a horizontal orientation, and can exit the pumps 168a, 168b, through discharge ports 180a, 180b at a vertical orientation. The pumps 168a, 168b can be variable speed pumps, and the speed of the pumps 168a, 168b can be controlled through variable frequency drives (VFDs), which can in turn be controlled through a controller of the CDU 100. The speed of the pumps 168a, 168b can thus be controlled to achieve desired parameters for flow, pressure, and temperature of the fluid through the primary loop.

CDUs can be designed to continue operation even when a component of the CDU fails or requires service. Pumping systems of a CDU can thus be redundant, and redundant flow paths can be provided to allow continued flow through the system when a single pump fails. Further, elements of the CDU can facilitate servicing of components so that an operator can replace or service components with minimal tooling requirements. For example, in the illustrated embodiment of FIGS. 16-23 the pumps 168 at least partially define redundant flow paths 181a, 181b for fluid of the primary loop, and can be operated in single pump mode, wherein a primary pump 168 is in operation at a given time, and the CDU 100 fails over to the other pump 168 in case of a failure of the primary pump 168. Alternatively, the CDU 100 can be operated in dual pump mode, with both pumps 168a, 168b in operation simultaneously, thus providing increased flow and pressure for fluid flow through the primary loop. In some embodiments, when the CDU 100 is operating in dual pump mode, the pumps 168a, 168b can provide 3.2 bar pressure at an 850 liter per minute flow. In some embodiments, when one of the pumps 168a, 168b is in operation, a pressure drop across the CDU 100 can be 2.7 bar pressure, and a flow rate through the CDU 100 can be about 850 liters per minute.

The pumps 168 can be magnetically coupled pumps and can thus each comprise a motor 182 and an impeller assembly 184. The motor 182 of each pump 168 can be disposed in the front portion 108 of the CDU 100 and the impeller assembly 184 for each pump 168 can be disposed in the rear portion 114 of the CDU. The motor 182 and the impeller assembly 184 can be fluidly isolated from each other, with the motor 182 inducing rotational movement of the impeller assembly 184 magnetically. This arrangement can prevent leakage between components of the pump 168, and can further obviate the need for a seal between them. Additionally, magnetically coupled pumps 168 can enhance a serviceability of the CDU as the motor 182 and the impeller assembly 184 are fluidly isolated and are not mechanically coupled, and thus, the motor 182 can be removed for servicing without impacting the flow path of the fluid or producing leakage in the system.

Figure 21:
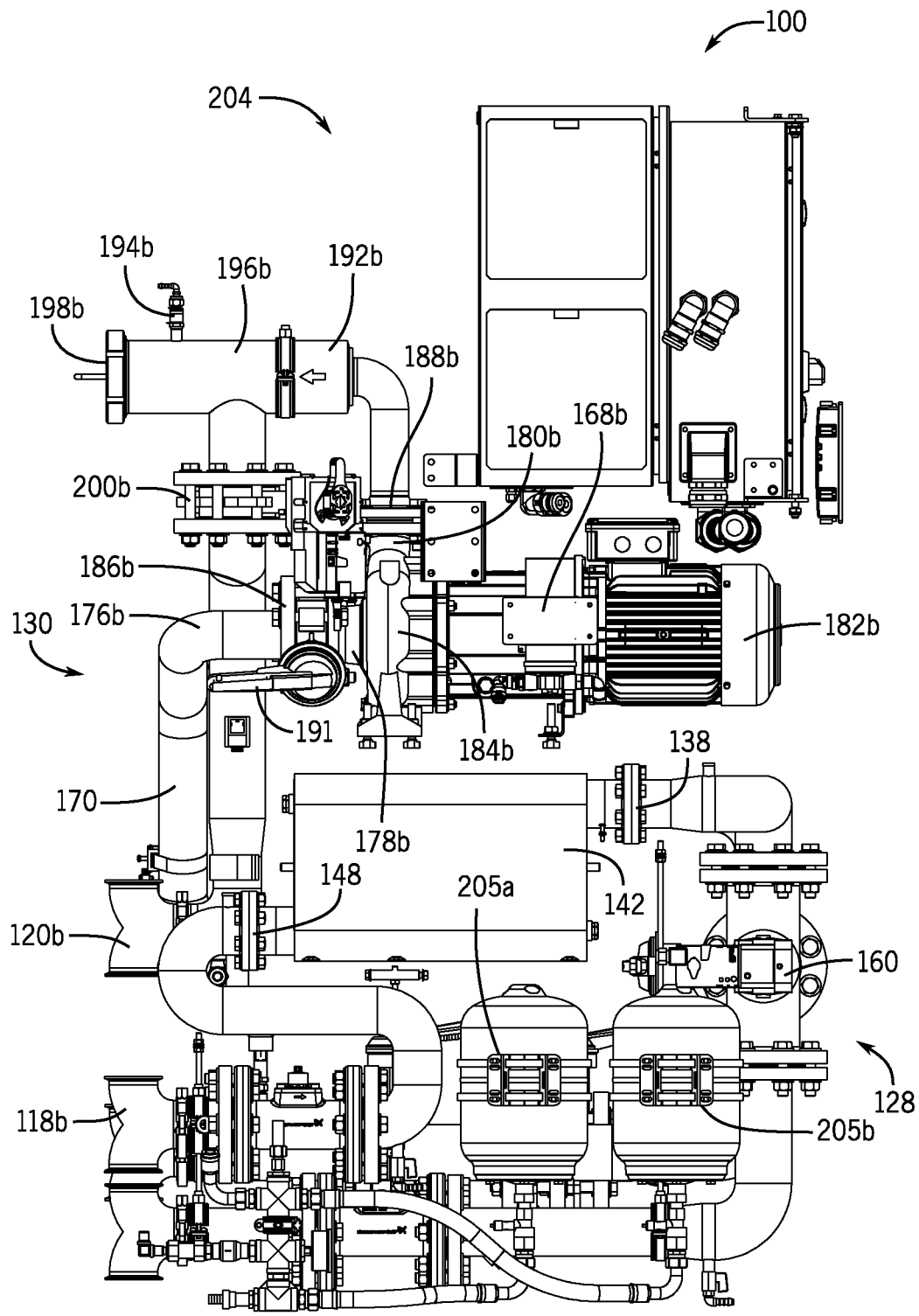
FIG. 21 is a left side view of the components of FIG. 13.

In some cases, including for example, when an impeller of a pump is damaged, an entire pump may require removal for servicing. Accordingly, to prevent downtime to the CDU, a pump requiring service can be fluidly isolated from the flow path of a secondary loop, and components can be provided in the CDU to increase an ease of removal and installation of a pump. In this regard, shutoff valves can be provided upstream and downstream of a pump for a CDU to fluidly isolate the pump. For example, FIGS. 16 and 21 illustrate upstream shutoff valves 186a, 186b immediately upstream of the pumps 168a, 168b, and downstream shutoff valves 188a, 188b immediately downstream of the pumps 168a, 168b. As shown, the upstream shutoff valves 186a, 186b can be positioned between the y pipe outlets 176a, 176b and the suction port 178a, 178b of respective pumps 168a, 168b. The illustrated upstream shutoff valves 186a, 186b can be manually operable, and can thus each include a handle 191 to allow an operator to switch the respective valve between an open and a closed configuration. In some embodiments, downstream shutoff valves 188a, 188b can also be manually operable and can include handles or knobs to control a state thereof. In some embodiments, valves upstream and downstream of pumps can be controlled automatically. Both upstream shutoff valves 186a, 186b and downstream shutoff valves 188a, 188b can be normally open, allowing flow through the respective pumps 168a, 168b.

To isolate pump 168a, then, an operator can engage the handles 191 to close the upstream shutoff valve 186a, thus blocking fluid from flowing into the suction port 178a. The operator can also engage the handle 191 of the downstream shutoff valve 188a to prevent backflow of fluid into the pump 168a during servicing of the pump 168a. When the upstream shutoff valve 186a is closed, all flow of fluid in the secondary loop must flow through the pump 168b. If the CDU 100 is operating in single pump mode with pump 168a as the primary pump, fluidly isolating pump 168a by closing the upstream shutoff valve 186a can cause the CDU 100 to fail over to pump 168b, and pump 168b can resume operation from pump 168a. Thus, the operation of the CDU 100 can proceed with minimal interruption and servicing a single pump 168a can be performed without causing downtime to the CDU 100, which could potentially cause downtime for downstream IT loads. If the CDU 100 is operating in dual pump mode, with both pumps 168a, 168b providing relatively equal pressure to the fluid in the secondary coolant loop, the removal of one pump 168a for service can reduce a cooling capacity of the system by reducing the pressure provided to impel fluid through the secondary loop, however, the CDU 100 can continue to operate without the need for downtime.

As illustrated in FIG. 7, the pumps 168a, 168b can be mounted on slide rails 190 of the CDU 100 to facilitate ease of installation and removal. The pumps 168a, 168b can be accessible from the front portion 108 of the CDU, and to remove a given pump 168, an operator can open the front door 110 and slide the given pump 168 along the slide rails 190 towards the front portion 108. A given pump 168 can similarly be installed by positioning the pump 168 on an end of the slide rails 190 proximate to the front door 110 and sliding the pump 168 along the slide rails 190 in a direction towards the rear door 115.

Referring now to FIG. 17, the redundant flow paths 181a, 181b can each include filtration systems 192a, 192b upstream of the pumps 168a, 168b respectively. Piping upstream of the pumps 168a, 168b can be vertically higher than the pumps, and air-bleed valves 194a, 194b can be located at the highest point of the respective redundant flow path 181a, 181b. The air-bleed valves 194a, 194b are shown as automatic air vents, although other configurations are possible. The filtration systems 192a, 192b can each include a respective filter housing 196a, 196b and a filter 198a, 198b. An egress valve 200a, 200b can be downstream of a corresponding one of the filtration systems 192a, 192b. In some embodiments, the egress valves 200a, 200b can be electro-mechanical valves, while the upstream shutoff valves 186a, 186b and the downstream shutoff valves 188a, 188b are manual. However, a suitable combination of manual and electro-mechanical valves can be used, including all manual or all electro-mechanical.

In operation, generally, liquid will flow through both of the redundant flow paths 181a, 181b simultaneously. The redundant flow paths 181a, 181b are configured to allow personnel to close-off liquid passage through either of the redundant flow paths 181a, 181b to service the respective filters 198a, 198b, while allowing the cooling liquid to continue flowing, uninterrupted, through the other one of the first or second redundant flow paths 181a, 181b and the rest of the secondary coolant circuit. In some embodiments, as when a filter must be removed from the system for servicing, one of the redundant flow paths 181a, 181b can be fluidly isolated from the secondary coolant circuit, allowing all fluid flow of the secondary circuit to flow through the other of the redundant flow paths 181a, 181b. For example, to isolate filtration system 192a for servicing of filter 198a, the downstream shutoff valve 188a can be closed to prevent fluid flow into flow path 181a from pump 168a. The egress valve 200a can also be closed during servicing. When servicing, the filter 198a can be removed from the filter housing 196a and can be cleaned, repaired, or replaced. The filter 198a can then be reinserted into the filter housing 196a, and the downstream shutoff valve 188a and egress valve 200a can be opened to allow flow through redundant flow path 181a. While the process of isolating a filter to allow for servicing of the filter has been discussed with respect to redundant flow path 181a, the same teaching is equally applicable to redundant flow path 181b and the elements thereof. Further, isolation of one of the redundant flow paths can additionally or alternatively require that an upstream shut-off valve 186a, 186b be closed.

In some embodiments, as shown in FIG. 17, filters 198a, 198b are canister-type filters. As shown, fluid can flow into the canister-type filters 198a, 198b at a horizontal orientation, and exit in a vertical orientation (e.g., downwardly). Thus, canister-type filters can provide more empty space 204 in a top of the CDU 100 over filters that are configured for axial flow into and out of the filters, which can require piping of the respective redundant flow path 181a, 181b to be positioned higher than the filters so that fluid can flow downwardly through the filters. This additional space that can be available in the top of the CDU 100 when the filters 198a, 198b are canister filters can facilitate servicing of components in the CDU, or can alternatively accommodate additional components (e.g., expansion tanks). Relocating components of the CDU 100 into the empty space 204 in the top of the CDU 100 can allow piping to be arranged to reduce the number of hard bends (e.g., the primary loop piping 128 can be rearranged to replace the compound bend 147 with a single hard bend), thus reducing a pressure drop across components of the CDU. Use of canister-type filters make more space available in the back top portion of the CDU for potential component realignment to support better service and performance. For example, expansion tanks of a CDU (e.g., expansion tanks 205a, 205b shown in FIG. 22) can be relocated into the space, as could allow the primary HX outlet piping to the three-way valve to only contain a single 90 degree bend instead of the illustrated compound bend.

Figure 18:
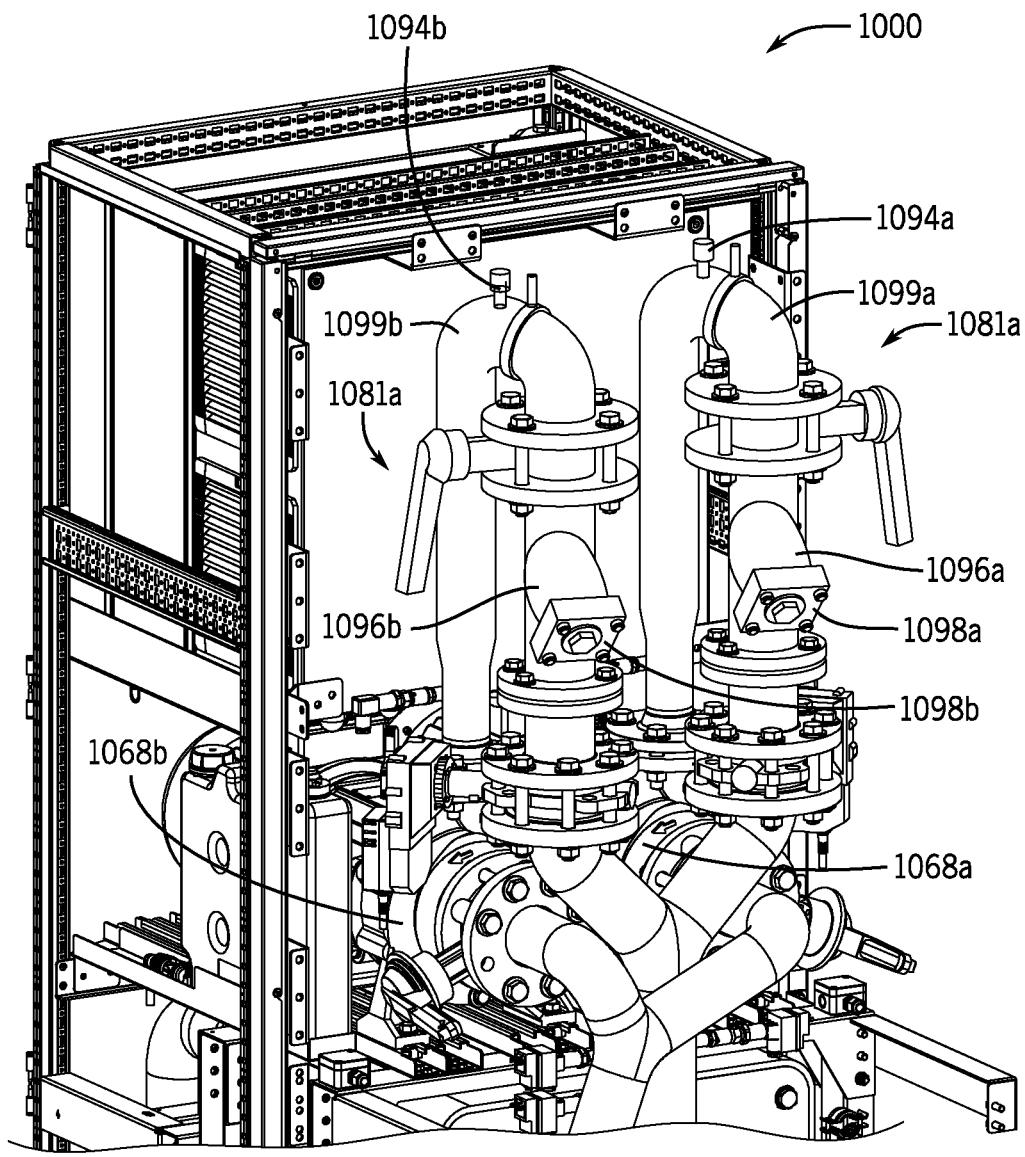
FIG. 18 is an isometric view of components of FIG. 17 including strainers according to another embodiment of the invention.

A CDU according to other embodiments of the invention can include filters of other types along redundant flow paths of a secondary cooling circuit. For example, FIG. 18 illustrates a CDU 1000 which is generally similar to CDU 100, and also includes redundant flow paths 1081a, 1081b along a secondary cooling loop. The redundant flow paths 1081a, 1081b can include filtration systems 1092a, 1092b which can include filter housings 1096a, 1096b and filters 1098a, 1098b received into the respective filter housings 1096a, 1096b. As shown, the filters 1098a, 1098b can be Y strainers. In some embodiments, Y strainers impose certain orientation requirements for proper function of the strainer. In one embodiment, to fit Y strainers 1098a, 1098b in the CDU 1000, the piping from the pumps 1068a, 1068b to the Y strainers 1098a, 1098b must make a 180 degree bend 1099a, 1099b so that excess pipe is required as compared to other configurations, including as shown in FIG. 17. Consequently, as illustrated in FIG. 18, less space is available in the top of CDU 1000 as compared with CDU 100 (e.g., as shown in FIG. 17). Further, Y strainers also typically have higher pressure drop than larger filters (e.g., canister filters 198a, 198b) due to the smaller, more compact nature of Y strainers. As further illustrated in FIG. 18, air-bleed valves 1094a, 1094b can be located at the highest point of each of the respective redundant flow paths 1081a, 1081b In some embodiments, canister-type filters can help to address one or more performance impacts of the Y strainer design. For example, an overall filter media surface of canister filters can be larger than the that of Y strainers used in similar capacities, resulting in a lower pressure drop across canister-type filters relative to Y strainers. Further, canister filters can be more easily accessible than Y strainers, and can provide for toolless removal and reinsertion of the filters. In some embodiments, it can be desirable to minimize fluid loss from a secondary coolant circuit when filters are removed for servicing. The canister filters 198a, 198b can provide for less loss of coolant from the secondary coolant circuit during servicing than the Y strainers 1098a, 1098b, as liquid of the secondary coolant loop be trapped above the entry of the Y strainers 1098a, 1098b and beneath the downstream shutoff valves 188a, 188b. In some embodiments, more air can be readily removed from the canister-type filters 198a, 198b when filling/refilling the filter canisters, which can result in less air being circulated into the secondary supply liquid stream.

In some embodiments, the use of canister-type filters 198a, 198b can eliminate the need for 180-degree bends in the piping of the secondary coolant circuit (e.g., 180 degree bend 1099a, 1099b), the canister-type filters 198a, 198b each acting as a large hard bend with lower liquid velocity and thus lower pressure drop over the combination of the 180 degree bends 1099a, 1099b and Y strainers 1098a, 1098b of the CDU 1000. Correspondingly, a pipe connection between the discharge ports 180a, 180b and inlets of the canister-type filters 198a, 198b can have a larger radius bend than the previous piping, which can further reduce the risk of dead-heading of fluid between the pumps 168a, 168b and the filters 198a, 198b.

In some embodiments, secondary loop piping can include a piping element to combine flow from redundant flow paths. Thus, coolant of redundant secondary coolant loop can converge, and can exit a CDU from a single outlet. According to some embodiments, as shown at least in FIG. 19, a convergence pipe 201 can fluidly connect each of the redundant flow paths 181a, 181b with the secondary outlet 120b. The convergence pipe 201 can be generally Y-shaped, with respective inlet branches 203a, 203b being immediately downstream of and fluidly connected with a respective one of the egress valves 200a, 200b. In other embodiments, inlet branches of a convergence pipes can be immediately downstream of filters of redundant flow paths. The convergence pipe, as shown, can be vertically oriented so that the inlet branches are positioned vertically higher than the secondary outlet 120b. In this configuration, flow of fluid from the redundant flow paths 181a, 181b to the secondary outlet 120b can be at least partially induced by gravity. In other embodiments, a secondary outlet can be positioned in other locations relative to redundant flow paths of a CDU, including vertically parallel with or vertically above the redundant flow paths, and a convergence pipe can be sized and configures to combine flow from the redundant flow paths and fluidly connect the redundant flow paths with the secondary outlet in these alternative configurations.

CDUs can include systems and components for protecting piping and other elements of the CDU from pressure resulting from expansion of fluid in a secondary loop of the CDU. For example, when a temperature of the fluid in the secondary loop increases, fluid of the secondary loop can expand, and the resulting pressure can damage system components of the CDU and of downstream IT equipment. Expansion tanks can thus be provided for a CDU along the secondary coolant loop to receive fluid when pressure of the CDU exceeds a set level, and thereby maintain the pressure within the secondary loop. For example, FIG. 22 illustrates expansion tanks 205a, 205b located in a bottom portion 202 of the CDU 100. In the illustrated embodiment, the CDU includes two expansion tanks 205a, 205b. This arrangement can provide redundancy for the CDU 100, allowing the CDU 100 to continue operation when one of the expansion tanks 205a, 205b is removed from servicing, or is otherwise inoperable. In other embodiments, however, a CDU can include only one expansion tank, or more than two expansion tanks.

Figure 32:
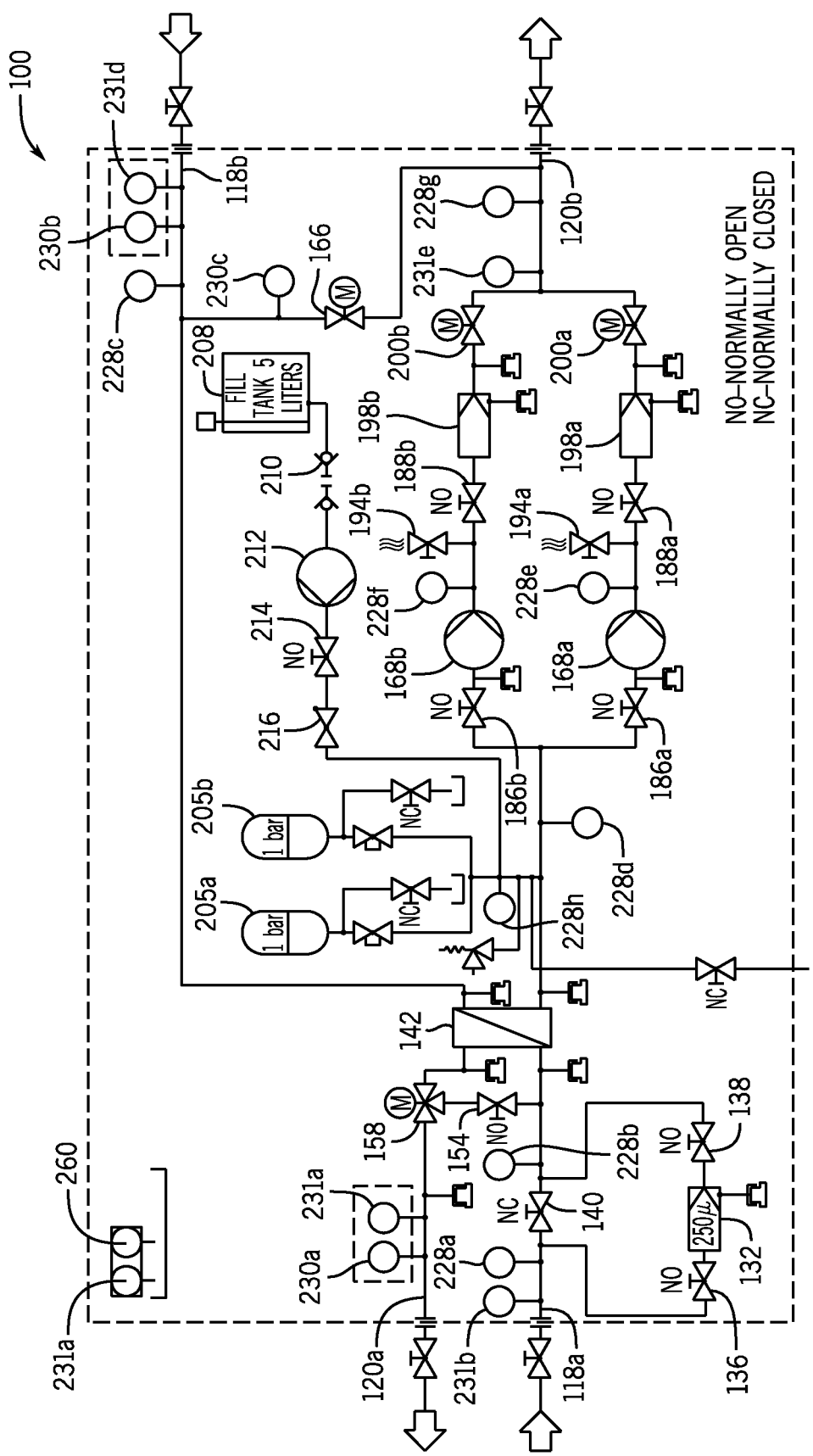
FIG. 32 is plumbing schematic for a CDU according to an embodiment of the invention.

Expansion tanks of a secondary coolant loop can be fluidly positioned along the loop to provide the greatest protection to components of the CDU along the secondary coolant loop. For example, as shown in FIG. 32, the expansion tanks 205a, 205b can be fluidly integrated into the secondary coolant loop downstream of the HX 142 and upstream of the pumps 168a, 168b. In this configuration, coolant of the secondary loop can first be cooled by the HX 142, which can reduce an expansion of the fluid. In normal operation of the CDU 100, then, the cooled liquid exiting the HX 142 can be sufficiently dense that no fluid expands into the expansion tanks 205a, 205b, thus reducing a wear on the expansion tanks compared to a configuration where expansion tanks are fluidly upstream of a heat exchanger. Being positioned upstream of the pumps 168a, 168b, the expansion tanks can protect components of the pumps from damage that may otherwise be caused to the pumps by expansion in the fluid of the secondary coolant loop.

In some embodiments, as further illustrated in FIG. 22, expansion tanks located in a bottom of the CDU 100 can be proximate to primary loop piping 128. This arrangement can be beneficial where space is required in a top portion of a CDU, as, for example, where Y strainers 1098a, 1098b are used along a secondary coolant loop, as shown in FIG. 18. As illustrated in FIG. 22, placing expansion tanks 205a, 205b in the bottom portion 202 of the CDU 100 can impose spacing constraints and can require that primary loop piping 128 exiting the HX 142 through the primary outlet port 146 include the compound bend 147 (e.g., two bends in the piping) between the HX 142 and the three-way valve 158. Placing the expansion tanks 205a, 205b in the bottom portion 202 can thus introduce a greater pressure drop in the primary loop piping 128 over configurations in which only a single 90 degree bend is required in the primary loop piping 128 between the HX 142 and the three-way valve 158 (e.g., the piping configuration when expansion tanks 205a, 205b are not placed in the bottom portion 202). In some embodiments, including where canister filters 198a, 198b are installed along the secondary loop piping 130 (e.g., as shown in FIG. 21), the CDU 100 can include empty space 204 in the top portion of the CDU 100. Thus, when canister-type filters are used along a secondary coolant loop, expansion tanks can be installed in a top portion of the CDU 100 (e.g., within the empty space 204), which can advantageously reduce a pressure drop along the primary loop piping 128.

Piping elements can be provided for a CDU in a data center to efficiently transfer heat from coolant of a secondary loop to coolant of a primary loop. For example, piping within a CDU can be arranged to minimize a pressure drop in the system, which can impede fluid flow and increase a power required to pump fluid through the CDU. Hard bends in piping and tubing of a CDU create fluid vortexes and other flow characteristics that create high pressure spots. These high pressure spots can cause decreases in overall fluid flow through the piping network. Consequently, having many hard bends or joins in sequence can limit the overall fluid flow potential in piping of a primary and secondary loop of a CDU. The flow on the primary piping throughout the CDU is driven by facility side and/or external pumps, so minimizing these bends in the main primary piping network reduces the pressure drop or pressure loss of the CDU that the facility pumps have to provide. Correspondingly, for piping of the secondary circuit, reducing the overall pressure drop by minimizing the hard bends decreases the power consumption required for pumps of the CDU to pump fluid through other components of the CDU (e.g., heat exchangers, flow meters, and filters or strainers). Because pumps provide liquid flow up to a given maximum pressure at a rated speed, configuring the piping layout to minimize the pressure loss in the secondary circuit ensures more pressure is available for a downstream IT load.

In this regard, an arrangement of piping elements of primary and secondary loop piping 128, 130 (e.g., the piping arrangements described above) can minimize a pressure drop through the CDU 100 by minimizing hard bends in the piping 128, 130. Further, elements can be arranged within the rack 102 to facilitate ease of maintenance and also provide redundant flow paths in the case of maintenance or failure of a given component. FIGS. 4-11 illustrate various components of the piping housed within the rack 102. FIGS. 13 and 16-23 illustrate the piping of the CDU with the rack 102 removed for ease of discussion and visualization of the components of the piping.

The bend radius of any and all bends in both the primary and secondary loops can be maximized to optimize flow and reduce pressure drop through the CDU. Piping of the CDU 100 can include 3" or DN75 piping components to cost-optimize the piping design within the CDU 100. In some cases, not all hard tee joins and hard bends can be avoided in the plumbing (e.g., due to the footprint space constraints), but, in the illustrated embodiment, components including these joins and bends are arranged to make the primary fluid path in each loop as straight and sweeping as possible.

In some embodiments, a secondary coolant loop of a CDU can be a closed-circuit loop, and loss of fluid in the secondary coolant loop can negatively impact cooling efficiency and pressure within the secondary coolant loop. For example, when components are removed for servicing (e.g., filters 198a, 198b) there can be a measure of fluid loss in the secondary circuit, and the secondary coolant circuit may require an additional charge or refill of coolant. In this regard, then, as illustrated in FIG. 11, a fill kit assembly 206 can be provided within the rack 102. The fill kit assembly 206 can include a fill tank 208 as shown in FIG. 32 (e.g., a reservoir) containing coolant which can be injected into the secondary coolant circuit. In some embodiments, the fill tank 208 can have a volume of five liters. In other embodiments, a fill tank of a fill kit assembly can have any volume that can be contained within a rack of a CDU, and can be more than five liters or less than five liters. The fill kit assembly 206 can include quick connect fittings 210 through which the fill tank 208 can be fluidly connected to the secondary coolant loop. When the fill tank 208 is in fluid communication with the secondary coolant circuit (e.g., when the quick connect fittings 210 are engaged), fluid within the fill tank 208 can flow into the secondary coolant loop to replace fluid lost in the secondary coolant loop.

A fill kit assembly can require pressure for injecting fluid from a fill tank into the secondary coolant circuit, at least because of a pressure in the secondary coolant circuit, which can otherwise produce flow fluidly into a fill kit assembly. Thus, as further shown schematically in FIG. 32, a fill kit pump 212 can be provided downstream of the fill tank 208 and upstream of the secondary coolant loop. The fill kit pump 212 can induce pressure and flow of fluid within the fill tank 208 into the secondary coolant loop, and can overcome a pressure of the fluid within the secondary coolant loop to inject the fluid from the fill tank 208 into the secondary coolant loop. In some embodiments, valves 214, 216 can be provided between the fill kit pump 212 and the secondary coolant loop. The valves 214, 216 can be check valves which can permit fluid flow only in the direction toward the secondary coolant loop. In other embodiments, the valves 214, 216 can be manual or electro-mechanical valves which may be opened and closed as desired. In some embodiments, the valves 214, 216 can be a combination of check valves and valves of other types.

In some embodiments, a CDU can include computing elements, controllers, and other electronic components to monitor, control, or otherwise facilitate operation of the CDU. For example, a CDU can include variable frequency drives for controlling speeds of pumps within the CDU. A CDU can also include networking components to allow for remote control or monitoring of operating parameters of the CDU. Electronic components of a CDU can be positioned away from, and generally above piping elements to protect the electrical components from fluid leakage of the system, or potential condensation along piping of the CDU. Some embodiments can include improved arrangements of electrical controls, including as may optimize utilization of space. In some embodiments, multiple cabinets can be provided to separately house different set of electronics, including the controller, power circuits, and motor drives. In some embodiments, to provide optimum spacing and improved serviceability, two electrical cabinets can be positioned front-to-back in the CDU, allowing all of the electrical components and controller components to be serviced from the front of the CDU. For example, electrical switches and controller components can be located primarily (e.g., only) in the front most electrical cabinet, so that the entire cabinet can swing out, giving access to the second electrical cabinet which houses the motor drives.

Figure 14:
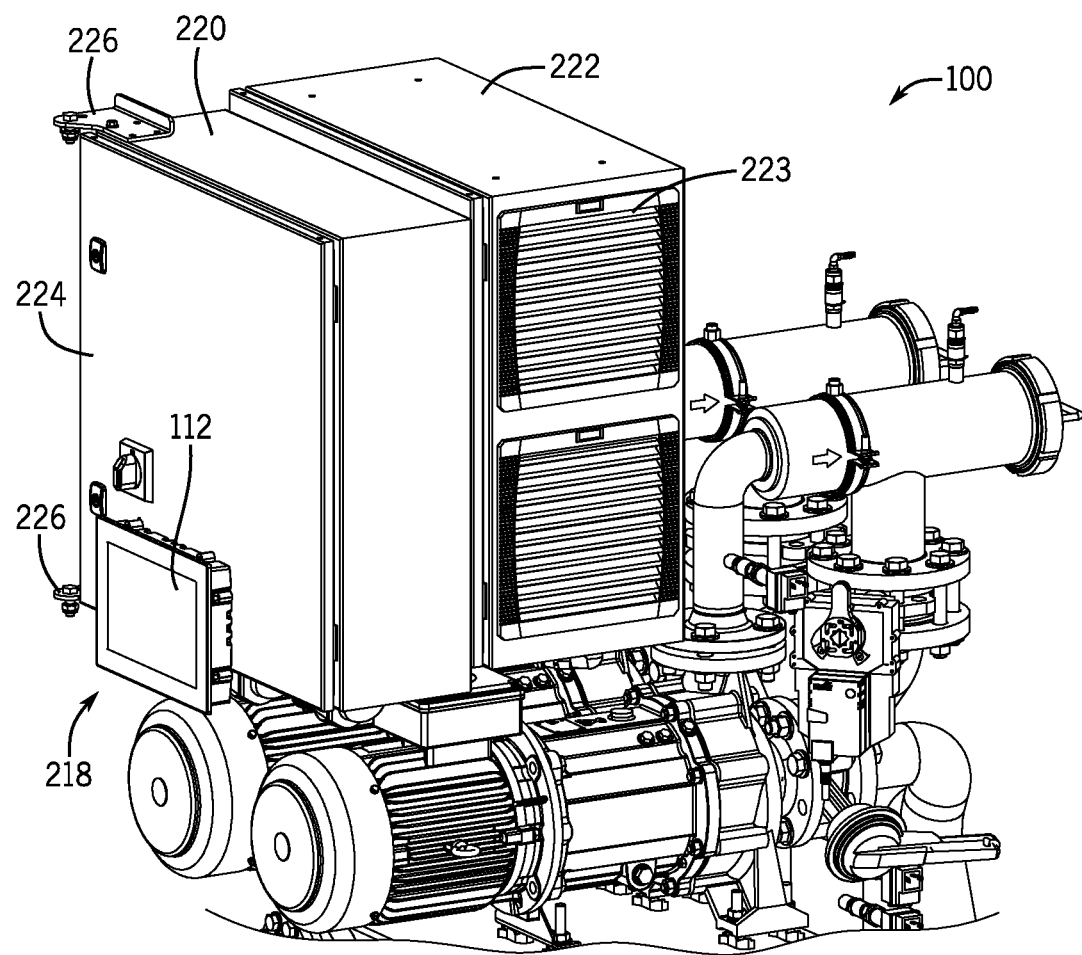
FIG. 14 is an isometric view of the components of FIG. 13 including electrical enclosures.

For example, as shown in FIG. 14, an electronic enclosure assembly 218 can be provided in the top portion of the CDU 100. The electronic enclosure assembly 218 can also be positioned in the front portion, and can thus be accessible from the front of the rack 102 (e.g., when the front door 110 is opened to allow access). As shown, the electronic enclosure assembly 218 can include a front cabinet 220 and a rear cabinet 222. The front cabinet 220 can be located closer to the front door 110 than the rear cabinet 222, and can be positioned between the front door 110 and the rear cabinet 222. In some embodiments, electrical switches, controller components, networking components, and other low-power electronic components can be housed in a compartment (e.g., a cavity) of the front cabinet 220, and higher-power components, as the variable frequency drives for the pump motors 182 can be housed in a compartment of the rear cabinet 222. This arrangement can be particularly advantageous as the low power and high power electric components can generate different levels of heat in operation, and can further have varying levels of resistance to dust and other particulate matter. For example, the low power electric components housed in the front cabinet 220 can generate less heat than the high power electrical components in the rear cabinet 222. The front cabinet can thus require less ventilation, and accordingly, as illustrated, vents 223 can be provided in the rear cabinet 222 but not in the front cabinet 220. In some embodiments, the front cabinet 220 can include vents with relatively smaller openings than the vents 223 of the rear cabinet. In some embodiments, the low power electrical components in the front cabinet can be protected from entry of dust by the lack of vents or by vents with relatively small openings. Thus, the build-up of dust and particulate in the front cabinet 220 can be significantly reduced, which can lead to lower chance of electronics failure and potential shorts due to particulate contamination.

In some embodiments, one electrical cabinet (e.g., the front cabinet 220) can be designed so that the cabinet can be opened and can swing out during operation of the CDU 100. For example, with switches and controllers arranged as noted above, a variable frequency drive in the rear cabinet 222 could be replaced while the CDU 100 is in operation by opening a motor drive electrical disconnect in the front cabinet 220, opening said cabinet 220, and safely replacing or servicing the motor drive in the rear cabinet 222. The front cabinet 220 can include a front panel 224 which can be opened to provide access to the electrical components of the front cabinet 220. Access to the electric component in the rear cabinet 222 can be provided by swinging out the front cabinet 220, which can rotate along an axis between hinges 226. The hinges 226 can define a rotational axis for rotation of the front cabinet 220 that is parallel to a rotation axis for the front door 110. Thus, this configuration can eliminate the need for a front panel on the rear cabinet 222. In some embodiments, the front cabinet can be swung out up to an angle of about 100 degrees relative to the closed position of the front cabinet 220. In some embodiments, the front door 110 of the CDU 100 opens to the right, and the front cabinet 220 swings to the left to open, which can provide a maximal amount of service clearance when accessing the rear cabinet 222. Thus, according to some embodiments, an electronics enclosure assembly, as described, can beneficially locate most (e.g., all) low-power consuming electrical components of a CDU in one cabinet with relatively limited ventilation, and can locate most (e.g., all) of the higher power consuming components of the CDU in another cabinet that provides higher levels of ventilation.

In some embodiments, sensors can be provided for a CDU along both a primary and a secondary coolant loop to monitor operating parameters of the coolant within the respective loops. Sensors of a CDU can measure temperature, pressure, flow rate, or any other measurable parameters of fluid within a CDU. For example, FIG. 19 illustrates a pressure sensor 228 provided along the Y pipe 170 to measure pressure along the secondary coolant circuit. Correspondingly, flow sensors 230 can be provided at each of the primary and secondary inlet and outlet 118, 120 to measure flow into and out of the CDU 100 through the respective inlet or outlet. Sensors can be positioned at any location along a primary or secondary coolant loop to provide an operator of the CDU relevant information about the operation of the CDU and the CDU components. For example, temperature sensors 231 can be provided at the inlet ports 144, 148 and the outlet ports 146, 150 of the HX 142, and a large difference between temperature at the inlet and outlet for a given loop can indicate a high heat transfer efficiency, while a smaller temperature difference can indicate inefficiency of the HX 142. In another example, pressure sensors can be provided upstream and downstream of filters of the CDU 100 (e.g., the primary loop strainer 132, or the filters 198). A large pressure drop across a given filter can indicate buildup of particulate matter within the filter, which can indicate a need to service the filter.

Referring now to FIG. 32, sensors (e.g., temperature sensors, flow sensors, pressure sensors, and humidity sensors) can be provided at points along the CDU 100, including along the primary coolant loop and the secondary coolant loop. In some embodiments, sensors can also be provided for the CDU to sense ambient parameters of an environment of the CDU 100. Data from sensors of the CDU 100 can be used as inputs into control processes for controlling a temperature, pressure, flow rate, etc. for coolant in either or both of the primary or secondary coolant loops (e.g., as described with respect to FIGS. 36 and 40-44).

For example, in the illustrated embodiment, the CDU 100 includes an ambient humidity sensor 260 which can sense an ambient humidity, and an ambient temperature sensor 231*a* which can sense an ambient temperature of the environment of the CDU 100. One or both of an ambient temperature value obtained from the ambient temperature sensor 231*a* and an ambient humidity value obtained from the ambient humidity sensor 260 can be used to calculate a dew point for the CDU 100, and components of the CDU 100 (e.g., the three-way valve 158 and pumps 168*a*, 168*b*) can be controlled based on the dew point to prevent condensation on piping of the CDU 100 and downstream IT components (e.g., as discussed with respect to block 3606 shown in FIG. 36). In some embodiments, a CDU can include additional sensors to sense additional ambient parameters of an environment. For example, a CDU can include an ambient pressure sensor, and components of a CDU can be controlled based on a differential pressure between the ambient pressure and pressure along one or both of the primary and secondary coolant loops. In some embodiments, ambient parameters of an environment (e.g., parameters obtained from sensors 231*a*, 260) can be provided to an operator of the CDU (e.g., through a UI, API, CLI, etc.). In some embodiments, the ambient parameters of the environment are not used to control components of the CDU.

In some embodiments, components of a CDU can be controlled to achieve a setpoint temperature at a point along the respective loop (e.g., as described below with respect to FIGS. 39 and 42). In some embodiments, components of a CDU can be controlled to achieve a temperature differential between temperatures at different points along one or both of the primary coolant loop and the secondary coolant loop. Additionally or alternatively, temperature values obtained from temperature sensors along one or both of the primary and secondary coolant loops can be provided to an operator of the CDU through an interface (e.g., as shown in the example GUI 4900 shown in FIG. 49). As further illustrated in FIG. 32, a temperature sensor 231*b* can be positioned at the primary inlet 118*a* and a temperature sensor 231*c* can be positioned at the primary outlet 120*a*. A difference between a temperature value obtained at temperature sensor 231*b* and a temperature value obtained at temperature sensor 231*c* can be used, for example, to calculate a total heat rejected from the coolant of the secondary coolant loop to the primary coolant loop. Additionally, or alternatively, a temperature sensor 231*d* can be positioned at the secondary inlet 118*b* and a temperature sensor 231*e* can be positioned at the secondary outlet 120*b*. In some embodiments, components of the CDU 100 (e.g., three-way valve 158 and pumps 168*a*, 168*b*) can be controlled to achieve a certain setpoint for a secondary inlet temperature value obtained from temperature sensor 231*d*, a secondary outlet temperature value obtained from temperature sensor 231*e*, or a differential temperature between the temperature values obtained from temperature sensors 231*d* and 231*e* (e.g., as described with respect to FIGS. 40 and 44).

In some embodiments, systems and processes of the CDU 100 can control operation of components of the CDU 100, based on a calculated dewpoint to ensure that a temperature value obtained from either or both of the temperature sensors 231*d*, 231*e* is sufficiently high to prevent condensation on piping or components of the secondary coolant loop. In some embodiments, additional temperature sensors can be provided for a CDU, including for example, immediately upstream and downstream of a heat exchanger (e.g., at any of inlet ports 144, 148 and outlet ports 146, 150). In some embodiments, fewer temperature sensors can be provided along the primary and secondary coolant loops, and temperature sensors can be provided only at inlets 118*a*, 118*b*, only at outlets 120*a*, 120*b*, only along one of the primary and secondary coolant loops, etc. In some embodiments, a temperature or difference between temperatures of different points along a primary or secondary coolant loop can indicate a defect in a component of a CDU. In some embodiments, alerts can be generated (e.g., faults described with respect to FIGS. 36-38) when a temperature or differential temperature is outside of a range. The alert can be provided to an operator, and can alternatively be used by systems and processes of the CDU 100 to adjust operation of components of the CDU 100 (e.g., shutting down pumps 168*a*, 168*b*).

In some embodiments, components of a CDU can be controlled to achieve a setpoint pressure at a point along the respective loop (e.g., as described below with respect to FIGS. 39 and 42). In some embodiments, components of a CDU can be controlled to achieve a pressure differential between temperatures at different points along one or both of the primary coolant loop and the secondary coolant loop. Additionally or alternatively, pressure values obtained from pressure sensors along one or both of the primary and secondary coolant loops can be provided to an operator of the CDU through an interface (e.g., as shown in the example GUI 4900 shown in FIG. 49). In some embodiments, pressure values obtained by pressure sensors of a CDU can be used to detect faults in components of the CDU.

Figure 36:
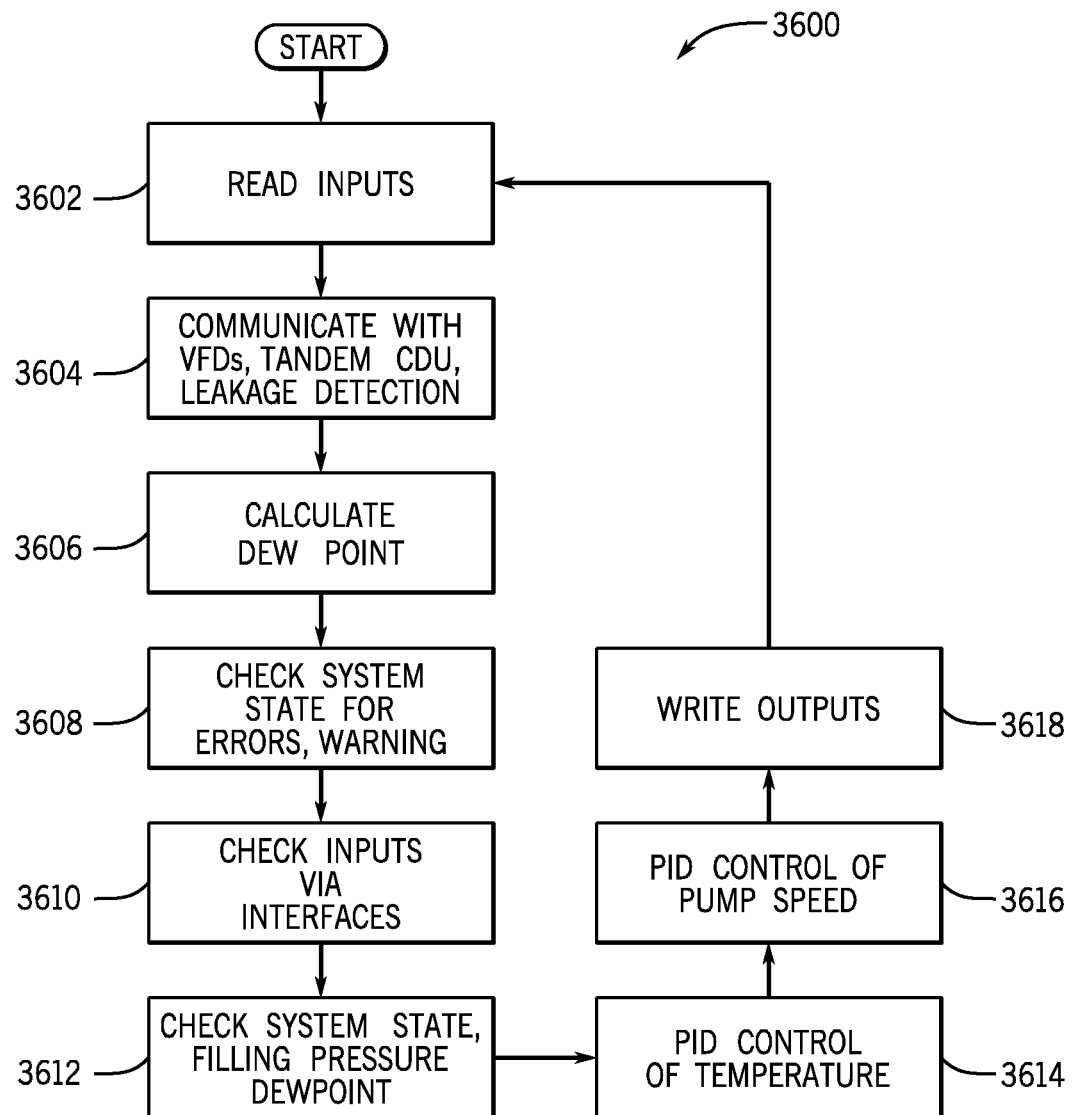
FIG. 36 is a flowchart showing a continuous loop that can be implemented by a controller of a CDU, according to an embodiment of the invention.
Figure 37:
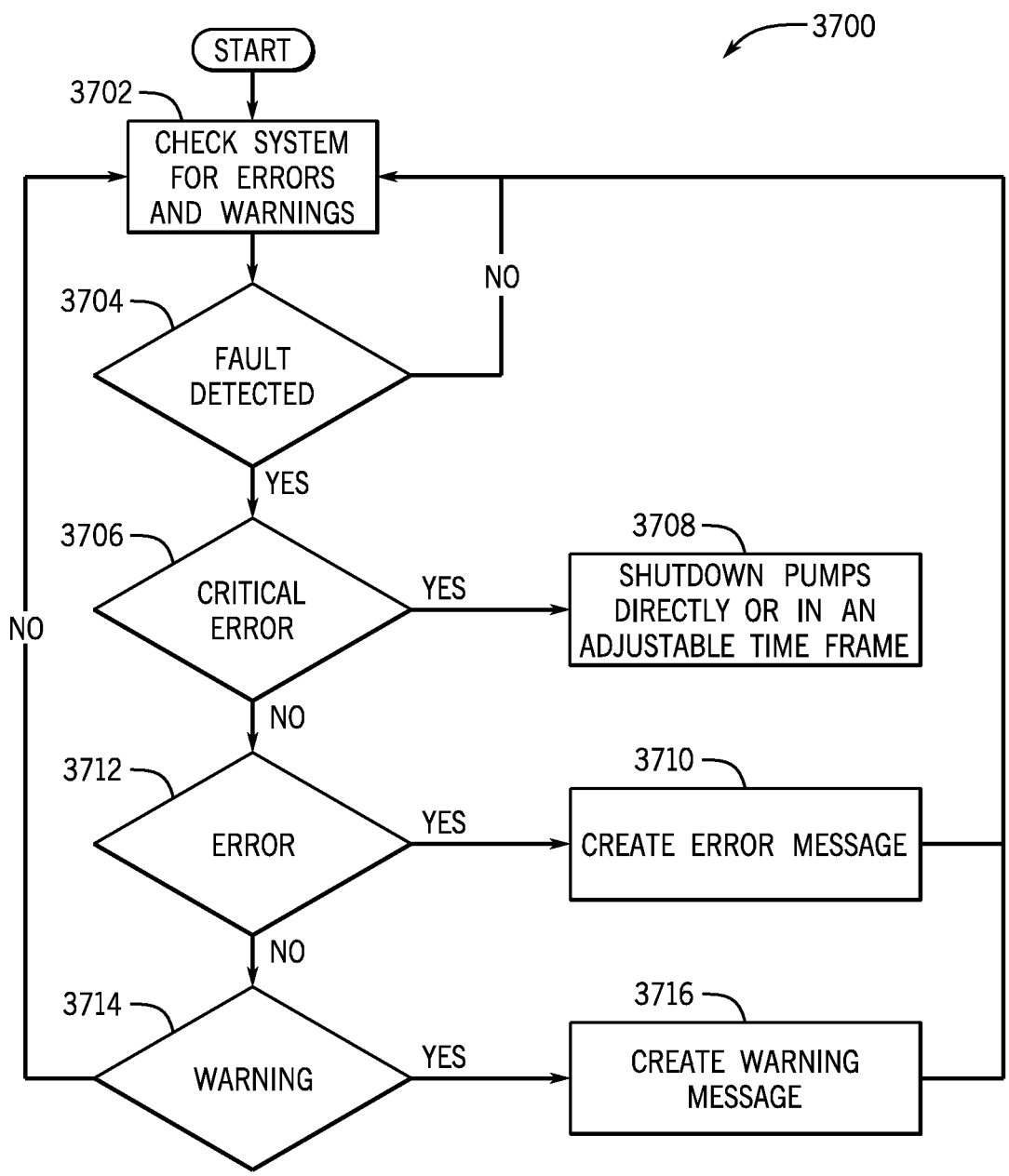
FIG. 37 is a flowchart illustrating a process for generating errors for faults of a CDU, according to an embodiment of the invention.

For example, referring still to FIG. 32, a pressure sensor 228*a* can be provided in the primary coolant loop at the primary inlet 118*a*, immediately upstream of the primary loop strainer 132. Another pressure sensor 228*b* can be provided along the primary coolant loop, immediately upstream of the primary loop strainer 132. Collectively, the pressure sensors 228*a*, 228*b* can measure a pressure drop (e.g., a differential pressure) across the primary loop strainer 132. A high differential pressure between a pressure value obtained from pressure sensor 228*a* and a pressure value obtained from pressure sensor 228*b* can indicate a blockage or contamination of primary loop strainer 132, which can, in turn, indicate a need for the strainer to be serviced. In some embodiments, a differential pressure across the primary loop strainer 132 can raise a fault (e.g., a critical error, an error, or warning as shown in FIGS. 36-38) which can provide an operator notice of the condition of the strainer 132. In some embodiments, if a pressure drop across the primary loop strainer 132 (e.g., as measured by pressure sensors 228*a*, 228*b*) exceeds a threshold, a control system of the CDU can shut valves 136 and 138 to block flow across the primary loop strainer, and open valve 140 to allow coolant of the primary coolant loop to bypass the primary loop strainer 132 (e.g., to flow through bypass loop 134 shown in FIGS. 24 and 25). In some embodiments, additional pressure sensors can be provided along a primary coolant loop of a CDU.

As further shown in FIG. 32, pressure sensors can be provided along the secondary coolant loop of the CDU 100. For example, a pressure sensor 228*c* can be positioned at the secondary inlet 118*b*, a pressure sensor 228*d* can be provided immediately upstream of the pumps 168, 168*b* (e.g., along the Y-pipe 170 as illustrated in FIG. 19), a pressure sensor 228*e* can be provided immediately downstream of the first pump 168*a*, a pressure sensor 228*f* can be provided immediately downstream of the second pump 168*b*, and a pressure sensor 228*g* can be provided at the secondary outlet 120*b*. In some embodiments, a differential pressure between the pressure values obtained by sensors 228*c* and 228*g* can be a system differential temperature for the CDU 100, and components of the CDU 100 can be controlled to achieve a set point for the system differential pressure (e.g., as described with respect to FIGS. 40 and 42). In some embodiments, a difference between pressure values obtained from pressure sensor 228d and one or both of pressure sensors 228e, 228f can indicate a pump differential pressure and components of the CDU 100 can be controlled to achieve a set point for the pump differential pressure (e.g., as described with respect to FIGS. 40 and 42). In some embodiments, additional pressure sensors can be provided along the secondary coolant loop, including for example, pressure sensors immediately upstream and downstream of the filters 198a, 198b to detect a pressure drop across the filters indicating a need for maintenance of one or both of the filters 198a, 198b.

In some embodiments, a pressure of the secondary coolant loop can indicate a need to provide more coolant to the secondary coolant loop. For example, when a pressure is sufficiently low, an alert can be provided to an operator indicating a need to refill the secondary coolant loop, or alternatively, an automatic refill process can be initiated (e.g., as described below with respect to FIG. 48). In some embodiments, a pressure value indicating a need for refilling the secondary coolant loop can be provided by any of pressure sensors 228c, 228d, 228e, 228f, or 228g. In some embodiments, an additional pressure sensor 228h can be provided downstream of the fill tank 208 and upstream of piping of the secondary coolant loop. Pressure values obtained from pressure sensor 228h can be used to determine a need to refill the secondary coolant loop, and can further be used to regulate a filling process, for example, by stopping the pump 212 when a certain pressure value for the secondary coolant loop has been achieved. In some embodiments, values for any of, all of, or a subset of pressure sensors 228c, 228d, 228e, 228f, 228g, and 228h can be displayed or otherwise provided to an operator (e.g., as shown in the example GUI 4900 shown in FIG. 49).

Figure 34:
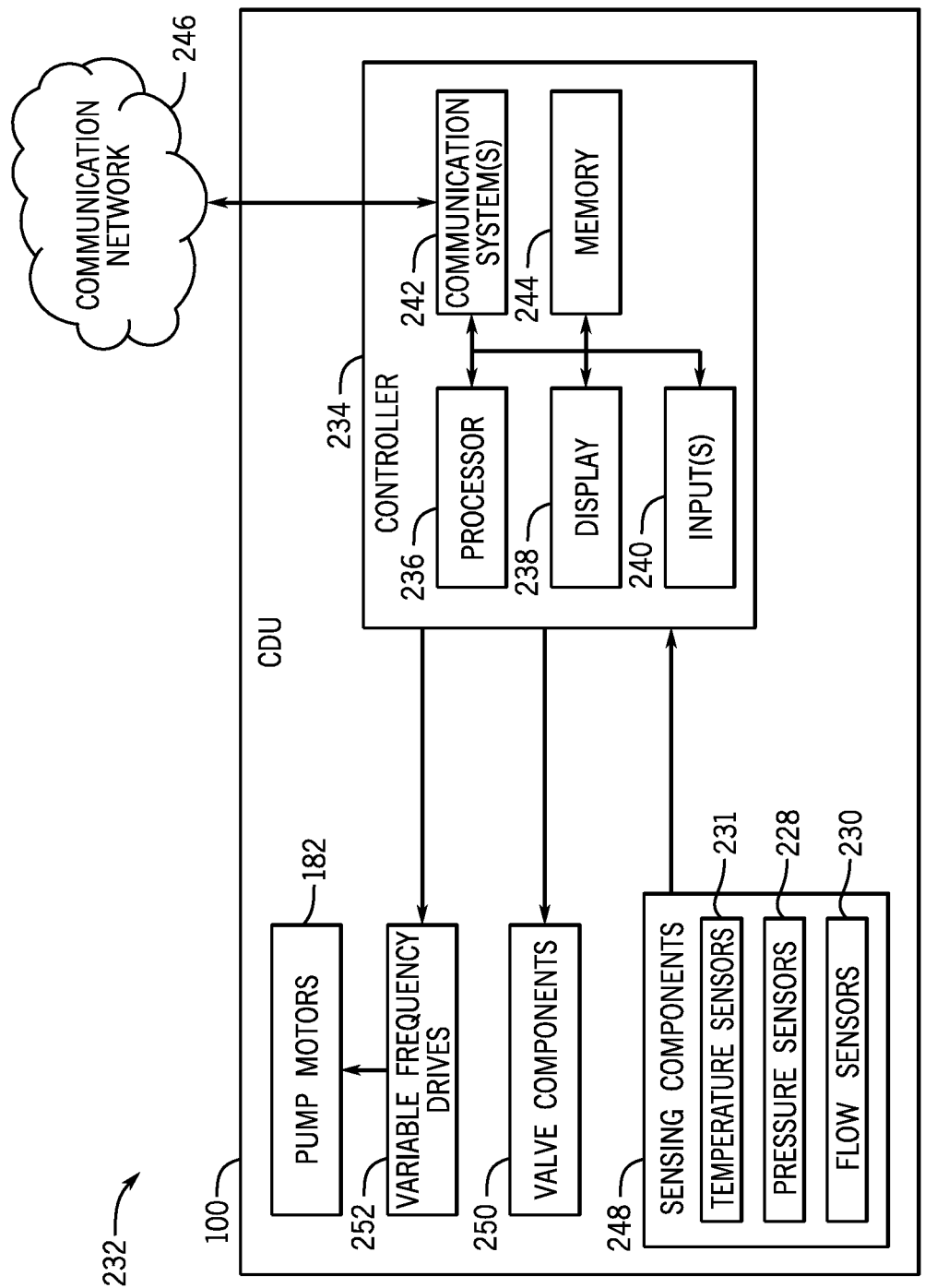
FIG. 34 is a schematic illustration of a computing device of a CDU implemented with sensors and mechanical components of the CDU, according to an embodiment of the invention.

In some embodiments, electrical elements of a CDU can be controlled in response to sensor data collected for operating parameters of a CDU to achieve a desired set point for a given parameter (e.g., temperature, pressure, flow). For example, a control system of a CDU can implement a feedback loop (e.g., a proportional-integral-derivative or PID control loop) to control a flow rate of fluid through the primary and secondary coolant loops (e.g., by controlling pump speed and valve operations) to achieve a desired cooling rate of downstream IT components, or to prevent condensation on piping of the CDU and downstream piping and manifolds (e.g., prevent the system from reaching the dew point). A CDU can thus include computing elements and control elements to control and automate aspect of the operation of the CDU and implement control loops for the CDU. In this regard, FIG. 34 illustrates a control system 232 for the CDU 100 that can be used to implement control loops for the CDU 100. The control system 232 can include a controller 234, which, in some embodiments, can be a low power electrical component housed in the front cabinet 220 of the electronic enclosure assembly (as show in FIG. 14). In some embodiments, the controller 234 is a programmable logic controller (PLC). In some embodiments, the controller 234 can include a processor 236, a display 238, one or more inputs 240, one or more communication systems 242, and/or memory 244. In some embodiments, processor 236 can be any suitable hardware processor or combination of processors, such as a central processing unit (CPU), a graphics processing unit (GPU), an application specific integrated circuit (ASIC), a field-programmable gate array (FPGA), etc. In some embodiments, display 238 can include any suitable display device, such as a computer monitor, a touchscreen, a television, etc. In some embodiments, inputs 240 can include any suitable input devices and/or sensors that can be used to receive user input, such as a keyboard, a mouse, a touchscreen, a microphone, a camera, etc. Inputs 240 can be received at the display 238 which can present a user interface through which an operator can view system parameters, and set control parameters of the CDU (e.g., set an operating mode, define set points for temperature or pressure, set a language of the system, etc.). In some embodiments, the control panel 112 includes the display 238 and the inputs 240 (e.g., as shown at least in FIGS. 1 and 22).

In some embodiments, communications systems 242 can include any suitable hardware, firmware, and/or software for communicating information over communication network 246 and/or any other suitable communication networks. For example, communications systems 242 can include one or more transceivers, one or more communication chips and/or chip sets, etc. In a more particular example, communications systems 242 can include hardware, firmware and/or software that can be used to establish a Wi-Fi connection, a Bluetooth connection, a cellular connection, an Ethernet connection, etc. In some embodiments, inputs can be received at the controller 234 through the communications system 242 over the communication network 246. For example, an API can be provided for the CDU 100 to allow an operator to control the CDU 100 remotely. Additionally or alternatively, the controller 234 can serve a user interface that can be accessible at a network address (e.g., through an IP address or URL), or could present a CLI which can allow for remote access to the controller 234. Remote access to the CDU can be provided through other means, and the enumerated examples are provided for the purpose of illustration and not limitation.

In some embodiments, memory 244 can include any suitable storage device or devices that can be used to store instructions, values, etc., that can be used, for example, by processor 236 to implement control loops and algorithms of the CDU 100, to store logs of the controller 234, etc. Memory 244 can include any suitable volatile memory, non-volatile memory, storage, or any suitable combination thereof. For example, memory 244 can include random access memory (RAM), read-only memory (ROM), electronically-erasable programmable read-only memory (EEPROM), one or more flash drives, one or more hard disks, one or more solid state drives, one or more optical drives, etc. In some embodiments, memory 244 can have encoded thereon a computer program for controlling operation of the controller 234. For example, in such embodiments, processor 236 can execute at least a portion of the computer program to receive inputs and implement control loops in response.

In some embodiments, a control system of a CDU can include sensors of the CDU and mechatronic components (e.g., valves and pumps) of the CDU. For example, as further shown in FIG. 34, sensing components 236 of the CDU can be in communication with the controller 234, which can receive data on operating parameters of the CDU from the sensing components 236. Sensing components 236 of the CDU 100 can include the temperature sensors 231 pressure sensors 228 and flow sensors 230. In some embodiments, additional sensors can be provided as sensing components 236 of a CDU 100. In some embodiments, the sensing components 236 are directly connected to the controller 234, as through a wired connection, and data from the sensing components 234 is received at the memory 244 or processor 236 of the controller 234. In other embodiments, the sensing components 236 can be connected to the controller indirectly, as through a Bluetooth connection, for example, and data from the sensing components 236 can thus be received at the communication system 242 of the controller 234.

Further, mechatronic components of a CDU can be in communication with a controller of the CDU. For example, the controller 234 can be in operative communication with valve components 250. The valve components 250 can include any or all of the two-way valve 154, three-way valve 158, the upstream shutoff valves 186, the downstream shutoff valves 188, the egress valves 200, and any other valves of the CDU 100. In some embodiments, the controller 234 can issue a signal to open or close any of the valve components 250. In some embodiments, the controller can issue a signal to mechatronic elements of valve components (e.g., linear actuator 160) to modulate valves to control flow through the particular valve components 250. In some embodiments, the controller can issue a signal to the valve components 250 to partially open or partially close to control flow through the valve component 250. In some nents thereof (e.g., the controller 234). At block 502, the method can evaluate if settings have been input for the CDU 100 (e.g., through an API, UI, CLI, or any of the inputs 240).

In some embodiments, settings for a CDU can include the parameters shown in Table 1 below. Among other things, an operator can set a maximum operating temperature for the CDU 100. As shown in Table 1, a minimum maximum operating temperature can be 0 degrees Celsius, a maximum allowable maximum temperature can be 150 degrees Celsius, and a default setting for the maximum operating temperature can be 90 degrees Celsius. When the coolant of the secondary coolant loop for the CDU 100 exceeds the maximum operating temperature set, the pumps 168 can be shut off. Other settings can be set for the CDU 100, including, for example, maximum and minimum thresholds for temperature or pressure at different points along the primary and secondary coolant loops, set points for temperature, pressure, or flow rate, PID controlling parameters for control loops of the CDU 100, differential temperature for inlets and outlets of the CDU 100, and other like system parameters.

| Parameter | Min | Max | Default | Description |
|---|---|---|---|---|
| Delay After Start | 3 | 300 | 5 | [s] Start delay after power ON and minimum On-Time of the primps after error messages are created |
| Supply Voltage | 0 | 2 | 1 | Parameter is only for information<br>0 = 208 V/60 Hz<br>1 = 400 V/50 Hz<br>2 = 460 V/60 Hz |
| Parallel operation no. of tandem CDU | 0 | 10 | 0 | 0 = No parallel operation with secondary CDUs<br>>0 Count of connected secondary CDUs |
| Parallel operation sec. CDU address | 0 | 30 | 0 | 0 = This CDU is Master in the Network<br>>0 Address of this slave in the network |
| IP protocol | 1 | 2 | 1 | 1 = IPv4 Connection, No IPv6<br>2 = IPv6 Connection, No IPv4 |
| Pump operation mode | 0 | 2 | 0 | Operating Mode<br>0 = Dual Pump Mode<br>1 = Single Pump Mode with regular switching<br>2 = Single Pump Mode w/o switching |
| Time Switch | 00:00 | 23:59 | 12:00 | Time of day at which in Mode 1 (Single Pump Mode with Switching) switching from one pump to the other takes place |
| Interval Switch | 1 | 7 | 7 | Time interval in days in which the switch over is carried out |
| Error Shutdown time window | 0 | 1380 | 30 | [min] time frame in which the pumps are switched off |
| Max. Operating Temperature | 0 | 150.0 | 90.0 | [° C.] Maximum Operating Temperature. Above this temperature the unit is switched off | embodiments, a controller can operate valve components 250 according to any combination of the methods described above.

In some embodiments, the control system 232 can include variable frequency drives 252. The number of variable frequency drives 252 can correspond to the number of motors 182 for pumps 168 of the CDU 100, and a single variable frequency drive 252 can be operatively connected to a single motor 182. The variable frequency drives 252 can control a speed of the corresponding motor 182 to achieve a given flow rate through the corresponding pump 168. The controller 234 can issue a signal to the variable frequency drives 252 to control a speed of the pump motors 182.

Figure 35:
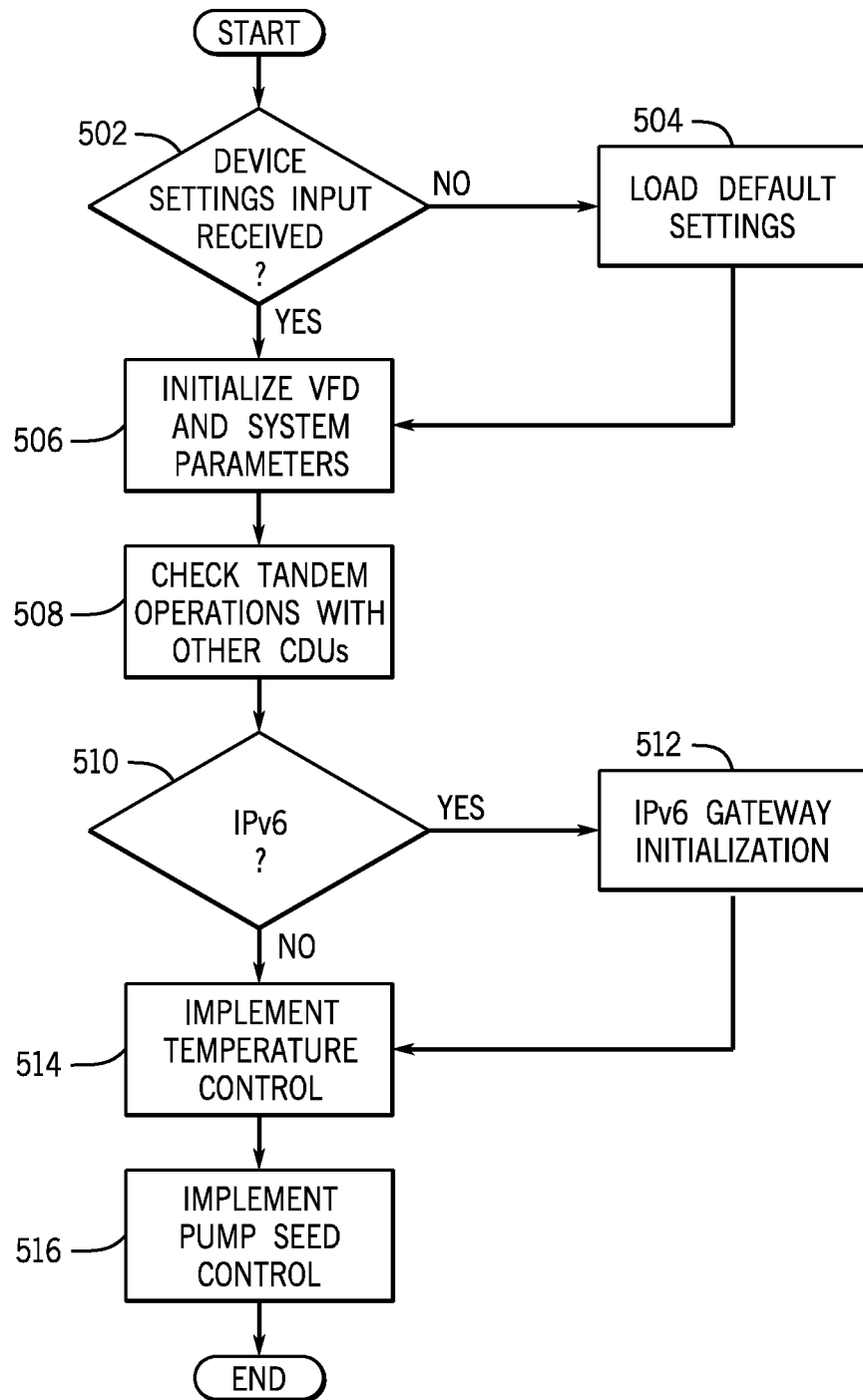
FIG. 35 is a flowchart illustrating a startup process for a CDU, according to an embodiment of the invention.

A controller of a CDU can operate pumps and valves of the CDU in accordance with system parameters. The controller can implement a startup procedure for the CDU. For example, FIG. 35 illustrates an example process 500 for operating the CDU 100. The process 500 can be implemented by the control system 232, or by specific compo- The CDU 100 can include default operating parameters, as shown above in Table 1. Thus, if no settings are input at block 502, the process 500 can proceed to block 504 and set system parameters of the CDU 100 to the default parameters. In some embodiments, where only a portion of the system parameters are set at block 502, the remaining system parameters can be set to the default system parameters.

At block 504, the system can initialize system parameters of the CDU 100, and can control mechatronic components of the CDU 100 (e.g., pump motors 182, and valve components 250) in accordance with the system parameters. For example, a default pump speed can be set, and the controller 234 can issue a signal to the VFDs 252 to operate a pump or pumps of the CDU 100 in accordance with the system parameters.

In some embodiments, a CDU can operate in tandem with other CDUs in a data center to achieve a desired cooling rate of IT components in the data center. When CDUs are operated in tandem, the operation of components of the CDUs (e.g., pump speeds, valve modes, or operating modes) can be coordinated, and one of the CDUs can be selected as a primary CDU, the control system of the primary CDU controlling the operation of tandem CDUs. For example, as shown in Table 1, some system parameters of the CDU 100 can be set to specify tandem behavior of the CDU 100. The number of parallel CDUs (e.g., tandem CDUs) can be specified as a system parameter.

In some embodiments, a display can be provided for a CDU to display operating parameters of the CDU, and alerts for the CDU. The display can be a control panel which can receive user input to control aspects of the CDU, such as pump operating modes, control valves of the CDU or set operating modes therefor, and set levels for any or all of temperature, pressure, and flow, control modes of operation of the CDU, display alerts, set target levels for operating parameters, etc. Among settings which may be set at a display of the CDU are IP and networking parameters, including whether the network address of the control systems for the CDU adhere to IPv4 or IPv6 conventions. At block 510 shown in FIG. 35, the process 500 can check if the IP protocol to be used is IPv6, and if so, can implement an additional step at block 512 of initializing an IPv6 gateway.

At block 514, temperature controls can be implemented in accordance with the settings set for the CDU (e.g., the settings input received at block 502, the default settings loaded at block 504, and the system parameters initialized at block 506). Implementing temperature controls for the system can include selectively opening and closing or partially opening valves of the CDU to control flow of coolant of the primary and secondary loops of the CDU through a heat exchanger, thus impacting the rate of heat transfer, and ultimately, the temperature of fluid in the respective loops. For example, if a temperature of the fluid in the secondary loop is beneath the set point by a predetermined offset amount (e.g., as sensed by temperature sensors 231), the control system 232 can issue signals to the valves components 250 (e.g., two-way valve 154, three-way valve 158, modulating valve 166) to achieve the relevant flow of primary and secondary loop coolant through the HX 142 to bring the fluid of the secondary coolant loop to the desired temperature (e.g., the set temperature). In some embodiments, temperature control can only be implemented through control of valves in the primary coolant circuit.

At block 516, the process 500 can implement pump speed control to achieve desired operating parameters for the CDU 100. In some embodiments, as illustrated in FIG. 34, the controller 234 can issue a signal to variable frequency drives 252, which in turn can control the speed of pump motors 182. The speed of the pump motors 182 can be controlled as part of a PID loop, to achieve any or all of set parameters of the CDU 100 for pressure, temperature, and flow rate of the system. The temperature, pressure, and flow rate can be measured by the temperature sensors 231, pressure sensors 228, and flow sensors 230, at any point along the secondary circuit. The pump speed can also be controlled to achieve a desired pressure drop across the secondary coolant loop, or components thereof, or to achieve a relative temperature difference between a temperature of the coolant in the secondary coolant circuit at different points along the circuit (e.g., between the secondary inlet port 148 and the secondary outlet port 150). In some cases, pump speed can change in response to changes in operating parameters of the CDU, or in response to failure of sensors of a CDU which can require that the pumps operate in different modes, as described further below.

In some embodiments, a controller for a CDU (e.g., controller 234 of CDU 100) can operate in a continuous loop and can continually reevaluate operating conditions of the CDU and tandem CDUs in order to achieve a desired operating state of either or both of the CDU and tandem CDUs. FIG. 36 illustrates a non-limiting example process 3600 which can be executed by the controller 234 (e.g., as shown in FIG. 34) or the processor 236 thereof to control an operating condition of either or both of the CDU 100 and tandem CDUs for which the CDU 100 is the primary CDU. The process 3600 can be run continuously (e.g., as a loop) while the CDU is operating (e.g., until the CDU is switched off). At block 3602, for example, the controller 234 can read inputs, which can include data of operating parameters of the CDU 100 as measured by sensors 231, 228, and 230, and any other sensing elements or operating states of the CDU 100. At block 3604, the controller can communicate with variable frequency drives 252, and, if applicable tandem CDUs. Communication with VFDs 252 and tandem CDU can verify a connection with the VFDs 252 and tandem CDU, and a lack of communication therebetween can cause the controller to exit the process 3600 and enter a failed state or default to an operating mode (e.g., constant speed, or secondary or primary loop bypass) until communication with these elements can be restored.

Liquid, including water or coolant of a system, can be damaging to components of a CDU, or to electrical equipment of downstream IT loads being cooled thereby. Thus, a CDU, according to some embodiments can include features, systems, and functionalities for detecting moisture of system components, and mitigating or preventing leakage from piping or tubing of coolant loops, or of condensation thereon. At block 3604, then, the controller 234 can further evaluate whether there is leakage in either or both of a primary or secondary coolant loop. Leakage can be detected through the use of a sensing cable (not shown) which can be integrated with a sensor interface module (e.g., a tt-SIM sensor interface module) in communication with the controller 234 (e.g., a PLC). The sensor interface module can provide information to the controller 234 about the existence and location of a water or coolant leak in the CDU or along downstream IT components, and the controller can take appropriate action in response (e.g., exiting the process 3600 and shutting down the system). In some embodiments, the VFDs 252, the sensor interface module, and tandem CDUs can communicate with the controller 234 using a RS485 Modbus RTU protocol. In other embodiments, any protocol can be used for communication between elements including RS232, Modbus TCP, IP protocols, SNMP protocols, etc.

In addition to leakage, condensation on piping or other component of a CDU can cause damage to components of the CDU or to electrical equipment being cooled by the CDU. If a temperature of components of the CDU or piping or tubing thereof falls below an ambient dew point temperature, condensation can form along the piping or tubing, potentially causing damage. A controller of a CDU can calculate an ambient dew point, and to maintain a temperature of coolant within a secondary coolant loop above the dew point to prevent condensation. At block 3606, the controller can calculate a dew point, based at least in part on a measurement of an ambient temperature and a humidity of the ambient air, which can be sensed by sensing components and provided at block 3602, or could be provided to the controller by systems external to the CDU 100. The controller 234 can, on the basis of these measurements, calculate a dew point. In some embodiments, code executed by the controller to calculate a dew point can calculate the dew point based on the Magnus Formula.

At block 3608, a system state for the CDU can be checked for error and warnings. The block 3608 can be executed upon every iteration of the process 3600, which, as illustrated, can be a continuously running loop. In some embodiment, the block 3608 can be continuously executed as an independent loop (e.g., process 3700 shown in FIG. 37), which can be evaluated by a controller of the CDU 100 (e.g., the controller 234). FIG. 37 illustrates the process 3700 which can be run at block 3608 (e.g., as shown in FIG. 36), or can be executed independently from process 3600. The process 3700 can be executed continuously as a loop while the CDU 100 is in operation. At block 3702, the system can be checked for errors and warnings. The errors or warnings can be detected by systems of the CDU or could alternatively be generated by components of the CDU and communication to the controller 234 (e.g., as SNMP alerts, through a message bus, etc.). The process can evaluate if any faults are detected in the system at block 3704. If no faults are detected at block 3704, the process can return to block 3702, and the system can be checked for errors and warnings.

If a fault or faults are detected at block 3704, the process 3700 can evaluate the fault, and depending on the fault or degree of the fault (e.g., critical error, error, warning, etc.) can initiate an action or generate an alert or a message. In some embodiments, a message correlating to a critical error, error, or warning can provide an operator information about the fault. In some cases, an error code can be displayed along with an error message, and a user manual of the CDU 100 can include documentation for the code, which can provide the operator with potential ways to mitigate or resolve the fault.

As further shown in FIG. 37, if faults are detected at block 3704, the process can proceed to block 3706 to check for a critical error. A critical error can indicate a fault in the system which requires a shutdown of all or a portion of the system. As shown, if a critical error is identified at block 3704, the process can proceed to block 3708, where one or more pumps of the CDU 100 can be shut down. In some embodiments, in response to a critical error, other components of the CDU can be shut down, including valves, tandem CDUs, etc. Some critical errors can require an immediate shutdown of a pump or other system component, while other critical errors can initiate a shutdown timer providing an operator of the CDU time to prevent damage to system components before the shutdown of the CDU 100 or components of the CDU 100 is performed. The process can proceed to block 3710 and an error message can be generated for the critical error identified at block 3706. In some embodiments, the error message is a human-readable message which can provide information about the error and a corresponding system failure to an operator of the CDU 100 through a UI, API, CLI, SNMP trap, log messages, etc. In some embodiments, block 3710 can be performed before block 3708, so that an operator is alerted to a condition before a shutdown activity is initiated. In some embodiments, blocks 3708 and 3710 can be performed in parallel.

In this regard, FIG. 38A shows a table illustrating three exemplary critical errors (e.g., critical errors which can be identified at block 3706 shown in FIG. 37) and accompanying information. A critical error can include an error message (e.g., the error message created at block 3710 in FIG. 37), which can be a textual summary of an error which can be presented to a user either through an interface (e.g., a UI, API, or CLI), or as an alert or log message which can be sent to another computer system. A critical error can include a trigger condition, which is a condition of the CDU 100 or a component of the CDU 100 that can cause the critical error to be generated. Further, a critical error can include a reset condition, which is a condition of the CDU 100 or components of the CDU 100 that can resolve the critical error or otherwise remove the error from the control system 234 of the CDU 100. Additional parameters of a critical error can define an action to be taken in response to the critical error, and a delay before which the action is initiated by the system. In some embodiments, as shown in the first row of table 3800a, a critical error can be generated when a temperature of the system exceeds a maximum temperature. As illustrated in the first row of table 3800a, a first critical error can be triggered when a secondary outlet temperature (e.g., a temperature of the coolant of the secondary loop measured at the secondary outlet 120b, as shown, for example, in FIG. 16) exceeds a user-set maximum temperature. The user-set maximum temperature can be a configurable parameter of the CDU 100 (e.g., the Max. Operating Temperature shown and described above with respect to Table 1), and can be set through a UI, API, or CLI of the controller 234. Alternatively, in some embodiment, the maximum temperature can be a default setting of the CDU 100. When the system exceeds the maximum temperature, thus generating the first error, all pumps (e.g., pumps 168a, 168b) can be stopped. Because no delay is indicated or specified for the first critical error, the controller 234 can, in response to the first critical error, stop the pumps of the CDU 100 immediately. The first critical error can be reset, and thus the pumps can be restarted, when the controller 234 receives an indication that the critical error has been acknowledged by an operator (e.g., through a UI, API, or CLI), and that the temperature at the secondary outlet is below the maximum temperature. In some embodiments, the maximum temperature can be measured at any other point in the system, including, for example, at the secondary outlet port 150 of the HX 142.

In some embodiments, a critical error can include a delay parameter, which can indicate an amount of time until the action associated with the critical error is implemented. A delay can advantageously allow the system to self-correct and can additionally or alternatively allow an operator to intervene before a shutdown is initiated. A delay for a critical error can thus prevent unnecessary downtime or outages of the system due to transient operating conditions that temporarily meet the trigger condition for the critical error. For example, the second row of table 3800a illustrates a second critical error including a delay parameter. The trigger condition for the second critical alert, as shown, can be a system pressure that is below a user-set limit. When the pressure is below the user-set limit, the controller can initiate a refilling process, and shut off the pumps 168a, 168b of the CDU 100. As shown, however, the second critical error can include a 5 second delay before initiating the refill procedure and shutting off the pumps 168a, 168b. If the reset condition is achieved by the CDU within the delay period (e.g., a sensed system pressure exceeds the user-set limit within 5 seconds of the second critical error being generated), the second critical error can be reset, and the refill process is not started. In some embodiments, the association of a delay with a critical error message and the duration of the delay is a user-configurable parameter. In some embodiments, delay parameters for a critical error are default parameters.

As described above, in some embodiments, an action initiated in response to the generation of an error message can be performed according to a timer, which can allow an operator of a CDU to perform activities to prevent damage to components of the CDU that may otherwise be cause by an abrupt shutdown. A shutdown timer for a critical error can differ from a delay in that a shutdown timer is not automatically reset when a reset condition is met. In some cases, a delay can be set for a critical error in conjunction with a shutdown timer, and a shutdown timer can be initiated if the reset condition is not achieved within the delay period. In this regard, the third row of table 3800a illustrates a third critical error, which can be triggered when a differential pressure for pump 2 (e.g., a difference in pressure between suction port 178b and discharge port 180b of pump 168b) is higher than a user-set limit for the differential pressure. As shown, when the differential pressure is above the limit, a shutdown timer can be initiated, which can set a fixed time until pump 2 (e.g., pump 168b) is shut down by the controller 234. As further shown, the user or operator of the CDU 100 can set a delay for the third critical error, and if the reset condition for the third critical error is met (e.g., the differential pressure falls below the limit or a sensor defect is detected for the pressure sensors), the critical error can be resolved, and the shutdown timer is not initiated. While aspects of critical errors have been described with respect to the three critical errors illustrated in table 3800a, one of skill in the art will recognize that a critical error can include any error for components of the CDU 100 which can require a system response (e.g., pump failures, operating parameters exceeding or falling below set limits, failures of sensors, etc.). Further, any critical error can include a shutdown timer, or could alternately immediately initiate an action to mitigate the error.

Referring back to FIG. 37, if a critical error is not identified at block 3706, the process can proceed to check for errors (e.g., non-critical errors) at block 3712. An error can be a failure or defect in the system that does not require a shutdown of components in the system. Errors can be generated and displayed as described with respect to critical errors and can provide an operator of a CDU information to allow the operator to take an action to resolve the error (e.g., clean or replace a filter, replace a sensor, etc.). When an error is identified in the system at block 3712, an error message can be generated at block 3710. FIG. 38B illustrates two exemplary error messages in table 3800b. Similar to critical errors (e.g., as shown in FIG. 38A), errors can include a fault message (e.g., the error message created at block 3710 of FIG. 37), a trigger condition, a reset condition, and, in some cases, a delay. For example, the first row of table 3800b shows a first exemplary error which indicates a contamination in a leakage detection system (e.g., the leakage detection system described above with respect to block 3604 shown in FIG. 36). The error message for the first exemplary error in table 3800b can communicate to an operator that the leakage detection system is contaminated (e.g., through the message "leakage detection contaminated" shown in table 3800b). In some embodiments, an error code (e.g., a numeric or alphanumeric string) can be provided to the operator, and the error code can correspond to an entry in an operator's manual of the CDU 100 which can include information about the error and steps that can be taken to resolve the error. As shown, the first exemplary error indicating contamination in the leakage detection system can be triggered when the tt-Sim module reports a contamination, and the error can be reset when the contamination is removed or the flat-probes of the error contamination system are cleaned. In some cases, as shown in a second exemplary error code shown in the second row of table 3800b, a delay can be included for errors. The second exemplary error message indicates a defective ambient temperature sensor, and is triggered by an implausible ambient temperature value (e.g., a value provided by the sensor that falls outside of a plausible range of values for the ambient temperature, which can include a value overflow), or a lack of connectivity to the sensor which can be caused, for example, by a wire break for the sensor. The error message can be resolved when the temperature sensor provides a plausible ambient temperature value. In some cases, the second exemplary error message can indicate a need to replace an ambient temperature sensor, and the reset condition (e.g., a plausible ambient temperature value) is achieved when the temperature sensor has been replaced. A delay of two seconds can be set for the second exemplary error message, and thus, the error may not be generated or created until the ambient temperature sensor has provided an unplausible ambient temperature for more than two seconds. As noted, the errors described here are non-limiting examples for purposes of illustration, and error can be generated on any other failures, defects, operating parameters outside of desired ranges, etc. In some embodiments, errors can be defined by an operator of the CDU 100.

Referring back to FIG. 37, if no errors are identified at block 3712, the process 3700 can proceed to check for warnings at block 3714. A warning for the CDU 100 and components thereof can indicate uncritical system states which do not require immediate or urgent remediation. If a warning is identified, a warning message can be generated at block 3716, and can be presented to the operator similarly (e.g., identically) as the error messages created at block 3710 are presented to the user, as described above. A warning can include similar or identical properties as an error, including, for example, a fault message, a trigger condition, and a reset condition. Thus, the description provided with respect to errors identified at block 3712 is applicable to warnings generated at block 3714. If no warnings are identified at block 3714, the process can return to block 3702, and can again check the system (e.g., the CDU 100 and components thereof) for errors and warnings.

Referring back to FIG. 36, the process 3600 can proceed to block 3610 to read inputs through interfaces of the CDU (e.g., the CDU 100). The inputs can include set points and offsets for operating parameters (e.g., inlet pressure, outlet pressure, differential system pressures, inlet temperature, outlet temperature, system pressure, flow rates, etc.), minimum and maximum values for operating parameters, PID parameters (e.g., offset, gain) and any other system parameter that can be set for a CDU (e.g., as described above with respect to Table 1). The inputs can be read through any interface of the CDU or a controller thereof (e.g., controller 234), including a UI, an API, or a CLI.

At block 3612, the process can proceed to check system state, filling pressure, and dewpoint analysis. In some embodiments, the inputs read at 3602 can be compared to the inputs received at block 3610. For example, a temperature of the CDU can be compared to a set minimum for the temperature at block 3612, and a controller of the CDU can evaluate whether the temperature is below the minimum. In other examples, a temperature of the CDU can be evaluated against the dew point calculated at block 3606 to determine if the temperature within the secondary coolant circuit is low enough to produce condensation on components of the CDU and downstream IT components. Checking a fill pressure can allow a controller of the CDU to make a determination of whether there is sufficient coolant in the secondary coolant loop, and to further determine whether to initiate a fill procedure.

At block 3614, in response to the evaluation of block 3612, and based on the inputs received at blocks 3610 and read at block 3602, a PID control for temperature can be implemented to control temperature at a point along the secondary coolant circuit. In some embodiments, a controller of the CDU can control the temperature of the secondary coolant loop by adjusting the flow of fluid of the primary coolant loop through a heat exchanger of the CDU. Thus, in response to measured temperatures of the secondary coolant loop, and PID parameters provided by an operator of the CDU, the controller can control valves of the primary control loop (e.g., three-way valve 158 or two-way valve 154, or a combination thereof) to achieve a desired heat transfer rate, and thus a desired temperature at a point along the secondary coolant loop.

Figure 39:
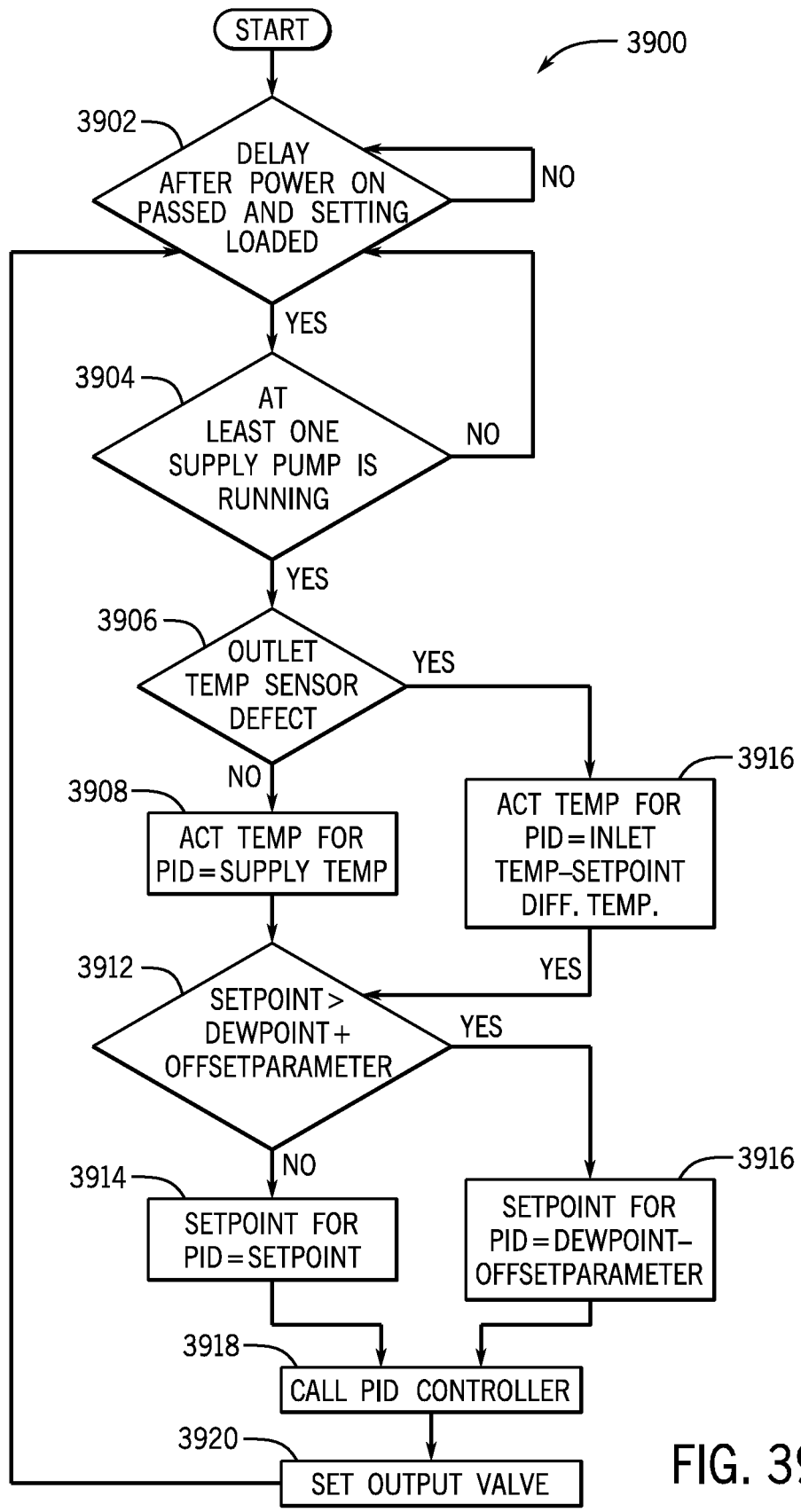
FIG. 39 is a flowchart showing an example process that can be implemented by a controller of a CDU to control a temperature of coolant in a secondary coolant loop of the CDU, according to an embodiment of the invention.

In this regard, FIG. 39 illustrates an example process 3900 which can be used to implement a PID controller for temperature for coolant of a secondary coolant loop. In some embodiments, the PID controller implemented in process 3900 can control a three-way valve of a primary coolant loop (e.g., the three-way valve 158 shown in FIG. 23) to achieve a temperature (e.g., a setpoint for a temperature) for coolant of the secondary control loop. The temperature of the secondary control loop that is used as a process variable in the PID controller can be an outlet temperature of the secondary coolant loop (e.g., a temperature measured at secondary outlet 120*b* shown in FIG. 20). In some embodiments, a PID controller can control other valves of the primary control loop (e.g., the two-way valve 154 shown in FIG. 22) to achieve a setpoint temperature for coolant of the secondary coolant loop. In some embodiments, a temperature used as a process variable for a temperature control PID controller can be any temperature of coolant along the secondary coolant loop.

As shown in FIG. 39, at block 3902, which can be performed after startup of the CDU, a delay can be implemented, and settings can be loaded. The settings can include the inputs obtained at blocks 3602 and 3610, illustrated in FIG. 36. For example, before implementing a control of three-way valve to achieve a set point for a temperature of the secondary coolant loop outlet, a controller (e.g., controller 234 of CDU 100, shown in FIG. 34) can receive inputs from an operator indicating a set point, a proportional gain, an integral gain, etc. for the PID controller. Settings received from a user can further include minimum and/or maximum values for operating parameters of the CDU. Performance of further blocks in the process 3900 can be delayed at block 3902 until the settings are loaded. In some embodiments, the settings are default parameters for the CDU, and loading the settings includes loading the parameters from a memory of a control system of the CDU to a processor (e.g., settings can be stored on memory 244 and loaded to processor 236 as shown in FIG. 34).

In some embodiments, if the settings have been loaded at block 3902, the process can proceed to check operation of other components of the CDU. For example, at block 3904, the process 3900 can check if at least one pump (e.g., one of pumps 168*a*, 168*b* as shown in FIG. 13) along the secondary coolant loop are running. If none of the pumps are running, the process 3900 can return to block 3902, and the system can continue to delay implementation of the PID controller for temperature. In some cases, a process for controlling temperature along a secondary control loop can implement a PID controller without checking the operation of pumps of the secondary coolant loop.

If a pump of the secondary coolant loop is running, process 3900 can proceed to select a temperature to be used as the process variable to be controlled. As described above, a secondary outlet temperature can be a default temperature which a three-way valve can be controlled to bring to a set point. However, in some cases, including where a temperature value cannot be obtained for the secondary coolant loop outlet, another temperature of the secondary coolant loop can be used for a process variable of the PID controller for temperature. At block 3906, then, the process 3900 can check if a secondary outlet temperature sensor (e.g., outlet temperature sensor 228*g* illustrated in FIG. 32) is defective.

At block 3908, if the secondary outlet temperature sensor is not defective, and thus, the secondary outlet temperature can be obtained, the secondary outlet temperature can be set as the process variable for the temperature control PID controller. If the secondary outlet temperature sensor is defective, at block 3910, the process variable for the temperature control PID controller can be based on a secondary inlet temperature. As illustrated at block 3910, the process variable can comprise the secondary inlet temperature with a differential temperature offset so that the process variable is reduced from the secondary inlet temperature value by a predetermined offset. In some embodiments, the offset can be a parameter set by an operator of the CDU. In some embodiments, the offset is a setpoint for a system differential temperature that can be used in another PID controller, as discussed below.

At block 3912, the process 3900 can compare a setpoint temperature of the secondary coolant loop (e.g., as received from interfaces at block 3610 shown in FIG. 36) to a dewpoint for the system (e.g., the dewpoint calculated at block 3606 in FIG. 36). If the setpoint temperature is beneath the dewpoint, as described above, condensation can form on piping of the secondary coolant loop, which could, in turn, damage components of the CDU or downstream IT components. A dewpoint offset parameter can be included in the comparison at block 3912, and the comparison at block 3912 can check if the temperature setpoint is greater than the sum of the dewpoint and the dewpoint offset parameter. The greater of the temperature setpoint or the sum of the dewpoint and the dewpoint offset parameter can be used as the ultimate setpoint for the temperature control PID controller. At block 3914, then, if the temperature setpoint is greater than the sum of the dewpoint and the dewpoint offset parameter, the temperature setpoint can be used as the ultimate setpoint for the temperature control PID controller. At block 3916, if the temperature setpoint is less than the sum of the dewpoint and the dewpoint offset parameter, the sum of the dewpoint and the dewpoint offset parameter can be set as the ultimate setpoint for the temperature control PID controller. Thus, at block 3916, the setpoint temperature for a temperature of the secondary control loop can be set to the lowest temperature that can safely be achieved by the coolant of the secondary coolant loop without producing condensation. In some embodiments, the dewpoint offset parameter can be an input provided by an operator of the CDU.

At block 3918, the process 3900 can call the temperature PID controller. Calling the PID controller at block 3918 can include generating a signal for the three-way valve or a linear actuator of the three-way valve (e.g., linear actuator 160 shown in FIG. 13) to selectively open or close the three-way valve to achieve the desire temperature of the coolant in the secondary coolant loop. The temperature control PID controller can generate the signal based on an error calculated for the temperature. In some embodiments, the signal generated can be overwritten under certain operating conditions of the CDU. For example, if the temperature of the coolant at the secondary outlet exceeds the setpoint temperature by a maximum temperature offset (e.g., the temperature of the secondary outlet is greater than a sum of the setpoint temperature and the maximum temperature offset), the three-way valve can be opened completely to allow a maximal amount of flow of the primary coolant through a HX (e.g., HX 142), and thus achieve maximal cooling of the coolant in the secondary loop. Conversely, if the temperature of the coolant at the secondary outlet is lower the setpoint temperature by a minimal temperature offset (e.g., a sum of the temperature of the secondary outlet and the minimal temperature offset is less than the temperature setpoint), the three-way valve can be completely closed so that coolant of the primary coolant loop does not flow through the HX, thus effecting a minimal cooling of the coolant in the secondary loop.

At block 3920, an output value can be set. The output value can be a state parameter of the PID control or the process 3900, including an error calculated by the PID controller.

Returning now to FIG. 36, at block 3616, pump speed for one or more pumps of a CDU (e.g., pumps 168a, 168b shown in FIG. 13) can be controlled based on the inputs received at block 3602 and 3610 to bring operating parameter of the secondary coolant loop to a desired setpoint. In some embodiments, a controller (e.g., the controller 234 of the CDU 100 as shown in FIG. 34) can control pump speed by issuing a signal to a variable frequency drive (e.g., variable frequency drive 252 illustrated in FIG. 34). In some embodiments, pump speeds can be controlled to achieve set points for different operating parameters. For example, a speed of one or more pumps of a CDU can be adjusted by a continuous controller, which can implement a PID control procedure. The one or more pump speeds can be controlled (e.g., through a PID controller) to achieve a set point for a flow rate of coolant through the secondary coolant loop, a differential pressure for the CDU, a differential pressure for pumps of the CDU, or a differential temperature along the secondary coolant loop. In some embodiments, the pump speeds can be controlled to achieve a set point for any measurable operating parameter of the CDU (e.g., a temperature or a pressure measured at any point along the secondary coolant loop) or a difference between an operating parameter measured at different points along the CDU.

Pump speeds of a CDU can be controlled in accordance with constraints of a system. For example, a secondary coolant loop can have a maximum allowable pressure, and pump speeds can be controlled to maintain pressure in the secondary coolant loop beneath the maximum allowable pressure. Further, maximum and minimum values for flow of coolant through the secondary coolant loop can be set, and can limit the maximum or minimum speeds at which the pumps can be operated. Additionally, a pump may include maximum and minimum speeds beyond which the pump cannot be safely operated. In some embodiments, altering pump speed alone can be infeasible or insufficient to achieve a set point for an operating parameter. For example, a differential temperature of the secondary coolant loop may be too high and thus pumps of the secondary coolant loop may be required to reduce flow by reducing speed of the pump. If a pump is operating at a minimum speed, the speed of the pump cannot be further reduced to achieve the desired set point. Accordingly, in some embodiments, valves of a bypass loop (e.g., modulating valve 166 of the secondary loop bypass circuit 162) can be selectively opened or closed to allow coolant to bypass a HX (e.g., HX 142) and pumps of the CDU. Thus a bypass loop can be controlled in concert with pump speeds to achieve a set point for operating parameters of the CDU.

In some embodiments, a control system for a CDU (e.g., the controller 234 for CDU 100 illustrated in FIG. 34) can operate pumps of the CDU according to different operating modes to achieve a set point for one of different operating parameters. In some embodiments, a control system of the CDU can select an operating mode based on operating conditions of the CDU, or a state of components of the CDU. In some embodiments, the control system can alternate between operating modes. In some embodiments, a first operating mode can be a default mode, and the control system of the CDU can alternate to a second operating mode if operating the CDU according to the first mode is unfeasible. In some embodiments, an operator of the CDU can select (e.g., through a UI, API, or CLI) an operating mode, or can set a default operating mode for the CDU.

Figure 40:
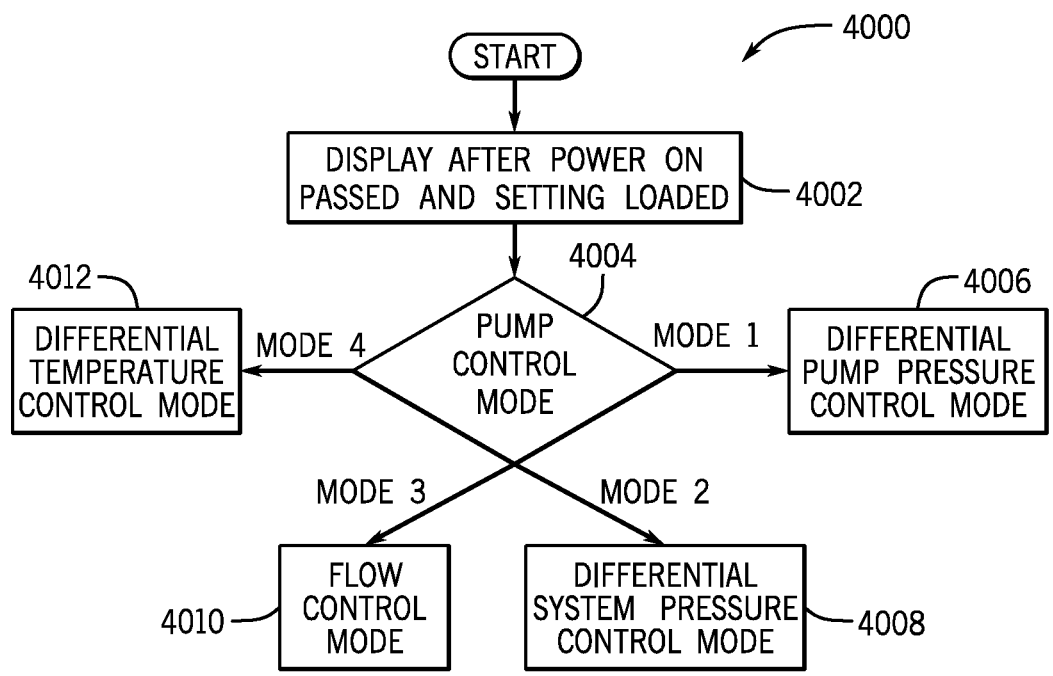
FIG. 40 is a flowchart showing example pump control modes that can be implemented for pumps along a secondary coolant loop of a CDU, according to an embodiment of the invention.

For example, FIG. 40 illustrates a process 4000 for selection between different operating modes of a CDU (e.g., CDU 100 illustrated at least in FIG. 1). At block 4002, which can be performed after startup of the CDU, a delay can be implemented, and settings can be loaded. The settings can include the inputs obtained at blocks 3602 and 3610, illustrated in FIG. 36. Before implementing a control of pump to achieve a set point for a given parameter (e.g., implementing a given operating mode for pump speed control), a controller (e.g., controller 234 of CDU 100, shown in FIG. 34) can receive inputs from an operator indicating a set point, a proportional gain, an integral gain, etc. Settings received from a user can further include minimum and/or maximum values for operating parameters of the CDU.

Figure 41:
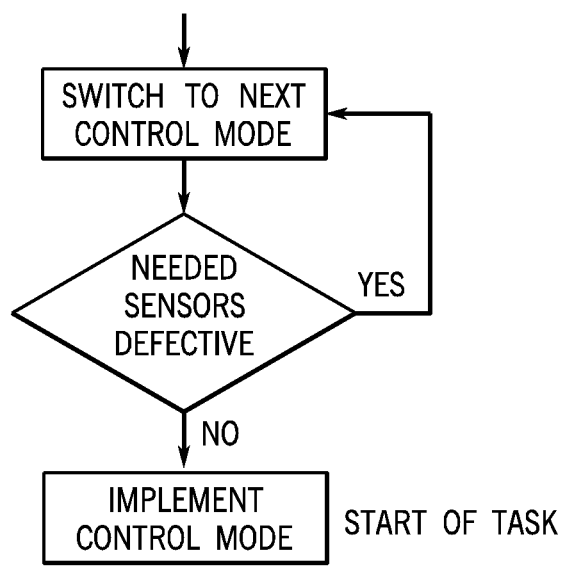
FIG. 41 is a flowchart showing an example process for switching pump control modes when sensors of a CDU are defective.

At block 4004, the process 4000 can select an operating mode for pumps of the CDU, each operating mode corresponding to a setpoint for one or more operating parameters of the CDU. The operating mode elected at block 4004 can be a default operating mode of the CDU or can be an operating mode selected by an operator. In some cases, sensors that can be necessary to implement a given operating mode can be defective. Selection of an operating mode at block 4004 can thus include receiving a state of sensors, and if sensors necessary for a given mode are defective, selecting another operating mode (e.g., as illustrated in FIG. 41), in accordance with an order set by a system of the CDU, or by an operator.

As illustrated at block 4006, a control mode for pumps of the CDU can be a differential pump pressure control mode. In some embodiments, a pump pressure PID controller can be implemented to control pump speed (e.g., by generating a signal to the VFD for the pump) to achieve a set point for a differential pressure for the pump. The differential pressure can be a difference in pressure between a suction port and discharge port for one or more pumps of the CDU (e.g., suction ports 178 and discharge ports 180 of pumps 168, shown in FIGS. 16 and 21).

Figure 42:
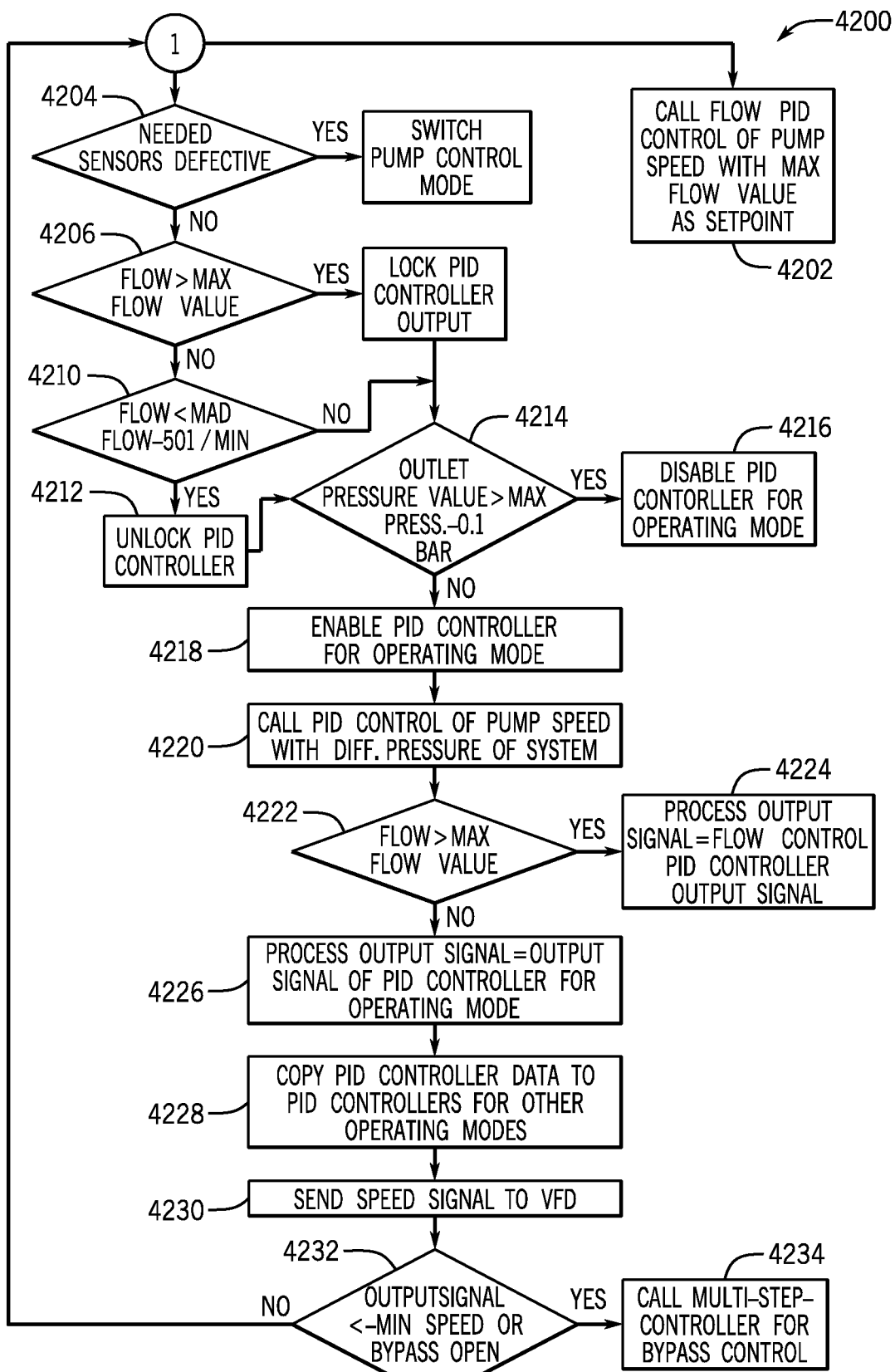
FIG. 42 is a flowchart showing an example process that can be used to implement a differential pump pressure control mode, differential system pressure control mode, or a differential temperature control mode, according to an embodiment of the invention.

For example, FIG. 42 illustrates a process 4200 which can implement operating modes (e.g., any of the differential pump pressure control mode 4006, a differential system pressure mode 4008, and a differential temperature control mode 4012, shown in FIG. 4), for a PID controller to achieve a set point for given operating parameters of the CDU. In some embodiments, a PID controller for flow rate can be operated independently or in parallel with PID controllers for modes of the CDU. At block 4202, then, the process 4200 can call (e.g., implement) a flow control PID controller to determine an output signal that can be sent to VFDs to regulate pump speed in order to achieve a maximum flow value. Thus, if flow of secondary coolant through the secondary coolant loop exceeds a maximum flow value, the flow control PID controller can regulate the speed of the pumps (e.g., through sending a signal to the VFDs) to reduce the flow to a value beneath the maximum flow.

At block 4204, the sensors necessary for operating the PID controller for the selected control mode can be checked. When the process 4200 is implementing the differential pump pressure control mode, for example, pressure sensors at suction and discharge ports (e.g., pump suction pressure sensor(s) 228d and pump discharge pressure sensor(s) 228e, 228f shown in FIG. 32) for one or more pumps of the CDU can be checked. If either of a pressure sensor at a suction or discharge pump is defective, the differential pump pressure cannot me measured, and thus, the pump speeds cannot be operated in the differential pump pressure control mode (e.g., mode 4006, shown in FIG. 40). Thus, in some embodiments, at block 2406, when pressure sensors for suction or discharge ports of pumps are defective, a controller (e.g., controller 234 shown in FIG. 34) can switch to a different operating mode (e.g., as shown and discussed with respect to FIGS. 40 and 41).

At block 4206, the process can evaluate if the flow of coolant through the secondary coolant loop exceeds the maximum flow value (e.g., a maximum value set by an operator of the CDU, or calculated by a controller of the CDU based on operating parameters and environmental parameters). If the flow exceeds the maximum flow, at block 4208 the PID controller implemented by the process 4200 can be locked. When the process 4200 is implementing the differential pump pressure control mode (e.g., mode 4006 shown in FIG. 40), the PID controller that controls pump speeds to achieve a set point for differential pump pressure can be disabled at block 4208. When the PID controller implemented by process 4200 is locked (e.g., disabled), the pumps speeds can be regulated by the PID controller for flow rate, called at block 4202, and thus, the process 4200 can operate to reduce the flow of coolant to a value beneath the maximum flow value before continuing to regulate differential pump pressure.

If flow of the coolant in the secondary loop does not exceed the maximum flow, at block 4210, the process 4200 can evaluate if the flow of coolant in the secondary loop is beneath the maximum flow value by a flow rate offset. In the illustrated embodiment, at block 4210, the process evaluates whether the flow of coolant in the secondary loop is less than the maximum flow value by a flow rate offset of at least 50 liters per minute (l/min). In other embodiments, a flow rate offset could be about 10 l/min, about 20 l/min, about 30 l/min, about 40 l/min, about 60 l/min, about 70 l/min, about 80 l/min about 90 l/min, or about 100 l/min. If the flow of coolant in the secondary coolant loop is less than the maximum flow rate by more than the flow rate offset, at block 4212, the process 4200 can unlock the PID controller. In some embodiments, when a PID controller is locked at block 4208, it can remain locked at every iteration of the process 4200 until the flow of coolant in the secondary coolant loop is sufficiently low, as evaluated in block 4210. If the flow of secondary coolant does not satisfy the condition of block 4210, the PID controller can remain locked, and the pump speed can thus continue to be controlled by the flow rate PID controller.

At block 4214, the process 4200 can evaluate an outlet pressure of the secondary coolant loop (e.g., a pressure measured by secondary outlet pressure sensor 228g, illustrated in FIG. 32). If the outlet pressure is greater than a threshold outlet pressure value, at block 4216, the PID controller for the operating mode implemented by process 4200 can be disabled (e.g., the output or error of the PID controller is set to zero). For example, if the process is implementing the differential pump pressure control mode (e.g., as illustrated at block 4006 of FIG. 40), an output signal of the differential pump pressure PID controller (e.g., the PID controller that operates to achieve a set point for the differential pump pressure, as described above) can be zero. In some embodiments, as illustrated in FIG. 42, the threshold outlet pressure value can be 0.1 bar less than a maximum pressure value (e.g., as set by an operator of the CDU, or as provided as a default in the controller of the CDU). In some embodiments, the threshold outlet pressure value can equal the maximum pressure, or can be less than the maximum pressure by a different amount than illustrated, for example, about 0.2 bar, about 0.3 bar, about 0.4 bar, about 0.5 bar, about 0.6 bar, about 0.7 bar, about 0.8 bar, about 0.9 bar, about 0.1 bar, or any value greater than 1 bar. In some embodiments, an operator of the CDU can configure the threshold outlet pressure value to be offset from the maximum pressure value by a specified amount.

At block 4218, if the secondary outlet pressure is less than the threshold outlet pressure value, the PID controller for the operating mode implemented by process 4200 can be enabled. For example, when the process 4200 is implementing the differential pump pressure control mode 4006, as shown in FIG. 40, the differential pump pressure PID controller can be activated.

At block 4220, the PID controller for the operating mode implemented by process 4200 can be called to determine an output signal. As shown, if the secondary outlet pressure exceeds the threshold outlet pressure value at block 4214, the output of the PID control at block 4220 will be zero. If the PID controller for the operating mode implemented by process 4200 is enabled at block 4218, the PID controller can generate an output signal for the VFD, to regulate pump speeds to achieve the set point for the desired operating parameter. When the operating mode implemented by process 4200 is the differential pump pressure control mode (e.g., mode 4006 of FIG. 40), the output signal can be generated to achieve a set point for the differential pump pressure.

At block 4222, the process can evaluate if the flow of coolant in the secondary coolant loop exceeds the maximum flow value. If the flow exceeds the maximum flow value, at block 4224, a process output signal can be an output signal of the flow control PID controller (e.g., as called in block 4202). If, at block 4222, the flow of coolant in the secondary coolant loop does not exceed the maximum flow value, the process 4200 can proceed to block 4226, and the process output signal can be an output signal of the PID controller for the operating mode implemented by process 4200.

At block 4228, the process 4200 can copy PID controller data of the process 4200 to PID controllers of other operating modes. For example, the input values and the process output signal (e.g., the error) for the process 4200 implementing the differential pump pressure control mode can be sent to the PID controller for the differential system pressure control mode (e.g., as shown at block 4008 of FIG. 40) and the PID controller for the differential temperature control mode (e.g., shown at block 4012 of FIG. 40). Copying PID controller data of an active PID controller to inactive PID controllers can advantageously ensure that, if a control mode is switched (e.g., as shown in block 4206), the PID controller for the activated operating mode can start at the same working point at which the previously active operating mode left off, and interruption to the system is thus minimized.

At block 4230, a speed signal (i.e., the process output signal generated at either of blocks 4224 and 4226) can be sent to the VFD, which can control a speed of the pumps. At block 4232, the process 4200 can evaluate whether the process output signal corresponds to a pump speed that is less than a minimum pump speed (e.g., if the pump speed is less than the minimum pump speed). Additionally or alternatively, as illustrated, at block 4232, the process 4200 can check if a bypass loop of the secondary coolant loop (e.g., the secondary loop bypass circuit 162 as illustrated in FIG. 32) is open. If at block 4232 either the bypass loop is open, or the process output signal corresponds to a pump speed that is less than a minimum pump speed, the process 4200 can proceed to call a multi-step controller (e.g., as illustrated in FIG. 43) at block 4234 to control flow through the bypass loop in order to achieve the setpoint for the operating parameter, or, in some cases, to extend or boost an uptime of the system.

Figure 43:
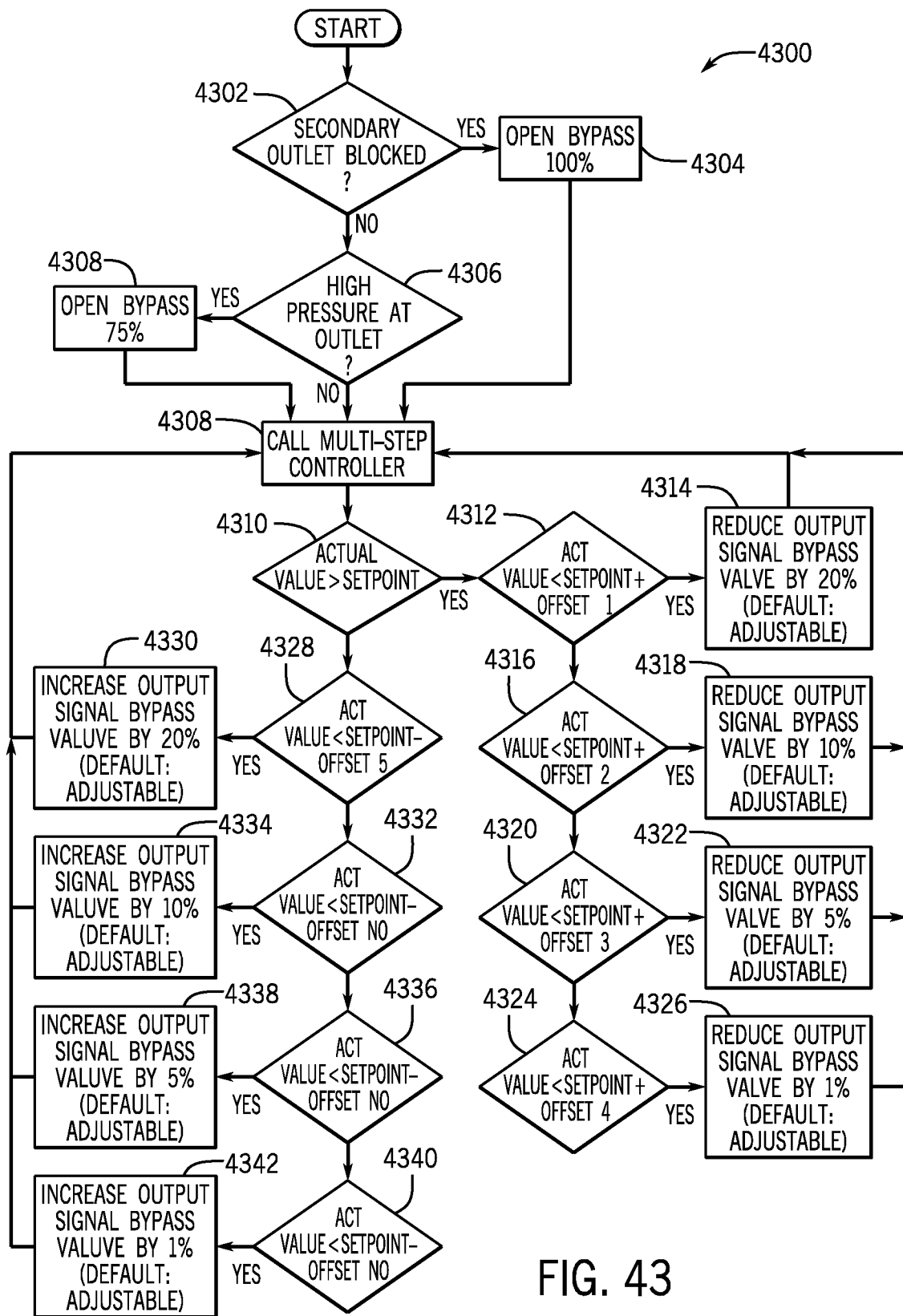
FIG. 43 is a flowchart showing a process for implementing a multi-step controller for controlling flow through a bypass circuit of the secondary coolant loop, according to an embodiment of the invention.

For example, FIG. 43 illustrates a process 4300 for calling a multi-step controller (e.g., the multi-step controller called at block 4234 shown in FIG. 42). In some embodiments, the process 4300 can be implemented by a controller of a CDU (e.g., the controller 234 of CDU 100 illustrated in FIG. 34) to control a valve of a secondary bypass loop (e.g., modulating valve 166 of secondary loop bypass circuit 162). In some embodiments, the process 4300 can be called to achieve a desired set point for an operating parameter when a pump speed of pumps of a CDU are at a minimum value. In some embodiments, all or a portion of the process 4300 can be executed as part of an uptime boost mode for the CDU 100, as discussed below.

At block 4302 the process 4300 can evaluate whether an outlet of the secondary coolant loop is blocked (e.g., when pumps are running, but there is not flow of coolant in the secondary coolant loop). If a blockage is detected, at block 4304, a valve of the bypass loop can be fully opened to allow 100% of the flow of the secondary coolant loop to flow through the secondary loop bypass circuit. In some embodiments, as illustrated at block 4306, the process 4300 can evaluate a pressure at the secondary outlet (e.g., as measure by pressure sensor 228g for secondary outlet 120b illustrated in FIG. 32). For example, the secondary outlet pressure can be compared to a maximum pressure of the system (e.g., as described with respect to block 4214 in FIG. 24) and if the secondary outlet pressure exceeds the maximum pressure, the process can proceed to block 4308, and a valve of the secondary loop bypass circuit can be partially opened. In some embodiments, as illustrated, a valve of the secondary loop bypass circuit can be opened 75% to allow 75% of the flow of the secondary loop to flow through the secondary loop bypass circuit. In other embodiments, the secondary loop bypass circuit can be opened to allow a greater percentage or a lesser percentage of the flow through the secondary coolant loop to bypass pumps and the HX of the secondary loop. Opening the secondary loop bypass circuit can thus relieve pressure along the secondary coolant loop.

At block 4308, the process 4300 can proceed to implement the multi-step controller, to control operating parameters through partially opening or partially closing the valve of the secondary loop bypass circuit to permit or restrict flow of the coolant through the secondary loop bypass circuit (e.g., directly from secondary inlet 118b to secondary outlet 120b, as illustrated in FIG. 32). In some embodiments, the operating parameter that is controlled by the multi-step controller through process 4300 is a differential parameter (e.g., a differential temperature between a secondary inlet and a secondary outlet, a differential pressure between a secondary inlet and a secondary outlet, or a differential pressure between a suction port and a discharge port for a pump), and permitting greater flow through the secondary loop bypass circuit can reduce a difference between an operating parameter at the secondary inlet and the operating parameter at the secondary outlet.

At block 4310, the multi-step controller called at block 4308 can evaluate the value of the operating parameter against a setpoint for the operating parameter. For example, a differential pressure between the secondary inlet and the secondary outlet can be compared to a differential pressure setpoint. In some embodiments, a differential temperature between the secondary inlet and the secondary outlet can be compared to a differential temperature setpoint. If the operating parameter value exceeds the setpoint value (e.g., a difference between a pressure or temperature of the secondary inlet and secondary outlet exceeds the setpoint for the differential pressure or temperature respectively) the multi-step controller can proceed to measure the difference between the operating parameter and the setpoint, and can modulate the valve of the secondary loop bypass circuit to allow a greater portion of the coolant in the secondary coolant circuit to flow through the bypass circuit.

For example, at block 4312 the multi-step controller can evaluate if the operating parameter exceeds the setpoint value by more than a first offset. In an example, the first offset could be 1 bar, the operating parameter can be a differential pressure between the secondary inlet and the secondary outlet, which can be 3 bar, and the set point can be 1 bar. In this example, at block 4312, the operating parameter exceeds the set point (1 bar) by more than the first offset (1 bar). At block 4314, when the operating parameter exceeds the setpoint by more than the first threshold, the bypass valve can be controlled to restrict flow through the secondary loop bypass circuit by a first restriction amount. In the illustrated embodiment, the first restriction amount is 20%, and thus, the valve of the secondary loop bypass circuit can be partially closed to restrict the flow through the valve and thus through the bypass circuit by 20%. While the first restriction amount is illustrated as 20%, a first restriction amount can restrict flow through a secondary loop bypass circuit by any amount, and can be set (e.g., by an operator) as a percentage of total flow through the system, a percentage of flow through the bypass loop prior to implementing the restriction, an absolute amount of flow through the bypass loop, or a percentage by which a valve of the bypass loop is opened or closed.

In some embodiments, the multi-step controller implemented by process 4300 can further evaluate differences between an operating parameter and a set point, and restrict a flow through a secondary loop bypass circuit by a corresponding restriction amount. As illustrated, if the operating parameter does not exceed the setpoint by more than a first threshold, at block 4316, the multi-step controller can evaluate whether the operating parameter exceeds the setpoint by a second threshold, the second threshold being lower or smaller than the first threshold. If at block 4316 the operating parameter exceeds the setpoint by more than the second threshold, at block 4318, the multistep controller can issue a signal to the valve of the secondary loop bypass circuit to restrict flow through the secondary loop bypass circuit by a second restriction amount. In some embodiments, the second restriction amount can be less than the first restriction amount (e.g., as illustrated, the second restriction amount is 10% and the first restriction amount is 20%). In some embodiments, if the operating parameter does not exceed the setpoint by the second offset at block

4316, the process 4300 can proceed to block 4320, and the multi-step controller can evaluate if the operating parameter exceeds the setpoint by a third offset, the third offset being smaller than the second offset. If, at block 4320, the operating parameter exceeds the setpoint by the third offset, at block 4322, the multistep controller can issue a signal to the valve of the secondary loop bypass circuit to restrict flow through the secondary loop bypass circuit by a third restriction amount. Further, if the operating parameter does not exceed the setpoint by the third offset at block 4320, the process 4300 can proceed to block 4324, and the multi-step controller can evaluate if the operating parameter exceeds the setpoint by a fourth offset, the fourth offset being smaller than the third offset. If, at block 4324, the operating parameter exceeds the setpoint by the fourth offset, at block 4326, the multistep controller can issue a signal to the valve of the secondary loop bypass circuit to restrict flow through the secondary loop bypass circuit by a fourth restriction amount. Each evaluation at blocks 4312, 4316, 4320, and 4324 and their respective flow restrictions 4314, 4318, 4322 and 4326 can comprise a flow restriction step of the multi-step controller called at block 4308. As illustrated, the multi-step controller can comprise four flow restriction steps. In other embodiments, a multi-step controller can include less than four flow restriction steps, or more than four flow restriction steps. In some embodiments, an operator can select a number of flow restriction steps for a multi-step controller, as well as offsets and restriction amount corresponding to each step.

Still referring to FIG. 4300, if, at block 4310 the operating parameter is not greater than the setpoint, the process 4300 can implements a step or steps to increase flow of coolant through the secondary loop bypass circuit. For example, if, at block 4328, the operating parameter is less than the setpoint by more than a fifth offset, at block 4330, the valve of the secondary loop bypass circuit can be controlled to increase a flow through the secondary loop bypass circuit by a first flow increase amount (e.g., 20% as illustrated). If, at block 4328 the operating parameter is not less than the setpoint by more than the fifth offset, at block 4332, the multi-step controller implemented by the process 4300 can evaluate whether the operating parameter is less than the setpoint by more than a sixth offset, the sixth offset being smaller than the fifth offset. If, at block 4332, the operating parameter is less than the setpoint by more than the sixth offset, at block 4334, the valve of the secondary loop bypass circuit can be controlled to increase a flow through the secondary loop bypass circuit by a second flow increase amount (e.g., 10% as illustrated). The process 4300 further illustrates block 4336, which includes evaluating whether the operating parameter is less than the setpoint by more than a seventh offset, and controlling the valve of the secondary loop bypass circuit to achieve a third flow increase amount at block 4338. The process 4300 further illustrates block 4340, which includes evaluating whether the operating parameter is less than the setpoint by more than an eighth offset, and controlling the valve of the secondary loop bypass circuit to achieve a fourth flow increase amount at block 4342. In some embodiments, the offsets used for evaluation at blocks 4328, 4332, 4336, and 4340 can be set by an operator of the CDU. In some embodiments, the flow increase amounts that the valve of the secondary loop bypass circuit is controlled to achieve can be set by the operator. In some embodiments, more than four flow increase steps can be implemented in a multi-step controller, or less than four flow increase steps.

The multi-step controller can be operated as a continuous process or a loop, and after each iteration of the loop, the controller can once again be called to determine a control signal for the valve of the secondary control loop. In some embodiments, when an operating parameter exceeds the setpoint by an offset (e.g., by the first, second, third, or fourth offsets at blocks 4312, 4316, 4320, and 4324 respectively), the valve of the secondary loop bypass circuit can be opened to increase a flow through the bypass circuit. Similarly, in some embodiments, when the operating parameter is less than the setpoint by another offset (e.g., by the fifth, sixth, seventh, and eighth offsets illustrated at blocks 4328, 4332, 4336, and 4340 respectively) the valve of the secondary loop bypass circuit can be partially closed to restrict flow through the secondary loop bypass circuit.

Returning now to FIG. 40, at block 4008, the pump can be operated in differential system pressure control mode, and a system pressure PID controller can be implemented to achieve a setpoint for a pressure difference between a secondary inlet and a secondary outlet of a CDU (e.g., a difference between a pressure measured at secondary inlet 118*b* and secondary outlet 120*b* shown in FIG. 13). The process 4200 shown in FIG. 42 can be used to operate the CDU in differential system pressure control mode, and the control mode PID controller for the process 4200 (e.g., as shown at least in blocks 4218 and 4226 of FIG. 42) can be the system pressure PID controller.

In some embodiments, as shown in FIG. 40, at block 3612, the pump can be operated in differential temperature control mode, and a differential temperature PID controller can be implemented to achieve a setpoint for a temperature difference between a secondary inlet and a secondary outlet of a CDU (e.g., a difference between a pressure measured at secondary inlet 118*b* and secondary outlet 120*b* shown in FIG. 13). The process 4200 shown in FIG. 42 can be used to operate the CDU in differential temperature control mode, and the control mode PID controller for the process 4200 (e.g., as shown at least in blocks 4218 and 4226 of FIG. 42) can be a differential temperature PID controller.

Figure 44:
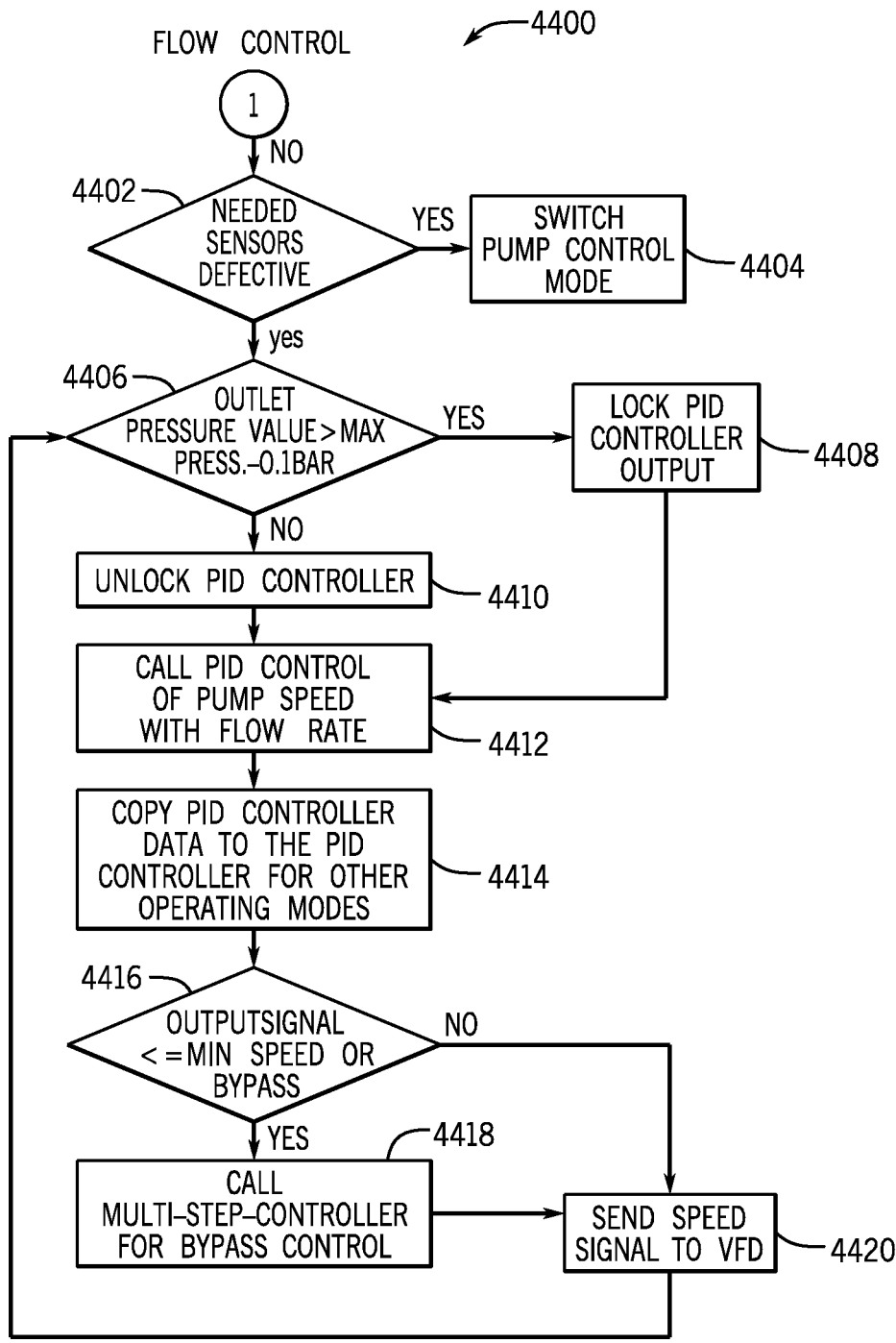
FIG. 44 is a flowchart showing an example process for implementing a flow control mode for flow through a secondary coolant loop, according to an embodiment of the invention.

As further shown in FIG. 40, at block 4010, pump speeds for pumps of the CDU can be operated in flow control mode, and speeds of the pumps can be regulated to achieve a setpoint for flow. FIG. 44 illustrates an exemplary process 4400 for implementing a flow control mode for a CDU, according to some embodiments. At block 4402 the sensors necessary for operating the flow control PID controller can be checked. The sensors to be checked can be one or both of a flow sensor at a secondary inlet of a CDU (e.g., secondary inlet flow sensor 228*c* shown in FIG. 32) or a flow sensor at a secondary outlet of the CDU (e.g., secondary outlet flow sensor 228*g* shown in FIG. 32). In some embodiments, if one or both of the flow sensors at a secondary inlet or secondary outlet are defective, at block 4404, a controller (e.g., controller 234 of CDU 100 shown in FIG. 34) can switch to a different operating mode (e.g., as shown and discussed with respect to FIGS. 40 and 41).

At block 4406, the process 4400 can evaluate an outlet pressure of the secondary coolant loop (e.g., a pressure measured by secondary outlet pressure sensor 228*g*, illustrated in FIG. 32). If the outlet pressure is greater than a threshold outlet pressure value, at block 4408, the flow control PID controller can be locked (e.g., the output or error of the PID controller is set to zero). In some embodiments, as illustrated in FIG. 44, the threshold outlet pressure value can be 0.1 bar less than a maximum pressure value (e.g., as set by an operator of the CDU, or as provided as a default in the controller of the CDU). In some embodiments, the threshold outlet pressure value can equal the maximum pressure, or can be less than the maximum pressure by a different amount than illustrated, for example, about 0.2 bar, about 0.3 bar, about 0.4 bar, about 0.5 bar, about 0.6 bar, about 0.7 bar, about 0.8 bar, about 0.9 bar, about 0.1 bar, or any value greater than 1 bar. In some embodiments, an operator of the CDU can configure the threshold outlet pressure value to be offset from the maximum pressure value by a specified amount. At block 4410, if the secondary outlet pressure is less than the threshold outlet pressure value, the flow control PID controller can be (e.g., can remain) unlocked.

At block 4412, the flow control PID controller can be called to determine an output signal (e.g., a signal that can be sent to a VFD to control a pump speed). As shown, if the secondary outlet pressure exceeds the threshold outlet pressure value at block 4408, the output of the PID control at block 4220 will be zero. If the flow control PID controller is unlocked at block 4410, the PID controller can generate an output signal for the VFD, to regulate pump speeds to achieve the set point for a flow rate of coolant through the secondary coolant loop.

At block 4414, the process 4400 can copy PID controller data of the process 4400 to PID controllers of other (e.g., of inactive) operating modes. For example, the input values and the process output signal (e.g., the error) for the process 4400 implementing the flow control mode can be sent to the PID controller for the differential system pressure control mode (e.g., as shown at block 4008 of FIG. 40) and the PID controller for the differential temperature control mode (e.g., shown at block 4012 of FIG. 40). Copying PID controller data of an active PID controller to inactive PID controllers can advantageously ensure that, if a control mode is switched (e.g., as shown in block 4404), the PID controller for the activated operating mode can start at the same working point at which the previously active operating mode left off, and interruption to the system is thus minimized.

As further illustrated in FIG. 44, at block 4416, the process 4400 can check if a bypass loop of the secondary coolant loop (e.g., the secondary loop bypass circuit 162 as illustrated in FIG. 32) is open. If at block 4416 either the bypass loop is open, or the process output signal corresponds to a pump speed that is less than a minimum pump speed, the process 4400 can proceed to call a multi-step controller (e.g., as illustrated in FIG. 43) at block 4418 to control flow through the bypass loop in order to achieve the setpoint for the operating parameter, or, in some cases, to extend or boost an uptime of the CDU. At block 4420, the output signal (e.g., the speed signal) determined at block 4412 can be sent to VFD(s) to control a speed of pump(s) of the CDU, to achieve the desired set point for the flow rate of coolant through the CDU.

Referring back to FIG. 36, outputs from the PID controllers for either or both of the pump speed (e.g., as shown at block 3616 and in FIGS. 40-44) and the temperature control (e.g., as shown in block 3614 and FIG. 39) can be output. In some embodiments, the outputs are state information for the PID controllers (e.g., gains, calculated signals, pump speeds, valve states, etc.). In some embodiments, the output values can be output to a memory of a controller of a CDU (e.g., the memory 244 of the controller 234 of the CDU 100, as illustrated in FIG. 34). In some embodiments, outputs can be displayed at a display (e.g., display 238 of CDU 100, shown in FIG. 34).

In some cases, a CDU can be operated in an uptime boost mode to improve the duration of uptime operation (e.g., to extend uptime of the CDU and downstream IT components).

In some cases, a controller (e.g., controller 234 shown in FIG. 34) may not specifically and separately define an "Uptime Boost Mode" but may rather provide this functionality transparently to an operator, as a consequence of operation under other methods and settings that can allow for improved protection of a downstream IT load.

Liquid cooled components such as in-row coolers, rear door coolers, cold plate loops, and immersion chassis can contain thin metal components that will warp or deform if the operating pressure becomes too high. An operator can define (e.g., through an interface of the CDU) a maximum allowable pressure, and a controller of the CDU (e.g., controller 234 of CDU 100, shown in FIG. 34) can operate the CDU to prevent a pressure along the secondary coolant loop from reaching or exceeding the maximum allowable pressure. In some embodiments, the maximum allowable pressure can be the sum of a static pressure of the secondary coolant loop and a pressure side differential pressure.

Further, in some cases, the total heat supplied to the CDU from downstream IT loads can exceed a heat rejection capacity of the primary coolant loop. For example, a reduction in flow through the primary loop can reduce the heat rejection capacity of the primary coolant loop, and of the CDU overall.

Figure 45:
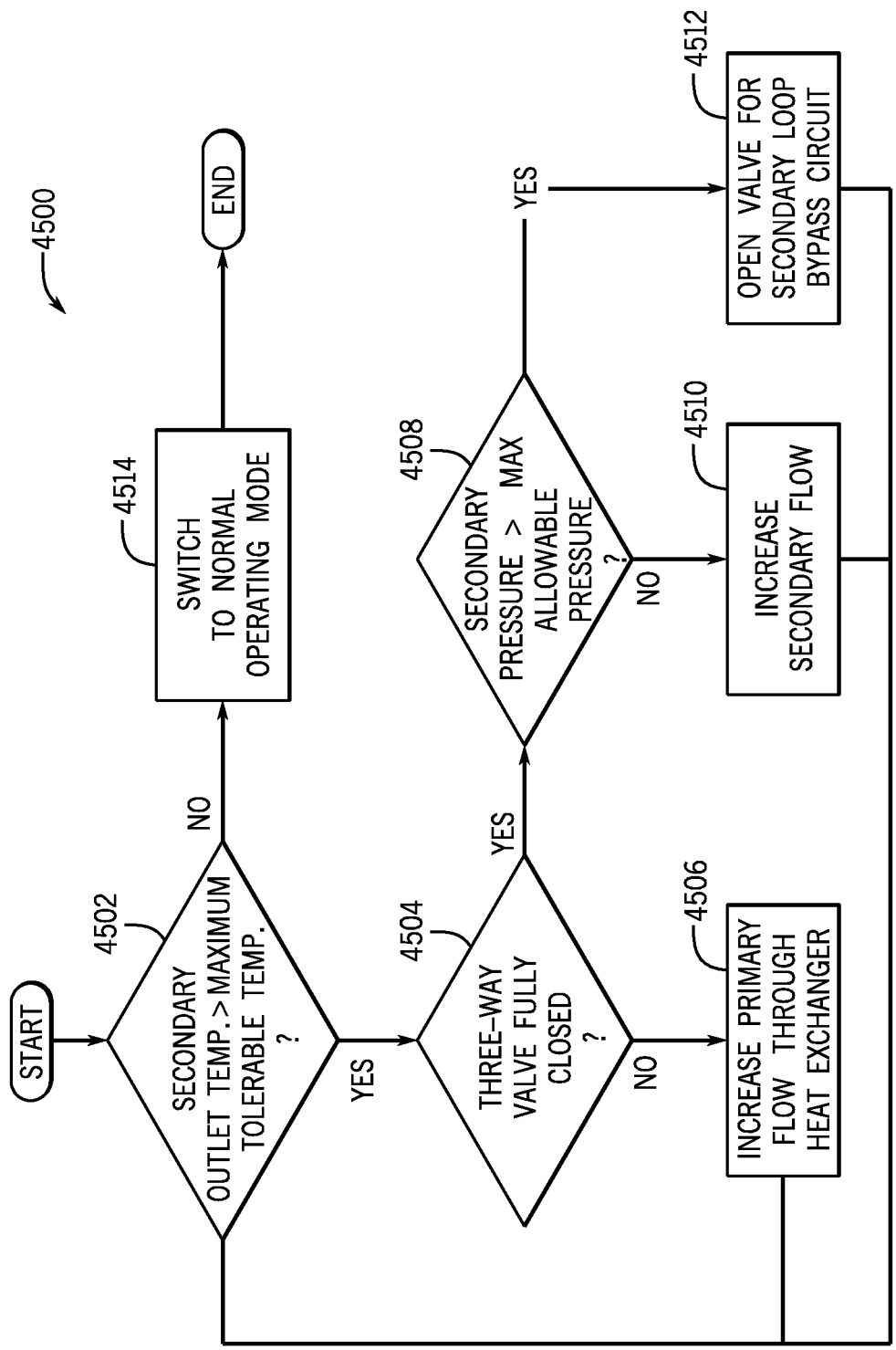
FIG. 45 is a flowchart showing an example process for implementing an uptime boost mode to extend uptime of a CDU and downstream information technology ("IT") components, according to an embodiment of the invention.

An uptime boost mode for a CDU can be implemented by a controller to extend operation of the CDU when the heat rejection capacity of the CDU is reduced. In some embodiments, an uptime boost mode can override one or more operating modes of the CDU, so that, while the CDU is operating in uptime boost mode, PID controllers of one or both of the primary and secondary coolant loops can be disabled. In this regard, FIG. 45 illustrates an example process 4500 which can be executed by a controller of a CDU to extend an uptime of the CDU and downstream IT components (e.g., by preventing a thermal shutdown of the CDU or downstream IT components, and preventing damage due to overpressure). At block 4502, the process 4500 can evaluate whether a temperature of the secondary outlet exceeds a maximum tolerable temperature for the secondary coolant loop. In some embodiments, the maximum allowable temperature can be defined by an operator of the CDU. In some embodiments, a temperature can be measured at another location along the secondary coolant loop, and compared to a maximum tolerable temperature at block 4502.

As further illustrated in FIG. 45, if the secondary outlet temperature exceeds the maximum allowable temperature, the process 4500 can proceed to block 4504, and a state of a three-way valve (e.g., the three-way valve 158 shown in FIG. 22) can be evaluated. The three-way valve can be controlled to increase flow of coolant in the primary coolant loop through a HX (e.g., HX 142 shown in FIG. 22), and thus increase a heat transfer from the secondary coolant loop to the primary coolant loop. If the three-way valve is not fully closed, at block 4506, flow of the primary coolant loop through the HX can be increased by at least partially closing the three-way valve. In some embodiments, the three-way valve can be fully opened at block 4506 to achieve maximal flow of the primary coolant loop through the HX, and thus maximum heat transfer from the secondary coolant loop to the primary coolant loop. In some embodiments, the three-way valve can be partially closed at block 4506 to incrementally increase flow of the primary coolant loop through the HX. In some cases, a degree to which the three-way valve is closed at block 4506 can correspond to a difference between the secondary outlet temperature and the maximum allowable temperature (e.g., the three-way valve can be controlled for a larger difference between the secondary outlet temperature and the maximum allowable temperature to produce greater primary flow through the HX relative to a flow produced by a smaller difference between the secondary outlet temperature and the maximum allowable temperature).

Figure 33:
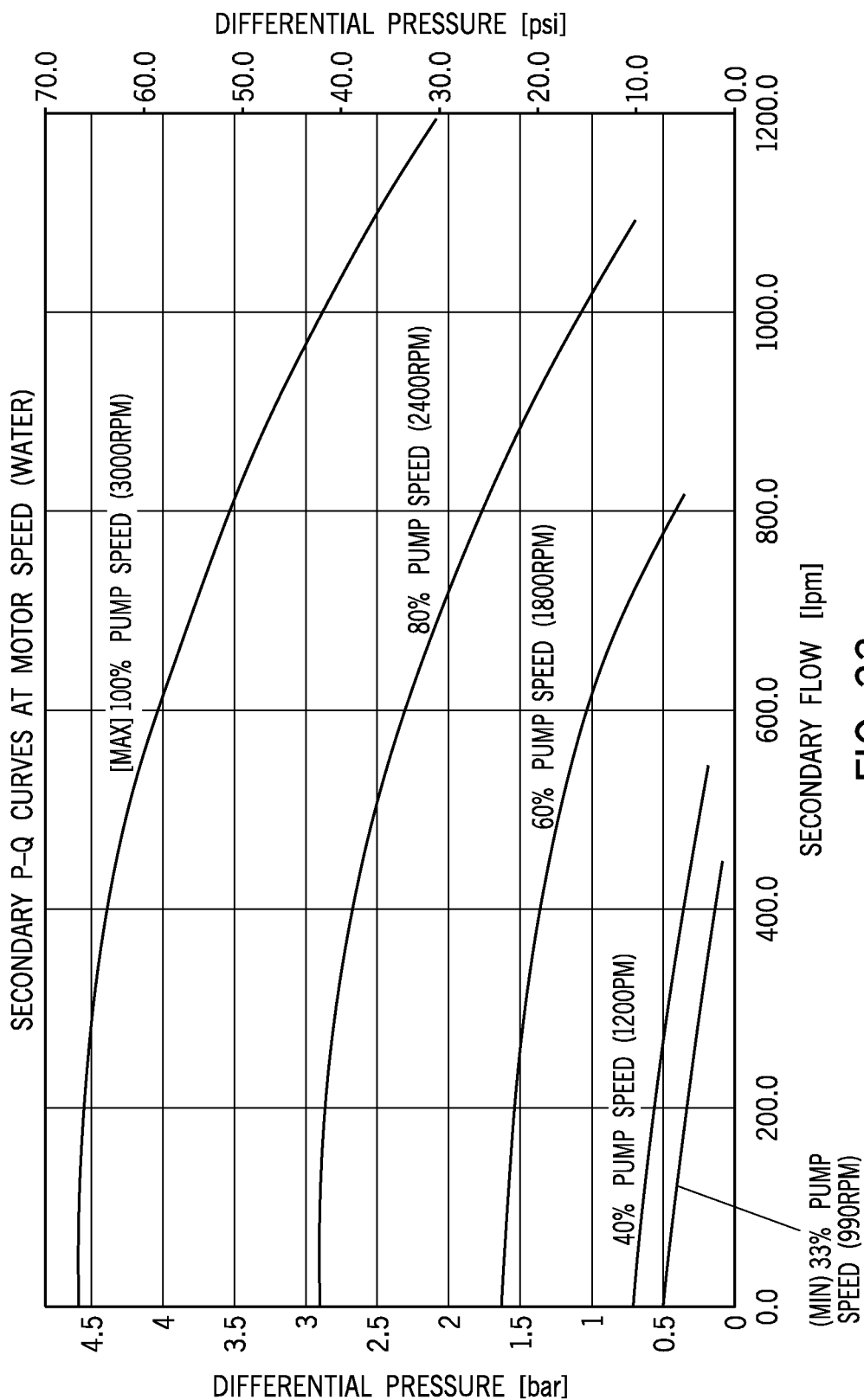
FIG. 33 is a graph showing P-Q curves for motors of pumps of a secondary coolant loop of a CDU, showing performance aspects of the motors at different operating speeds.

If the three-way valve is fully closed at block 4504 (e.g., primary flow through the HX is maximal), the process 4500 can proceed to block 4508, and a pressure of the secondary coolant loop can be compared to the maximum allowable pressure. In some cases, increased flow through the secondary coolant loop can increase a pressure within the secondary coolant loop beyond a safe operating pressure (e.g., a maximum allowable pressure). For example, as shown in the pump flow and pressure curve illustrated in FIG. 33 increasing pump speed with a fixed downstream pressure drop can increase a net static and differential pressure in the secondary loop.

In this regard, referring back to FIG. 45, in some embodiments the pressure compared to the maximum allowable pressure at block 4508 is a pressure measured at a secondary outlet of the CDU (e.g., secondary outlet 120b, illustrated in FIG. 32). In other embodiments, the secondary pressure compared to a maximum allowable pressure can be measured at any point along the secondary coolant loop. If the secondary pressure does not exceed the maximum allowable pressure, at block 4510, a speed of one or more pumps along the secondary coolant loop can be increased to increase a flow through the secondary coolant loop. In some embodiments, when a flow of the secondary coolant loop is increased, a differential temperature between a secondary inlet and secondary outlet is decreased. Increasing secondary flow and decreasing the differential temperature between the secondary inlet and secondary outlet, can decrease a rate at which a temperature of coolant entering the CDU through the secondary inlet increases, and can thus extend the amount of time a downstream load can continue operating before a thermal shut down.

If, at block 4508 the pressure of the secondary coolant loop exceeds the maximum allowable pressure at block 4508, a valve of a secondary loop bypass circuit (e.g., valve 166 of secondary loop bypass circuit 162, illustrated in FIG. 19) can be opened at block 4512. Opening the valve at block 4512 can allow coolant of the secondary coolant loop to flow directly from the secondary inlet to the secondary outlet, bypassing a HX and pumps of the CDU, and thus relieving (e.g., reducing) the differential pressure to the downstream network. In some embodiments, allowing coolant of the secondary coolant loop to bypass the pumps can result in reduced secondary flow, but the net functional result will be to allow the overall secondary flow to continue increasing up to a maximum pump speed or until sufficient cooling capacity is regained from the primary loop. In some embodiments, the valve for the secondary loop bypass loop can be fully opened at block 4512. In some embodiments, the valve of the secondary loop bypass circuit can be partially opened. In some embodiments, some or all of the multi-step controller process 4300 shown in FIG. 43 can be used to control a valve of the secondary loop bypass circuit when the CDU is operating in an uptime boost mode.

Upon completion of any or all of blocks 4506, 4510, or 4512, the process 4500 can again evaluate a temperature of the secondary coolant loop at block 4502 to determine if cooling capacity has been restored to the CDU. In some cases, flow can be restored to the primary coolant loop, and consequently, a heat transfer rate can be increased, and a temperature of the secondary coolant loop can be reduced beneath a maximum tolerable temperature. Thus, if, at block 4502, the secondary outlet temperature is beneath the maximum tolerable temperature, the process 4500 can proceed to block 4514, and the CDU can return to a normal operating mode (e.g. any or all of the control modes illustrated in FIGS. 40-44). In some cases, returning to a normal operating mode at block 4514 can include reducing pump speeds of the CDU. In some embodiments, at block 4514, returning to a normal operating mode can include restoring a state of each or all of the three-way valve, the valve of the secondary loop bypass circuit, and the pumps to a normal operating range, or to a state at which the respective components were operated before the CDU entered uptime boost mode.

As discussed above, a CDU (e.g. CDU 100 shown in FIG. 1) can include dual pumps (e.g., pumps 168a, 168b shown at least in FIG. 13). Dual pumps of a CDU can provide redundancy to the CDU, which can allow a CDU to continue operation when one of the dual pumps is defective, or when a pump is removed for maintenance, for example. In some cases, dual pumps can be operated simultaneously to increase a flow in a secondary coolant loop of the CDU. In some embodiments, only a single pump is operational at a given time, and dual pumps of the CDU can alternate operation to evenly distribute wear on each pump.

In this regard, different pump operating modes can be provided for dual pumps of a CDU (e.g., pumps 168a, 168b illustrated in FIG. 13) according to some embodiments. An operator can select a pump operating mode through an interface of the CDU (e.g., a UI, an API, or a CLI). For example, a single pump mode without switchover can be provided for dual pumps of a CDU.

In some embodiments, a single pump mode can be provided for a CDU. In a single pump mode a single pump of the dual pumps is active at a given time, and provides pressure and flow to the secondary coolant loop. Further, in single pump mode, the pumps can alternate operation at regular time intervals. For example, in a first time interval, a first pump of the dual pumps can be active, and a second pump of the dual pumps can be inactive. At the expiration of the first time interval, the first pump can become inactive, and the second pump can be activated to provide flow through the secondary coolant loop, and the second pump can remain active until the expiration of a second time interval, when the first pump activates and the second pump becomes inactive. In some embodiments, an operator can configure the time interval at which dual pumps alternate or switch operations. In some embodiments, when a fault occurs for an active pump, or when the active pump is deactivated, the inactive pump can be activated, and can thus prevent downtime of the CDU or interruption to the operation of the CDU.

In some examples, a single pump mode without switchover can be provided for dual pumps of a CDU. In the single pump mode without switchover, only a single pump is operational at a given time. Further, in single pump mode, one of the dual pumps is designated as a primary pump, and the other of the dual pumps is designated as a standby pump. The primary pump can remain active (e.g., supplying pressure to the secondary coolant loop) until the primary pump is shut down, as when a fault occurs, or the primary pump is removed for maintenance. In some cases, a "release" flag can be set for one or multiple pumps at a controller of the CDU (e.g., through input(s) 240 shown in FIG. 34). A release flag can digitally indicate that a pump is available for operation. In some embodiments, an operator can set or remove a release flag for one or more dual pumps of a CDU. In some embodiments, a release flag can be removed by the controller in response to an error or fault. When a release flag is removed for a pump, the pump can be removed from operation. In single pump mode, then, when the primary pump is not operational (e.g., due to a fault, maintenance, or because a release flag has been removed for the pump) the standby pump can become active and can supply pressure to the secondary loop.

In some embodiments, a CDU can be operated in dual pump mode, wherein both pumps are operational at the same time. Operating a CDU in dual pump mode can increase a flow in the secondary coolant loop. In dual pump mode, when one of the dual pumps becomes inactive, the remaining pump continues to induce flow through the secondary coolant loop.

Figure 46A:
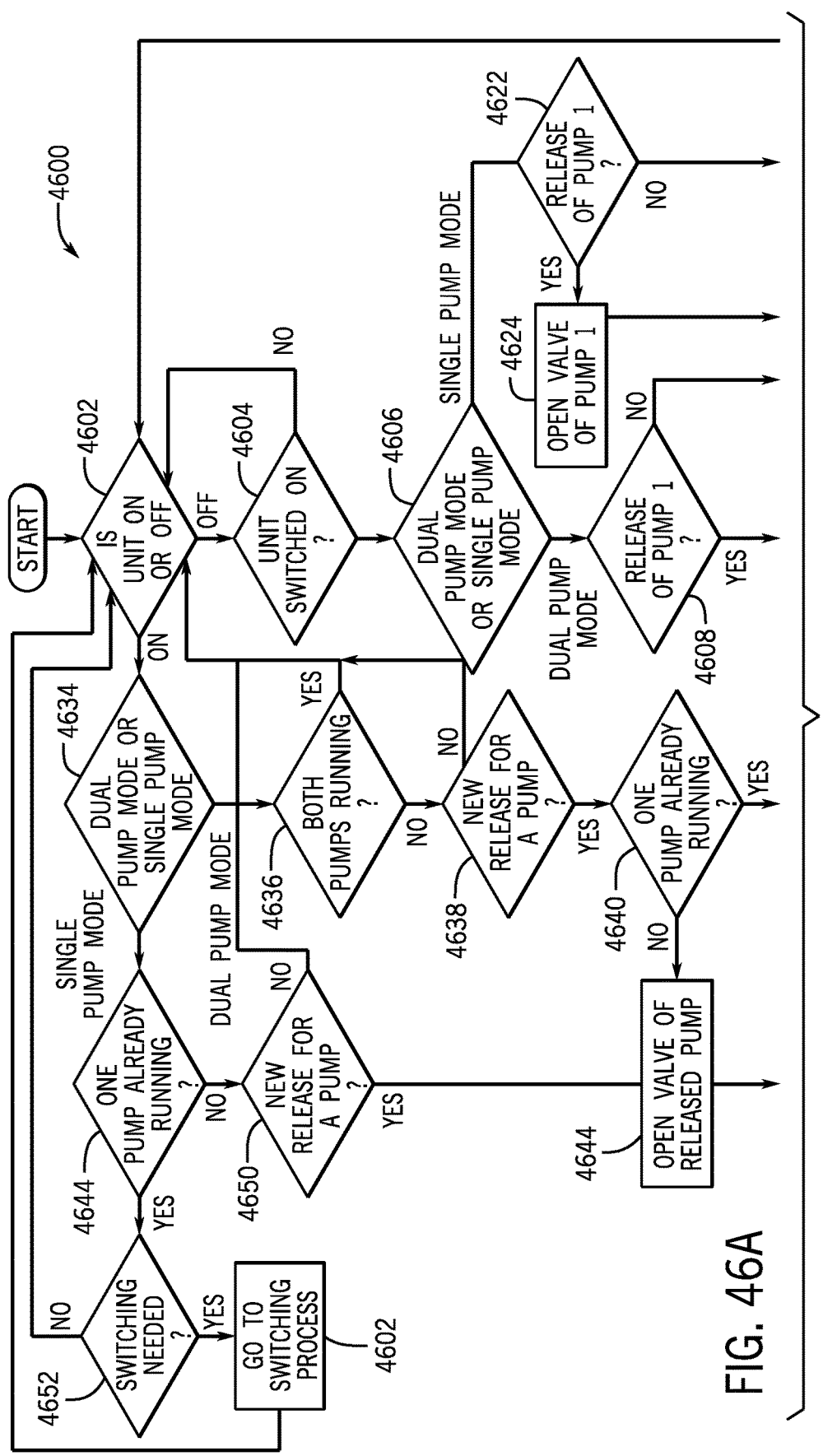
FIG. 46 is a flowchart showing an example process for implementing pump operating modes for pumps of a secondary coolant loop of a CDU, according to an embodiment of the invention.
Figure 46B:
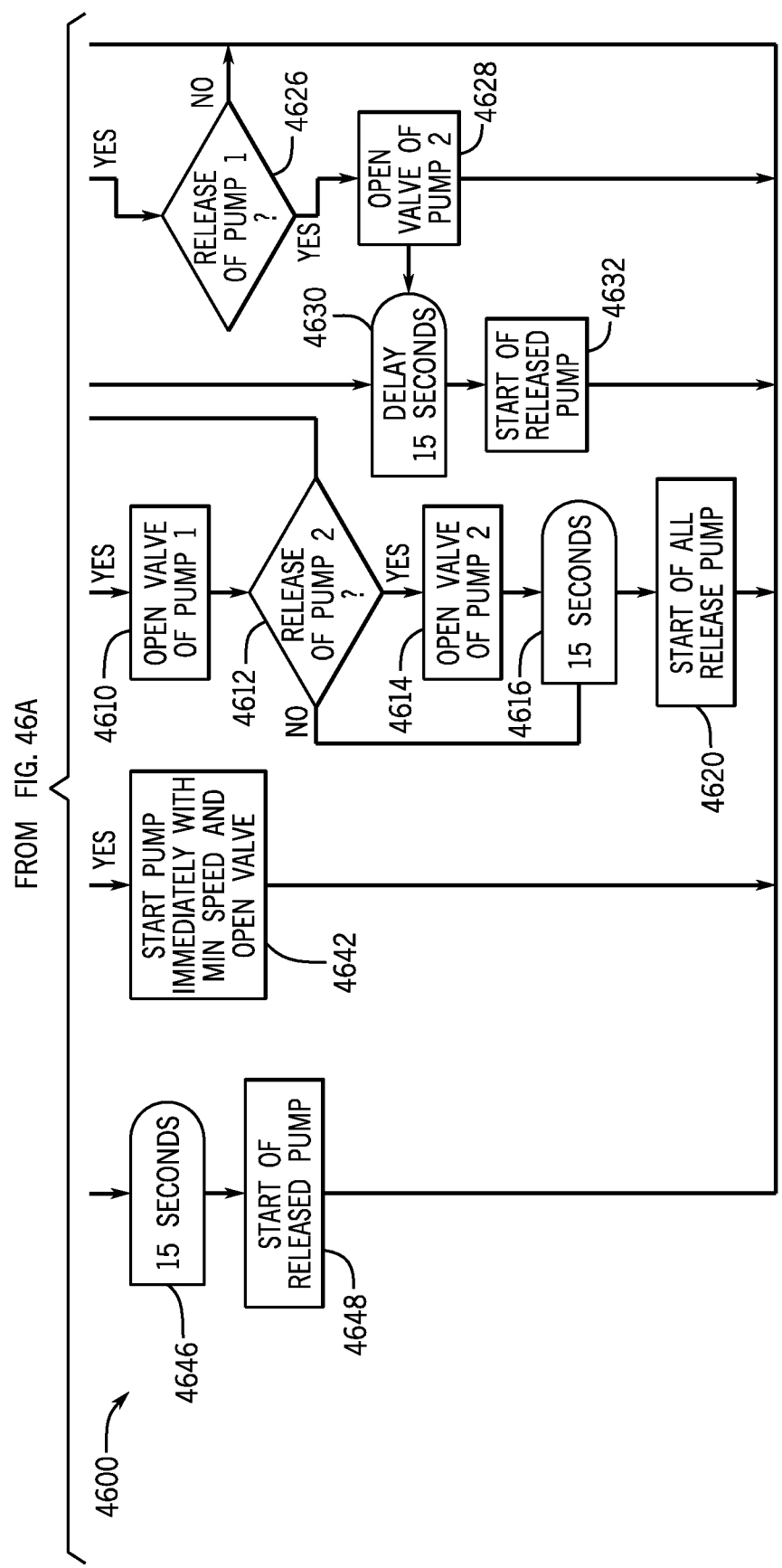

For each pump operating mode, pumps of a CDU can be required to meet conditions before the pump is started. In this regard, FIG. 46 illustrates an example process 4600 for starting pumps of a CDU. At block 4602, the process 4600 can check whether the CDU (i.e., the "unit") is on or off. If the CDU is off, the process 4600 can proceed to check if the unit is switch on at block 4604. If the CDU is not switched on at block 4604, the process can return to block 4602, and can continue evaluating blocks 4602 and 4604 until the unit is switched on. When the unit is switched on, the process 4600 can proceed from block 4604 to block 4606, and a pump operating mode can be checked. In some embodiments, a default pump operating mode can be specified for a CDU, and can be implemented when the CDU is started. In some embodiments, on startup, a CDU can require input from an operator to specify a pump operating mode.

If the CDU is in dual operating mode, at block 4608, a release of a first pump of the dual pumps (i.e., pump 1) is checked. If the release flag is set for the first pump, at block 4610 a first valve (e.g., one of upstream shutoff valves 186a, 186b illustrated in FIG. 32) can be opened to allow flow of coolant of the secondary coolant loop through the first pump. If, at block 4608, the release flag for the first pump is not set, or upon opening the first valve at block 4610, the first valve is not opened, and the process 4600 can proceed directly to block 4612 to check a release flag of a second pump (i.e., pump 2) of the dual pumps. If the release flag is set for the second pump, at block 4614a second valve (e.g., one of upstream shutoff valves 186a, 186b illustrated in FIG. 32) can be opened to allow flow of coolant of the secondary coolant loop through the second pump. If the release flag for the second flag is not set at block 4612, or upon opening the second valve at block 4614, a delay can be implemented at block 4616. In some cases, a delay can advantageously allow coolant of the secondary coolant loop to flow through pumps before the pumps begin operation. In the illustrated embodiment, the delay is fifteen seconds, however, in other embodiment, a delay can be more than fifteen seconds or less than fifteen seconds. In some embodiments, a process for starting pumps of a CDU can omit a delay. At block 4620, all pumps for which a release flag is set can be started.

If, at block 4606, the CDU is operated in single pump mode, the process 4600 can check the release flag for the first pump at block 4622. If the release flag for the first pump (which can be the primary pump, as discussed above) is set, at block 4624, the first valve can be opened, allowing flow through the first pump. If at block 4622, the release flag for the first pump is not set, the process 4600 can check the release flag for the second pump at block 4626. If the release flag for the second pump is set at block 4626, the process can proceed to block 4628 and can open the second valve, allowing flow through the second pump. Thus, as shown, when the CDU is operated in single pump mode, only one of the first valve and the second valve is opened, and flow is permitted through only one of the first pump and the second pump. At step 4360, after either the first valve is opened at block 4624 or the second valve is opened at block 4628, a delay can be implemented at block 4630. In the illustrated embodiment, the delay is fifteen seconds, however, in other embodiment, a delay can be more than fifteen seconds or less than fifteen seconds. In some embodiments, a process for starting pumps of a CDU can omit a delay. At block 4632, if the release flag for the first pump is set at block 4622, the first pump can be started. If the release flag for the first pump is not set at block 4622, and the release flag for the second pump is set at block 4626, the second pump can be started at block 4632.

If at block 4602, the CDU is on (e.g., the CDU is not being started up), the process 4600 can proceed to block 4634, and the process 4600 can evaluate if the CDU is operating in single pump mode or dual pump mode. As shown, the process 4600 can be executed in a loop, and the process can evaluate block 4634 at every iteration of the loop. In some embodiments, an operator can change the pump operating mode during execution of the process 4600, and the process 4600 can detect the change at block 4634.

At block 4636, if the CDU is operating in dual pump mode at block 4634, the process 4600 can check if both pumps are running. If both pumps are running at block 4636, a loop of the process 4600 can be completed, and the process can return to block 4602.

At block 4638, if at least one of the dual pumps of the CDU is not running, the process 4600 can evaluate if a new release flag is set at a controller of the CDU for a pump. In some embodiments, the release flag, as discussed above, can be set by the operator of the CDU. In some embodiments, the release flag is set upon a change of condition or state of the CDU (e.g., upon resolution of an error or critical error). If a new release flag is not set at block 4638, a loop of the process 4600 can be completed, and the process can return to block 4602.

At block 4640, if there is a new release flag set for a pump at block 4638, the process 4660 can evaluate if a pump is already running. If one pump is already running, at block 4642 the other of the dual pumps can be started immediately, and a valve (e.g., the upstream shutoff valve 186 for the pump 168) can be opened to allow flow of fluid through the newly started pump. In some embodiments, at block 4640, the newly opened pump can be started at a minimum pump speed. In other embodiments, the pump can be started at a speed that is calculated to achieve set point for an operating parameter of the CDU. Upon starting the pump and opening the valve to allow flow through the pump at block 4642, an iteration of the loop of process 4600 can be complete, and the process can proceed to block 4602.

If, at block 4640, the process 4600 determines that there is no running pump of the CDU, the process 4600 can proceed to block 4644, and can open a valve of the pump (e.g., the upstream shutoff valve 186 for the pump 168) for which the release flag was newly set (e.g., as determined at block 4638). In some embodiments, at block 4644, because no pumps of the CDU are in operation, there can be minimal or no flow through the CDU and opening the valve to allow flow through the newly-released pump can allow coolant of the secondary coolant loop to flow through the pump and other piping and components of the secondary coolant loop downstream of the pump before the pump is started. At block 4646, a delay can be implemented in the process 4600. The delay can provide time for fluid to flow through the pump and downstream piping of the secondary coolant loop of the CDU before the pump is started. In some embodiments, as illustrated, the delay can be 15 seconds. In other embodiments, the delay implemented at block 4646 can be more than 15 seconds, or less than 15 seconds. In some embodiments, a duration of the delay implemented at 4646 can be a configurable setting that can be set by an operator of the CDU.

At block 4648, the pump for which the released flag was set can be started, and flow of coolant through the secondary coolant loop can thereby be induced. In some embodiments, the pump can be started at a minimum pump speed. In some embodiments, the pump can be started at a preset pump speed. In some embodiments, the pump can be started at a speed that is at least determined to achieve a set point for an operating parameter of the CDU, as described above. Upon starting the pump at block 4648 4642, an iteration of the loop of process 4600 can be complete, and the process can proceed to block 4602.

If, at block 4634, the CDU is not operating in dual pump mode, the process 4600 can determine if one of the pumps is running at block 4650. If no pumps are running at block 4644, the process 4600 can check if there has been a new release for a pump at block 4650 (e.g., similar or identical to block 4638). If a new release has been set for a pump, the process can proceed to execute one or more of blocks 4644, 4646, and 4648, as described above, to start the pump for which the release flag has been set.

If, at block 4644, the process 4600 determines that one of the dual pumps of the CDU is running, at block 4652, the process can evaluate if switching is needed between the pumps of the dual pumps. In some embodiments, including where the CDU is operating in single pump mode without switchover, as described above, the process can determine that switching is not needed at block 4652. In some embodiments, if the CDU is operating in single pump mode (e.g., with switchover) the process 4600 can determine if a switchover criteria has been met. In some embodiments, pumps of a CDU operating in single pump mode can be configured to switch over at regular time intervals, and block 4652 can evaluate if time for which a pump has been active equals or exceeds the regular time interval. If, at block 4652, the process 4600 determines that no switching is needed, an iteration of the loop of process 4600 can be complete, and the process can proceed to block 4602.

Figure 47:
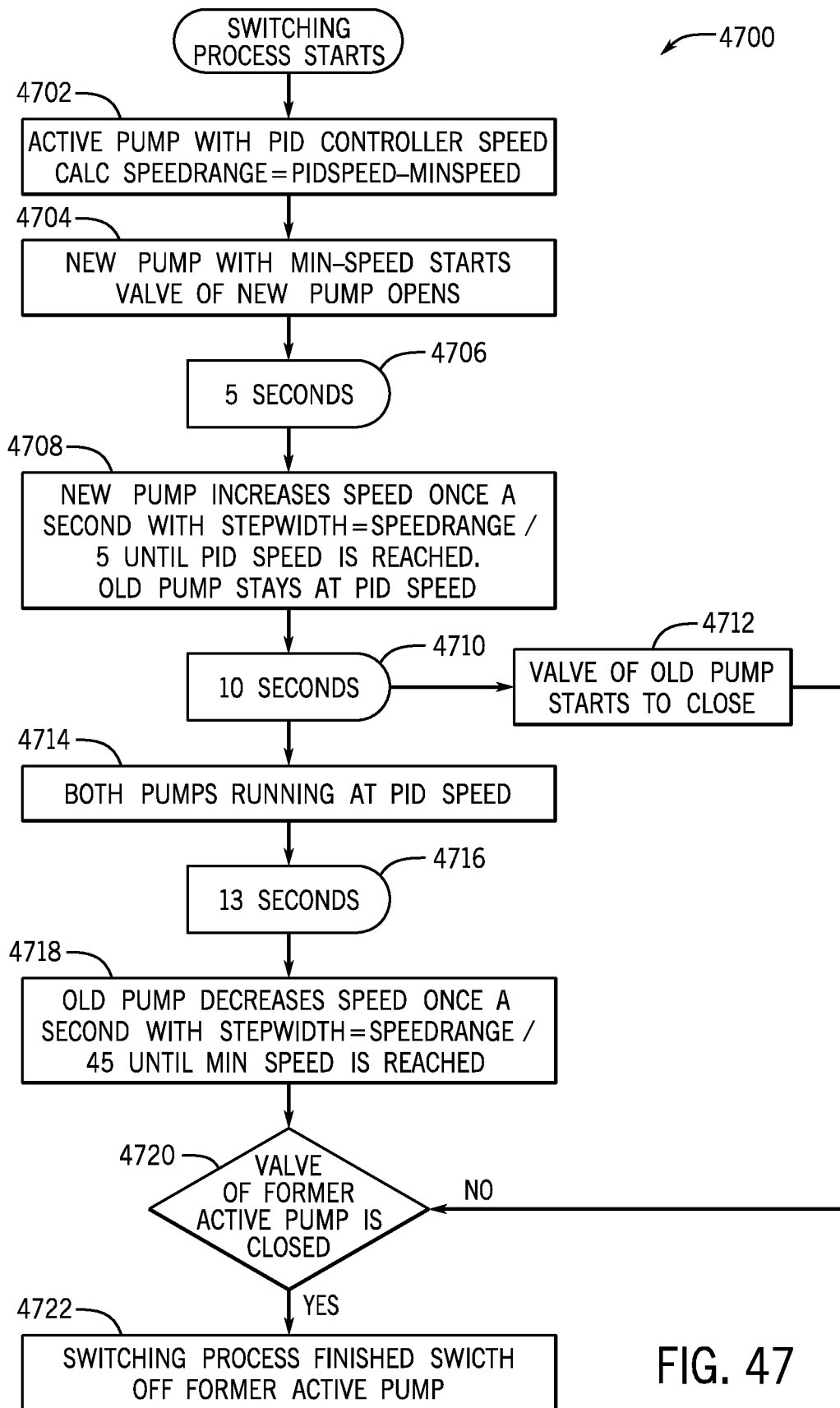
FIG. 47 is a flowchart showing an example process for switching between active pumps in a single pump operating mode, according to an embodiment of the invention.

If switching is needed at block 4652, the process can initiate a switching process at block 4654. The switching process can start the non-active pump of the dual pumps and shut down the active pump of the dual pumps. FIG. 47 illustrates an example process 4700 for switching pumps of a CDU, and the process 4700 can be implemented at block 4654 of process 4600. The switching process can be executed by a controller of the CDU (e.g., controller 234, which can issue signals to VFDs 252 to achieve desired pump speeds for pump motors 182 shown in FIG. 34). The switching process 4700 can operate to activate a previously inactive pump, and increase a speed of the previously inactive pump to a speed set by a PID controller (e.g., PID controllers described with respect to FIGS. 40-44).

At block 4702, the switching process 4700 can calculate, for an active pump, a speed range. As shown, the speed range can be a difference between a speed of the pump set by the PID controller and a minimum pump speed. In other embodiments, a speed range can be calculated using other techniques. In some embodiments, a speed range can be a range between a minimum pump speed and a default preset pump speed.

At block 4704, a valve for a non-active pump can be opened and the non-active pump can be started. In some embodiments, as shown, the non-active pump can be started at a minimum pump speed (e.g., a minimum pump speed specified by a manufacturer or a minimum pump speed set at a controller of the CDU). After the non-active pump is started, a delay can be implemented at block 4706. In the illustrated embodiment, the delay is five seconds. In other embodiments, a delay can be more than five seconds or less than five seconds. In some embodiments, the delay can be configurable by an operator of the CDU. In some embodiments, there is no delay implemented at block 4706.

At block 4708, the speed of the previously non-active pump can be increased. The speed can be increased in increments until a target speed is reached by the previously non-active pump. In some embodiments, as shown, the speed can be increased once a second until the target speed is reached. In other embodiments, the speed can be increased about once every half second, once every two seconds, once any three seconds, once every four seconds, or once every five seconds. In some embodiments, an operator can set an interval at which the speed of the previously non-active pump can be increased at block 4708. In some embodiments, the target speed for the previously non-active pump is the speed set by the PID controller. In some embodiments, the pump speed increase increments can be calculated based on the speed range determine at block 4702. For example, in the illustrated embodiment, the pump speed increase increments (i.e., the step width shown in FIG. 47) can be a fifth or 20% of the speed range. A speed of the previously inactive pump could then be increased five times to reach the speed set by the PID controller. In other embodiments, a pump speed increase increment can be a larger or smaller portion of the speed range, which can result in more incremental increases in the speed of the previously non-active pump. In some cases, increasing a number of incremental increases in the speed of the previously inactive pump can increase a time until the pump reaches the speed set by the PID controller. The old pump (e.g., the active pump) can continue to operate at the speed set by the PID controller, and when block 4708 is implemented, both the old pump and the previously inactive pump can be running simultaneously, each operating at the speed set by the PID controller.

After the previously non-active pump is reaches the target speed (e.g., the speed set by the PID controller), a delay can be implemented at block 4710. In the illustrated embodiment, the delay is ten seconds. In other embodiments, a delay can be more than ten seconds or less than ten seconds. In some embodiments, the delay can be configurable by an operator of the CDU. In some embodiments, there is no delay implemented at block 4710.

At block 4712, a valve of the old pump (e.g., one of the upstream shutoff valves 186 shown in FIG. 19) can begin to shut. In some embodiments, the valve can require a time period to fully shut. As the valve is closed, flow of coolant through the old pump can be progressively restricted, and flow through the previously inactive pump can increase.

At block 4714, both the old pump and the previously inactive pump can be running at the speed set by the PID controller. The old pump can continue running at the speed set by the PID controller during at least part of the closure of the valve at block 4712. In some embodiments, both pumps can be operating at the speed set by the PID controller for a predetermined length of time. For example, as illustrated, at block 4716, the process 4700 can implement a delay, during which no change is made to the speed of either the previously inactive pump or the old pump. In some embodiments, including as illustrated, the delay can be 13 seconds. In other embodiments, a delay can be more than thirteen seconds, less than thirteen seconds, or zero seconds (e.g., no delay).

At block 4718, a speed of the old pump can be incrementally reduced until the old pump reaches the minimum pump speed. A speed reduction increment for the old pump can be determined based at least in part on the speed range calculated at block 4702. For example, in the illustrated embodiment, the speed reduction increment is $1/45$ of the speed range, and thus, the speed of the pump can be incrementally reduced forty-five times before the pump reaches the minimum speed. In some embodiments, the speed is incrementally reduced once a second. In other embodiments, the speed of the old pump can be reduced at different time interval, which, in some cases, can be configured by an operator of the CDU. In some embodiments, the operator can set a speed reduction increment which can be more than $1/45$ of the speed range, or less than $1/45$ of the speed range. In some embodiments, a speed reduction increment can be a preset speed reduction amount, and is not calculated based on the speed range.

At block 4720, the process 4700 can evaluate a state of the valve of the old pump, to determine if the valve is closed. If the valve is open, the process 4700 returns to block 4712, and the process 4700 can continuously evaluate a state of the valve until the valve is fully closed. If, at block 4720, the valve is fully closed, the process can implement block 4722, and the old pump can be switched off.

In some embodiments, a refill procedure can be implemented (e.g., by the controller 234 or by an operator of the CDU) to maintain a pressure of the secondary coolant loop. For example, when a system of the CDU determines that a pressure of the secondary coolant loop is lower than a threshold amount (e.g., as determined at block 3612 shown in FIG. 36), a refill procedure can be implemented to pump coolant from a reservoir of the CDU (e.g., fill tank 208 shown in FIG. 4) into the secondary coolant circuit. In some embodiments, a refill procedure can be manually implemented by an operator of the CDU. In some embodiments, the refill procedure can be automatically implemented based on a condition or state of the CDU (e.g., an error of the CDU, a detected pressure along the secondary coolant loop, a detected differential pressure, etc.).

Figure 48:
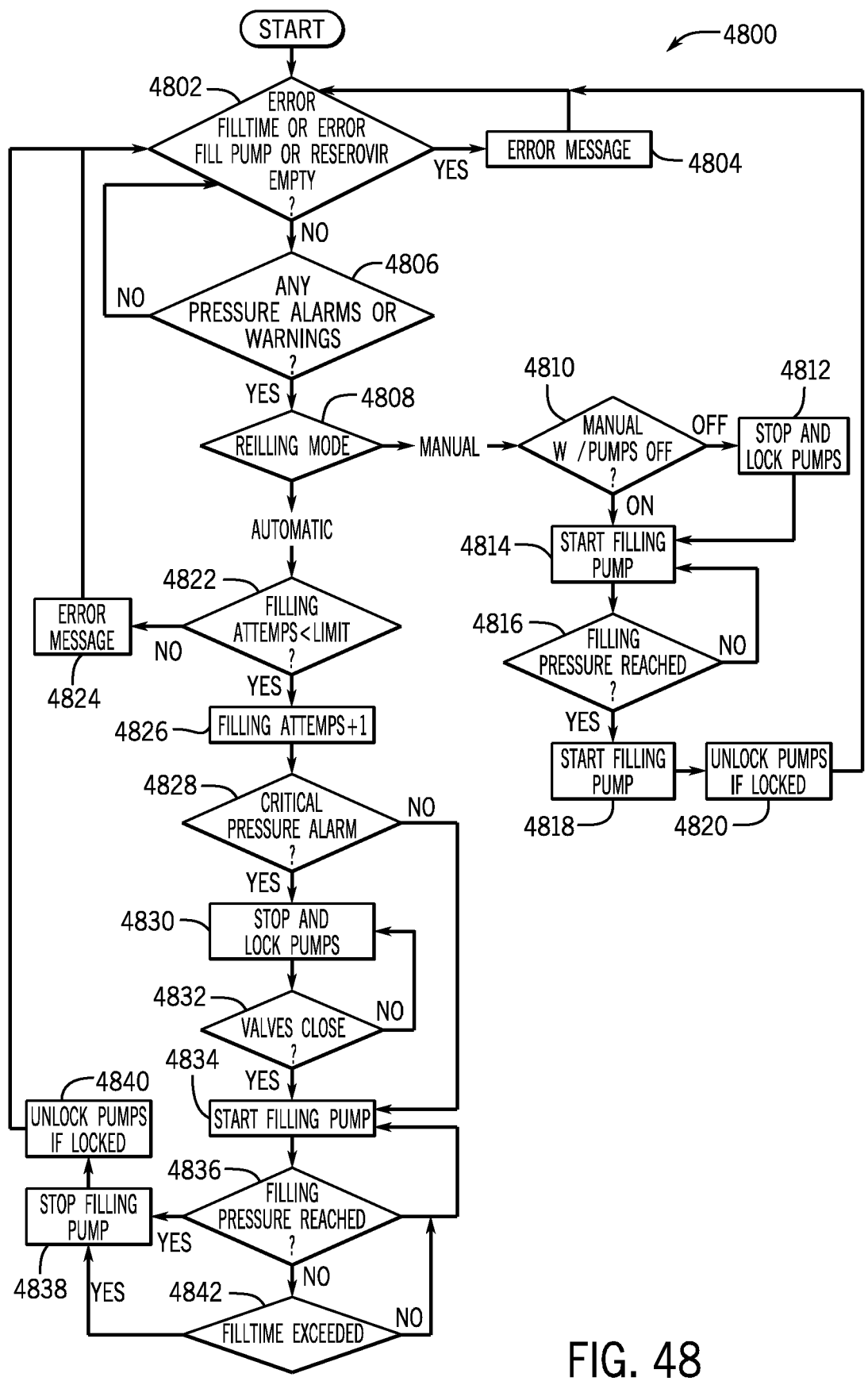
FIG. 48 is a flowchart showing an example refill process for refilling coolant of a secondary loop of a CDU, according to an embodiment of the invention.

In this regard, FIG. 48 illustrates an example process 4800 for refilling a coolant of a secondary coolant loop of a CDU. In some cases, a condition or state of the CDU can render a refill process unsafe or unfeasible, and can prevent refilling of the secondary coolant circuit. At block 4802, the process 4800 can check for errors that could prevent refilling of the secondary coolant loop. For example, as shown, an error could indicate that a reservoir (e.g., fill tank 208 shown in FIG. 4) is empty, or that a fill pump (e.g., fill pump 212 shown in FIG. 32) is not operational, or that a designated fill time has been exceeded. In some embodiments, an operator can select conditions for a refilling process to evaluate before initiating a refill, which could include any fault designated by the operator. If an error is identified at block 4802, the process can raise an error at block 4804 which can indicate that a refill process cannot be initiated. The process can continue to evaluate block 4802 until errors preventing initiation of a refill are resolved.

If at block 4802 there are no errors preventing a refill, the process 4800 can proceed to identify errors of the system which can indicate a need to initiate a refill process at block 4806. For example, as illustrated, at block 4806, the process 4800 can check if there are any pressure alarms or warnings outstanding. A low pressure alarm can indicate a need to refill the secondary coolant loop. In some embodiments, errors or warnings for low pressure which can be used to initiate a refill process can be obtained from any of pressure sensors 228c, 228d, 228e, 228f, 228g, or 228h, as illustrated in FIG. 32. In some embodiments, an error or warning that can be used to initiate a refill process can be from a pressure sensor of the secondary coolant loop with the lowest pressure value at a given time. In some embodiments, alarms for other conditions of a CDU can initiate a refill process. For example, if a leakage detection system detects a threshold amount of leakage, an error or warning can be generated, and the refill process can be initiated based on that error to replace the coolant leaked from the secondary coolant loop. In some embodiments, an operator can define errors and warnings which can initiate a refill process. If at block 4806 no errors or warnings are identified that can initiate the refill process, an iteration of the loop executed by process 4800 can be complete, and the process can return to block 4802.

If a warning or error is identified at block 4806 that indicates a need to refill the secondary coolant loop, the process 4800 can proceed to block 4808 to check a mode of the refill process 4800. A CDU can include multiple modes for a refill process, and in some embodiments, an operator can select a refill mode in which to operate the CDU. Modes for a refill process of a secondary loop of a CDU can include an automatic mode, a manual mode, and a manual mode with pumps (e.g., pumps 168a, 168b) turned off. If, at block 4808 the mode in which the refill process is executed is manual, the process can proceed to block 4810, where the system can determine if the manual mode is a manual mode with pumps off (e.g., pumps 168a, 168b of the secondary coolant loop), or manual mode with pumps running. If the mode is manual with pumps off at block 4810, then pumps of the secondary coolant loop can be locked (e.g., turned off, or stopped) at block 4812. In some embodiments, block 4812 can be performed by an operator of the CDU. In some embodiments, locking pumps manually can include removing a release flag for the pumps 168a, 168b of the CDU 100 (e.g., as illustrated in FIG. 32) via a UI (e.g., through UI 5000 shown in FIG. 50). Locking pumps of a secondary coolant loop can reduce a pressure in the secondary coolant loop, and can thus reduce a load on a pump (e.g., pump 212) used to refill the secondary coolant loop.

At block 4814, the operator can start a filling pump of the CDU (e.g., filling pump 212 of CDU 100 illustrated in FIG. 32). Starting the filling pump in a manual mode can include providing an input (e.g., at input 240 illustrated in FIG. 34) at an interface of the CDU (e.g., a UI, API, or CLI) to start the filling pump. In some embodiments, a physical switch can be provided for a filling pump, and an operator can manually switch the filling pump on or off using the physical switch.

At block 4816, a pressure of the secondary coolant loop can be evaluated to determine if a filling pressure has been reached. In some embodiments, the filling pressure can be a configuration or setting of the CDU which can be provided by an operator. In some embodiments, an alert can be provided to an operator when the filling pressure is reached (e.g., a fault can be generated, a sound can be produced, a notification can be provided to a device of the operator, a message can be displayed at a display of the CDU, etc.). If the filling pressure is not reached, the filling pump can continue to provide coolant to the secondary coolant loop.

When a pressure of the secondary coolant loop reaches the filling pressure, the filling pump can be stopped at block 4818. Stopping the filling pump can be performed at an interface of the CDU, as described with respect to starting the filling pump at block 4814. In some embodiments, an operator can switch a filling pump off using a physical switch.

At block 4820, if pumps of the secondary coolant loop were stopped at block 4812, at block 4820, the pumps can be unlocked. In some embodiments, unlocking the pumps can include setting a release flag for each of the pumps through an interface of the CDU (e.g., through the UI 5000 shown in FIG. 50). In some embodiments, the pumps can be started by a controller of the CDU (e.g., controller 234 shown in FIG. 34). In some embodiments, a pump control process can be continuously run (e.g., process 4600 shown in FIG. 46) and when the pump control process identifies a release flag for a pump, the pump control process can start the pump. Upon completion of block 4820, an iteration of the loop performed by process 4800 can be complete, and the process can return to block 4802.

In some embodiments, if at block 4810 the refill mode is manual with pumps of the secondary coolant loop running, an operator of the CDU can omit block 4812, and can proceed to start the refill pump at block 4816 while the pumps of the secondary coolant loop are running. The process can proceed to block 4816, 4818, and 4820 as described above, and can thus complete an iteration of a loop of process 4800, returning to block 4802.

If, at block 4808, the refilling mode of the secondary coolant loop is automatic, the process 4800 can evaluate if a number of filling attempts has exceeded a limit for the number of filling attempts. In some embodiments, a limit can be defined for a number of filling attempts that can be automatically attempted (e.g., executed by controller 234 of CDU 100 illustrated in FIG. 34). For example, continuing to unsuccessfully refill the secondary coolant loop can cause damage to components of a fill kit assembly (e.g., the fill kit assembly 206 illustrated in FIG. 32) or to components of the secondary coolant loop. Imposing a limit on the number of unsuccessful attempts to refill the secondary coolant loop can thus preserve components of the CDU. If the number of unsuccessful refill attempt reaches the limit, an error message can be generated at block 4824, and can be provided to the operator (e.g., through display 238 illustrated in FIG. 34). All subsequent iterations of the process 4800 could then omit automatic filling steps until a filling attempts counter has been reset (e.g., the filling attempts are reset to 0), and the number of filling attempts thus falls below the filling attempts limit. The limit can be a system default of the CDU, or can be set by an operator of the CDU.

If, the number of filling attempts is less than the limit, at block 4826, a counter for the filling attempts can be incremented by one. For example, if the process 4800 is being executed for the first time, a filling attempts counter (e.g., a variable in memory 244 of controller 234 shown in FIG. 34) can be zero, and at block 4826, the filling attempts counter can be incremented to equal 1.

At block 4828, the process 4800 can check alarms (e.g., faults including warnings, errors, and critical errors) of the CDU for a critical pressure alarm. A critical pressure alarm can indicate that a pressure at one or multiple points along the secondary coolant loop is too high (e.g., the pressure is unsafe. If, at block 4828, a critical pressure alarm is identified, block 4830 can be executed, and pumps of the secondary coolant loop (e.g., pumps 168a, 168b) can be stopped and locked. Stopping the pumps of the secondary coolant loop can reduce a pressure in the loop, which can allow coolant to be pumped into the secondary coolant loop by the refill pump without producing pressure in the secondary coolant loop that exceeds a critical pressure. In some embodiments, only a single one of the pumps of the secondary coolant loop is stopped at block 4830, as stopping one pump can, in some cases, sufficiently reduce pressure in the secondary coolant loop so that the critical pressure alarm raised at block 4828 is resolved. In some embodiments, stopping and locking the pumps at block 4830 can include shutting valves of the CDU (e.g., egress valves 200a, 200b illustrated in FIG. 32).

At block 4832, a state of valves for the pumps can be evaluated (e.g., egress valves 200a, 200b for pumps 168a, 168b respectively, illustrated in FIG. 32). If the valves are not closed, the process can return to block 4830, and blocks 4832 and 4830 can be continuously executed until the valves of the pumps of the secondary coolant circuit are closed.

At block 4834, once the pumps of the secondary coolant loop are stopped and the valves of the pumps are closed, the filling pump can be started at block 4834. The filling pump can be run at a speed that is calculated to fill the secondary coolant loop within a certain period of time (e.g., a fill time). In some embodiments, the fill pump can operate at a single speed. If no critical pressure alarm is identified at block 4828, the process can proceed directly from block 4828 to block 4834 (e.g., without stopping pumps of the secondary coolant loop).

At block 4836, the process 4800 can evaluate if the filling pressure has been reached. As discussed with respect to block 4816, the filling pressure can be a setting of the CDU which, in some cases can be set by an operator. If the filling pressure is reached, the filling pump can be stopped at block 4838. Further, pumps that were locked at block 4830 can be unlocked at block 4840 (e.g., through automatically setting a release flag for one or more pumps of the secondary coolant loop). At block 4040, valves that were closed at block 4832 can be opened, and flow of coolant through the secondary coolant loop can be resumed. Upon completion of block 4832, the process can return to block 4802, and another iteration of the process 4800 can be commenced.

In some embodiments, a fill time can be set for a refill process, which can limit the time in which a refill can be performed. In some cases, for example, including when the pumps of the secondary coolant loop are locked, a refill process can cause downtime to a CDU. While the CDU is down, downstream IT components are not cooled, and extended periods of downtime for a CDU can thus allow for thermal damage to downstream IT components. A fill time can be set by an operator of the CDU, or can be a default setting of the CDU. At block 4842, while a fill time is not exceeded, the filling process can continue. If a duration of the filling process matches or exceeds the fill time, than the filling pump can be stopped at block 4838, and the CDU can resume operation, even if the filling pressure is not yet reached at block 4836.

Figure 49:
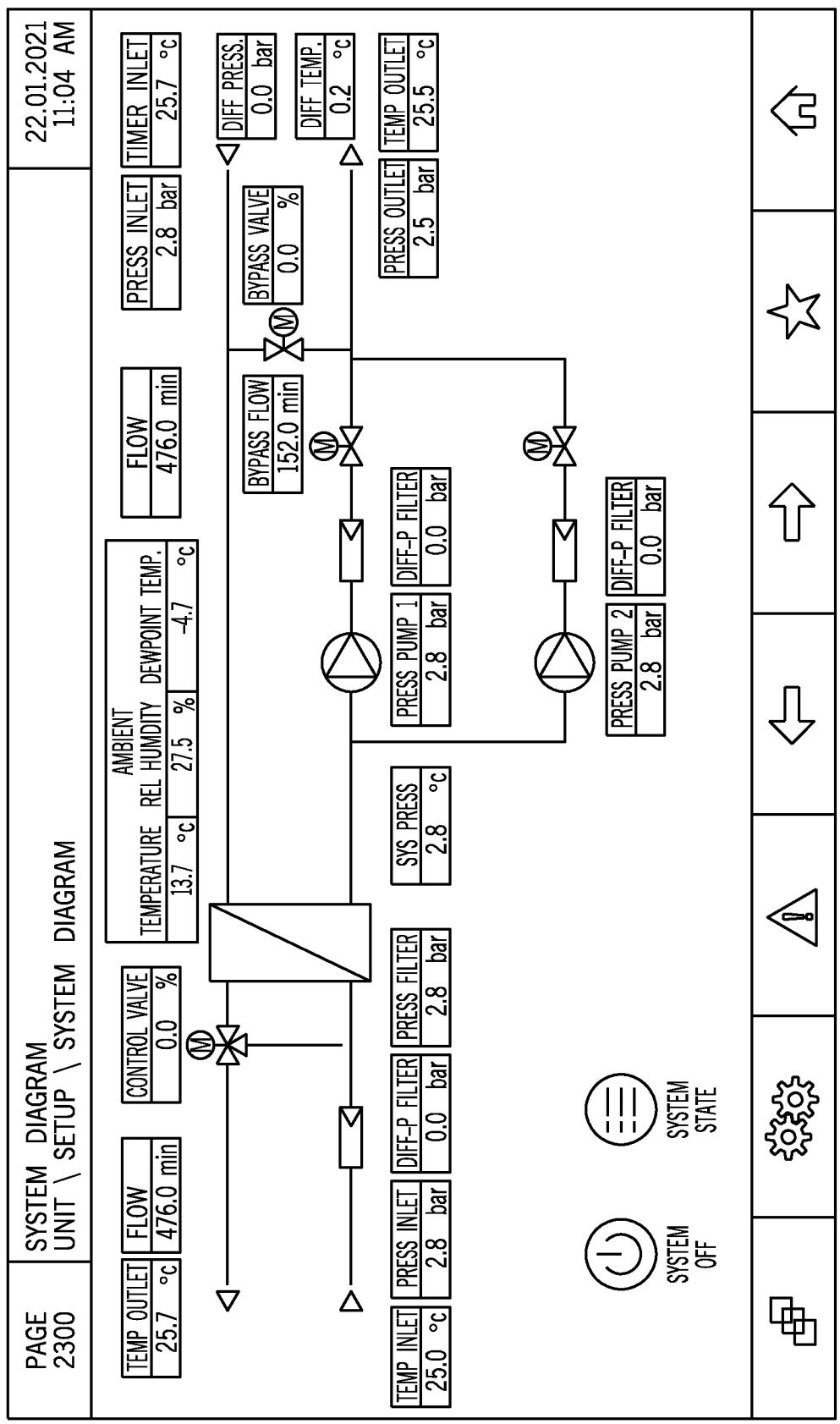
FIG. 49 is an image of an example graphical user interface ("GUI") according to an embodiment of the invention.

A CDU can include a GUI providing an operator of the CDU information about a state or state of the CDU and components thereof. In some embodiments, operating parameters along the primary and secondary coolant loops can be displayed to the operator. Turning now to FIG. 49, an example UI 4900 is shown, including a system diagram 4902, and values of operating parameters of the CDU. The system diagram 4902 can include visual representation of components of the CDU. In the illustrated embodiment, the system diagram includes visual representations of a primary loop strainer, HX, three-way valve, pumps of the secondary coolant loop, filters of the secondary coolant loop, a bypass valve of the secondary coolant loop, and valves along redundant flow paths of the secondary coolant loop. In other embodiments, a system diagram displayed at a GUI of the CDU 100 can include visual representations for other components of the CDU 100. In some embodiments, the GUI 3900 is displayed at the control panel 112, illustrated in FIG. 1. In some embodiments the GUI 3900 can be accessed by another device at a network address of the CDU 100.

The GUI 3900 can include values for operating parameters of the CDU 100 (e.g., operating parameters obtained from any of the temperature sensors 231, flow sensors 230, pressure sensors 228, humidity sensors 260 illustrated in FIG. 32). The GUI 3900 can also display differential operating parameters, including differential temperatures and differential pressures along different points of the CDU 100.

Figure 50:
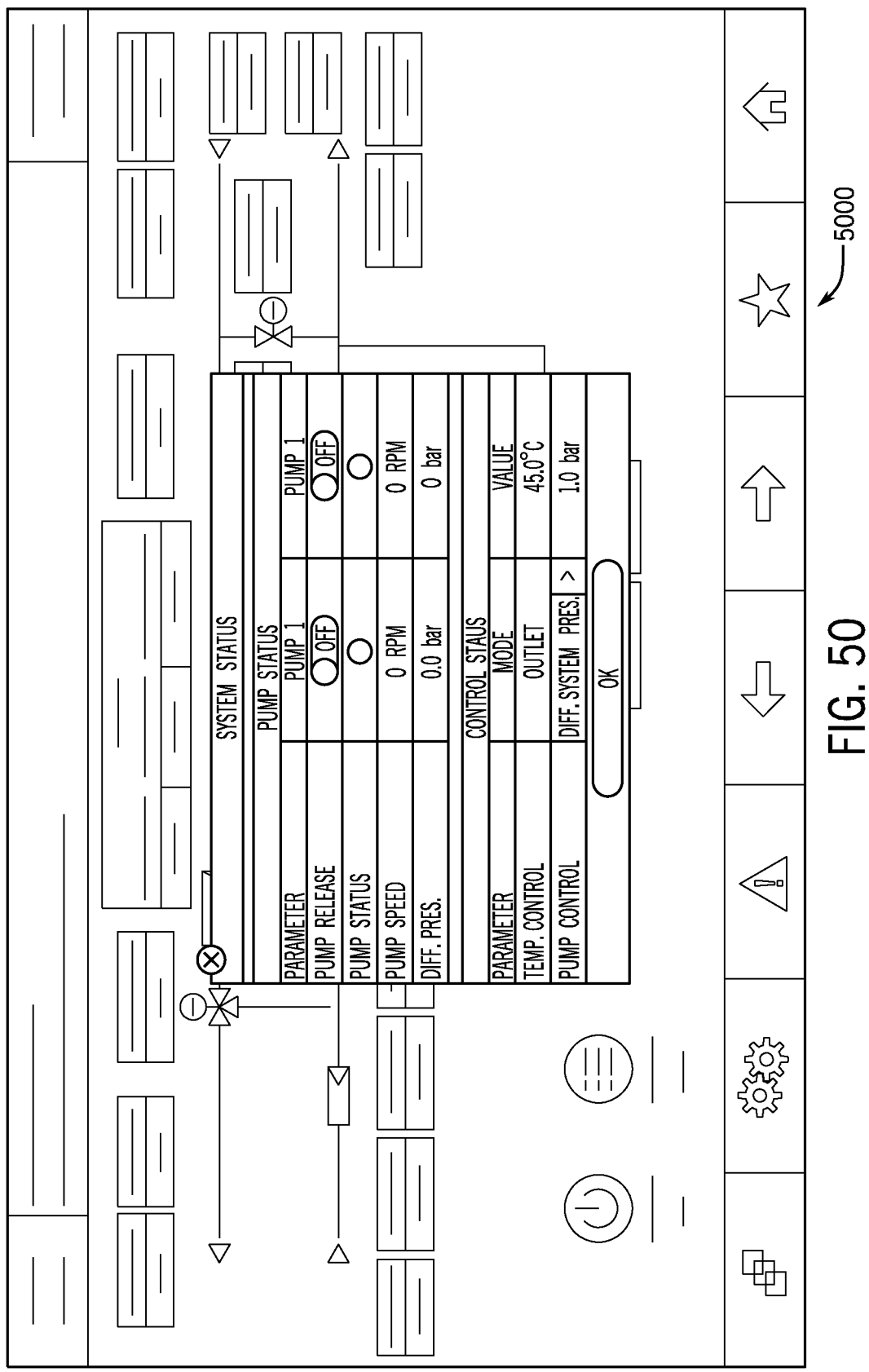
FIG. 50 is another image of an example GUI, according to an embodiment of the invention.

FIG. 50 illustrates an example GUI 5000 illustrating system state options for the CDU 100. As shown, a pump release flag can be set for each pump of the dual pumps 168*a*, 168*b* of the secondary coolant loop. In the illustrated embodiment, the release flags are shown off, but the release flags can be toggled on through the GUI 5000 to activate one or both of the pumps 168*a*, 168*b*. The GUI 500 can show information associated with operation of each pump 168*a*, 168*b* which can include a pump status, a pump speed, and a differential pressure (e.g., a pressure drop) for the pump, as illustrated. As further illustrated, parameters for operating modes of the CDU 100 can be set at the GUI 5000. In the illustrated embodiment, parameters of control modes of the CDU can be set (e.g., control modes illustrated in FIG. 40). As shown, for example, a parameters of a temperature control mode can be set through the GUI 5000, which can include a location of a temperature sensor for a temperature to be controlled (e.g., an "Outlet" temperature sensor, as shown), and a value or set point to be achieved at the temperature sensor (e.g., 45 degrees Celsius, as shown). Additionally, pump speed control mode parameters can be input at GUI 5000. In the illustrated embodiment, for example, the system differential pressure mode is selected (e.g., system differential pressure mode shown at block 4008 of FIG. 4000), and a set point can be set for the system differential pressure (e.g., 1.0 bar, as shown). In some embodiments, additional GUIs can be provided for a CDU which can allow a user to set additional set points, minimum and maximum values for operating parameters, PID controller parameters, etc.

The invention claimed is:

1. A system for housing electrical components of a high-density liquid-to-liquid coolant distribution unit, the system comprising;
   a rack having a rack door configured to swing about a first hinge between a rack door open configuration and a rack door closed configuration, the first hinge being positioned on a first lateral side of the rack;
   a first cabinet including a first cabinet door and a first compartment, the first cabinet being configured to swing about a second hinge between a first cabinet open position and a first cabinet closed position, the second hinge positioned on a second lateral side of the rack opposite the first lateral side;
   a first electrical component housed within the first compartment;
   a second cabinet including a second compartment; and
   a second electrical component housed within the second compartment;
   when the rack door is in the rack door closed configuration and the first cabinet is in the first cabinet closed position, the first cabinet is positioned between the rack door and the second cabinet, and when the first cabinet is in the first cabinet open position, the second electrical component is accessible.

2. The system of claim 1, wherein the first electrical component is one of a first plurality of electrical components, the first plurality of electrical components including a controller and a first switch; and
   wherein the second electrical component is one of a second plurality of electrical components, the second plurality of electrical components including a first motor drive and a second motor drive.

3. The system of claim 1, wherein the second cabinet includes a first sidewall, and wherein the first sidewall includes a first plurality of vents.

4. The system of claim 3, wherein the first cabinet includes a second plurality of vents.

5. The system of claim 1, wherein the high-density liquid-to-liquid coolant distribution unit continues to operate when the first cabinet is in an open configuration.

6. The system of claim 1, wherein the first cabinet rotates up to about 100 degrees between the first cabinet open position and the first cabinet closed position.

7. The system of claim 1, wherein the first hinge defines a first rotational axis and the second hinge defines a second rotational axis, the first rotational axis being parallel to the second rotational axis; and wherein the rack door rotates in a first direction about the first rotational axis from the rack door closed position to the rack door open position, and the first cabinet rotates in a second direction about the second rotational axis from the first cabinet closed position to the first cabinet open position, the first direction being opposite the second direction.

8. A system for housing electrical components of a high-density liquid cooling unit to liquid cool electrical components, the system comprising:
   a first electrical cabinet housing at least one electrical switch and a controller, the first electrical cabinet being swingable outward to open, the first electrical cabinet opening while the high density liquid cooling system continues to operate to liquid cool electrical components; and
   a second electrical cabinet housing a first motor drive and a second motor drive, the second electrical cabinet being accessible when the first electrical cabinet swings outward,
   one of the first motor drive and the second motor drive being replaceable while the high density liquid cooling unit continues to operate.

9. The system of claim 8, and further comprising a rack including a front door and liquid piping elements, wherein the first and second cabinets are located above the liquid piping elements within the rack.

10. The system of claim 9, wherein the front door swings outward in a first direction about a first axis and the first cabinet swings outward in a second direction about a second axis, the second axis being parallel to the first axis, and the first direction being opposite the second direction.

11. The system of claim 8 wherein the second cabinet includes a sidewall with a plurality of vents defined therein.

12. The system of claim 8 wherein the first cabinet includes a front panel, the front panel being configured to swing out to provide access to the controller and the at least one electrical switch.

13. The system of claim 8 wherein the first motor drive is electrically connected to the controller and the at least one electrical switch.

14. A method of housing electrical components of a high-density liquid-to-liquid coolant distribution unit, the method comprising:
 providing a rack including components of a high-density liquid-to-liquid coolant distribution unit;
 securing a first hinge within the rack;
 mounting, on the first hinge, a first cabinet, the first cabinet being configured to rotate about the first hinge between an open position and a closed position;
 mounting, within the rack, a second cabinet;
 housing, within the first cabinet, a controller and at least one electrical switch; and
 housing, within the second cabinet, a first motor drive and a second motor drive;
 when the first cabinet is in the open position, the first motor drive and the second motor drive are accessible, and
 when the first cabinet is in the closed position, the first motor drive and the second motor drive are not accessible.

15. The method of claim 14, further comprising:
 electrically coupling the first motor drive to each of the controller and the at least one electrical switch, wherein the at least one electrical switch is movable between a first configuration and a second configuration, and wherein, when the at least one electrical switch is in the second configuration, the first motor drive does not continue to operate.

16. The method of claim 14, wherein, when the first cabinet is in the open position, one of the first motor drive and the second motor drive continues to operate.

17. The method of claim 15 further comprising providing a front door on the rack, the front door being configured to rotate between a front door open position and a front door closed position, wherein, when the front door is in the front door closed position and the first cabinet is in the closed position, the first cabinet is positioned between the front door and the second cabinet.

18. The method of claim 17, wherein the first cabinet is configured to rotate in a first direction from the closed position to the open position and the front door is configured to rotate in a second direction from the front door closed position to the front door open position, wherein the first direction is opposite the second direction.

19. The method of claim 14 wherein an angle of rotation between the open position and the closed position is about 100 degrees.

20. The method of claim 14, further comprising providing a plurality of vents in a sidewall of the second cabinet.

* * * * *

UNITED STATES PATENT AND TRADEMARK OFFICE
CERTIFICATE OF CORRECTION

PATENT NO. : 12,225,688 B2  
APPLICATION NO. : 17/984064  
DATED : February 11, 2025  
INVENTOR(S) : Matthew R. Archibald Page 1 of 1

It is certified that error appears in the above-identified patent and that said Letters Patent is hereby corrected as shown below:

In the Specification

Column 28, Line 3 of the Table, "primps" should be --pumps--.

Signed and Sealed this
Fifteenth Day of April, 2025

Coke Morgan Stewart
*Acting Director of the United States Patent and Trademark Office*